(12) United States Patent
Hidaka

(10) Patent No.: US 7,292,472 B2
(45) Date of Patent: Nov. 6, 2007

(54) MEMORY DEVICE CAPABLE OF STABLE DATA WRITING

(75) Inventor: Hideto Hidaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/602,950

(22) Filed: Nov. 22, 2006

(65) Prior Publication Data

US 2007/0127288 A1    Jun. 7, 2007

Related U.S. Application Data

(63) Continuation of application No. 11/209,630, filed on Aug. 24, 2005, now Pat. No. 7,154,777, which is a continuation of application No. 11/045,136, filed on Jan. 31, 2005, now Pat. No. 6,947,320, which is a continuation of application No. 10/440,157, filed on May 19, 2003, now Pat. No. 6,898,114.

(30) Foreign Application Priority Data

Nov. 27, 2002    (JP)    ............... 2002-344445

(51) Int. Cl.
*G11C 11/15* (2006.01)
(52) U.S. Cl. ............. 365/173; 365/230.03; 365/189.09
(58) Field of Classification Search ................ 365/173, 365/230.03, 189.09
See application file for complete search history.

(56) References Cited

U.S. PATENT DOCUMENTS 5,384,730 A    1/1995   Vinal
5,689,460 A    11/1997  Ooishi
6,212,109 B1   4/2001   Proebsting
6,314,028 B1   11/2001  Kono
6,337,807 B2 * 1/2002   Futatsuyama et al. . 365/185.17

(Continued)

FOREIGN PATENT DOCUMENTS

JP    2002-124079    4/2002

OTHER PUBLICATIONS

Scheuerlein, et al. "A 10ns Read and Write Non-Volatile Memory Array Using a Magnetic Tunnel Junction and FET Switch In Each Cell" 2000 IEEE International Solid-State Circuits Conference Digest of Technical Papers (2000) TA 7.2.

(Continued)

*Primary Examiner*—Tuan T. Nguyen
(74) *Attorney, Agent, or Firm*—McDermott Will & Emery LLP

(57) ABSTRACT

A memory device according to the present invention includes a memory cell array including a plurality of memory cells arranged therein, the memory cell array being divided into a plurality of regions each selectable independently of the others as an object for data writing, and further includes a plurality of current supply sections provided correspondingly to the plurality of regions, respectively. Each of the plurality of current supply sections, when a corresponding region of the plurality of regions is selected as an object for data writing, is activated to supply a data write current to the corresponding region and each of the plurality of regions includes a plurality of write select lines provided correspondingly to predetermined units of the plurality of memory cells. The plurality of write select lines are selectively supplied with the data write current from a corresponding one of the plurality of current supply sections.

3 Claims, 57 Drawing Sheets

U.S. PATENT DOCUMENTS

| | | |
|---|---|---|
| 6,462,584 B1 | 10/2002 | Proebsting |
| 6,462,998 B1 | 10/2002 | Proebsting |
| 6,795,335 B2 | 9/2004 | Hidaka |
| 6,868,010 B2 | 3/2005 | Shimizu et al. |
| 6,940,777 B2 * | 9/2005 | Ooishi .................. 365/189.09 |
| 6,947,320 B2 | 9/2005 | Hidaka |
| 6,992,926 B2 | 1/2006 | Iwase et al. |
| 6,996,001 B2 * | 2/2006 | Ezaki et al. ................ 365/173 |
| 2004/0001353 A1 | 1/2004 | Hidaka |

OTHER PUBLICATIONS

Durlam, et al. "Nonvolatile RAM Based on Magnetic Tunnel Junction Elements" 2000 IEEE International Solid-State Circuits Conference Digest of Technical Papers (2000) TA 7.3.

Naji, et al. "A 256kb 3.0V 1T1MTJ Nonvolatile Magnetoresistive RAM" 2001 IEEE International Solid-State Circuits Conference Digest of Technical Papers (Feb. 6, 2001) 7.6.

* cited by examiner

MEMORY DEVICE CAPABLE OF STABLE DATA WRITING

RELATED APPLICATION

This application is a continuation of application Ser. No. 11/209,630, filed Aug. 24, 2005, now U.S. Pat. No. 7,154,777, which is continuation of application Ser. No. 11/045,136, filed Jan. 31, 2005, now U.S. Pat. No. 6,947,320, which is a continuation of application Ser. No. 10/440,157 filed May 19, 2003, now U.S. Pat. No. 6,898,114, issued on May 24, 2005.

BACKGROUND OF THE INVENTION

1. Field of the Invention

The present invention relates to a memory device, and more particularly to a nonvolatile memory device including a memory cell having a characteristic in that a pass current at the time of data reading is changed in response to a level of binary storage data.

2. Description of the Background Art

In recent years, attention has been focussed on an MRAM (Magnetic Random Access Memory) device as a non-volatile memory device in a new generation. An MRAM device is a non-volatile memory device in which non-volatile data storage is performed using a plurality of thin film magnetic elements formed in a semiconductor integrated circuit and a random access is enabled to each of the thin film magnetic elements. Especially, a thin film magnetic elements including a magnetic tunnel junction (MTJ) has been used as a memory cell in recent years and thereby a drastic progress in performance of an MRAM device has been achieved, which is disclosed in the following literature.

(Literature 1)

"A 10 ns Read and Write Non-Volatile Memory Array Using a Magnetic Tunnel Junction and FET Switch in each Cell" (USA), Roy Scheuerlein and 6 others, 2000 IEEE ISSCC Digest of Technical Papers TA 7.2.

Since a memory cell having a magnetic tunnel junction therein (hereinafter, also referred to as an "MTJ memory cell") can be constructed of one MTJ element and one access element (e.g., a transistor), the memory cell is also advantageous in high integration. An MTJ element has a magnetic layer capable of being magnetized along a direction corresponding to an applied magnetic field, and an MTJ memory cell performs data storage using a characteristic in that an electric resistance (a junction resistance) in the MTJ element alters depending on a magnetic direction of the magnetic layer. Whether or not a magnetic direction of the magnetic layer alters is determined by a strength of the synthetic magnetic field of two magnetic fields generated by data write currents flowing in a write digit line and a bit line, respectively. Hereinafter, a write digit line and a bit line are also collectively referred to as a write current line, and data write currents are also simply referred to as a write current.

A necessity arises for detection of a difference in electric resistance corresponding to a level of storage data in order to read the storage data in an MTJ memory cell. To be concrete, data reading is performed based on a pass current through an MTJ memory cell altering depending on an electric resistance (i.e., storage data).

In general, since data writing is performed according to supply of a write current in an MRAM device, a supply amount of the write current is necessary to be precisely adjusted. Therefore, the following problems have been arisen in data write operation on an MTJ memory cell.

(1) A path length of wiring to a MTJ memory cell from a current source supplying a current for writing data to the selected MTJ memory cell is different according to a location of the MTJ memory cell (hereinafter, also referred to as a selected memory cell). Therefore, wiring resistance from the current source to the selected memory cell is different according to the location of the selected memory cell. Therefore, a write current fluctuates in value, which leads to a loss of a margin of data writing, thereby resulting in a possibility to produce a phenomenon to disable data to be normally written to the selected memory cell.

(2) A current wire connected to a plurality of write current lines provided correspondingly to each of the predetermined units of a plurality of MTJ memory cells is generally longer than a write current line. Therefore, a large parasitic capacitance is generated on the current wire.

A necessity exists for causing a comparatively large current to flow in a selected write current line (in mA units) in writing data to an MTJ memory cell. Hence, a possibility arises that a current generated by the parasitic capacitance is superimposed on a write current for writing data to the MTJ memory cell, essentially in need. Accordingly, an excessively large current generates in the write current line, leading to erroneous data writing to a non-selected memory cell arranged in the vicinity of a selected write current line.

(3) Since a necessity arises for causing much of a current to flow in a write current line when data is written, a voltage applied to a current source for supplying the current to the write current line is set higher than a voltage applied to other circuits. Therefore, an address decode circuit and related circuits thereof included the other circuits and a current source are applied with respective different power supply voltages from each other. As a result, when power is turned on, the current source has a fear to be activated at a timing earlier than the address decode and related circuits thereof. Therefore, if the address decode circuit and related circuits thereof remain in an inactive state when power is turned on, that is, when the current source is activated before the address decode circuit and related circuits thereof are not normally operated, an unnecessary current flows in a write current line, leading to a problem that erroneous data writing is performed to an MTJ memory cell.

SUMMARY OF THE INVENTION

An object of the present invention is to provide a memory device capable of supplying a stable current to a memory cell at the time of data writing, and reducing a probability of erroneous writing.

In summary, a memory device according to an aspect of the present invention includes a memory cell array in which a plurality of memory cells are arranged through each of which a pass current when data is read flows at a value different according to a level of data written according to an applied data write current. The memory cell array is divided into a plurality of regions each selectable independently of the others as an object for data writing, and the memory device further includes a plurality of current supply sections provided correspondingly to the plurality of regions, respectively. Each of the plurality of current supply sections, when a corresponding region of the plurality of regions is selected as the object for data writing, is activated to supply the data write current to the corresponding region, each of the plurality of regions includes a plurality of write select lines provided correspondingly to each of predetermined units of the plurality of memory cells, and the plurality of write select lines are selectively supplied with the data write current from a corresponding one of the plurality of current supply sections.

Therefore, a memory device according to the present invention can reduce a wiring length from a current supply section to a region including a memory cell selected as an object for data writing. As a result, since wiring resistance from the current supply section to the selected memory cell is reduced, fluctuations in writing currents can be decreased, thereby enabling reduction in probability of erroneous writing to a memory cell.

According to another aspect of the present invention, a memory device includes: a plurality of memory cells through each of which a pass current when data is read flows at a value different according to a level of data written according to an applied data write current; a plurality of write select lines provided correspondingly to predetermined units of the plurality of memory cells; a current supply line connected electrically to the plurality of write select lines; a plurality of current supply circuits, when data is written, supplying the data write current to the current supply line; and a ground wire for, when data is written, guiding the data write current supplied to the current supply line to at least one of the plurality of ground nodes through at least one of the plurality of write select lines. The plurality of current supply circuits and the plurality of ground nodes are arranged so that a path length of the data write current along the current supply line, a write select line corresponding to a selected memory cell of the plurality of memory cells corresponding to an input address and the ground wire is almost constant regardless of a location of the selected memory cell.

Therefore, a main advantage of the present invention lies in that since a path length of a data write current can be held to be almost constant regardless of a location of a selected memory cell, a stabilization of a write current can be achieved, thereby realization of a memory device capable of reducing a probability of erroneous writing to a memory cell.

According to yet another aspect of the present invention, a memory device includes: a plurality of memory cells through each of which a pass current when data is read flows at a value different according to a level of data written according to an applied data write current; a plurality of write select lines provided correspondingly to predetermined units of the plurality of memory cells; a current supply line connected electrically to the plurality of write select lines; a current supply circuit, when data is written, activated to connect the current supply line electrically to a first power supply voltage and to thereby supply the data write current to the current supply line; an address decode circuit, receiving supply of a second power supply voltage to operate and to decode an input address, and for, when data is written, selecting a write select line to receive supply of the data write current from the plurality of write select lines; and a voltage detecting circuit, connected electrically to the second power supply voltage, and for detecting whether or not the address decode circuit has been activated. The current supply circuit includes a switch for disconnecting the current supply line electrically from the first power supply voltage according to a result of the detection of the voltage detecting circuit when the address decode circuit is in an inactive state, and a voltage level supplied by the first power supply voltage is higher than that supplied by the second power supply voltage.

Therefore, still another advantage of the present invention lies in that the current supply circuit is activated according to an active state of the address decode circuit, thereby enabling realization of a memory device capable of preventing erroneous writing of data when power supply is turned on.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 40 is an operating waveform diagram describing operations in a case where a non-volatile memory device according to the fifth embodiment enters a write state in error when power is turned on;

FIG. 44 is an operating waveform diagram describing operations in a case where a non-volatile memory device according to the third modification of the fifth embodiment enters a write state in error when power is turned on;

FIG. 48 is an operating waveform diagram describing operations in a case where a non-volatile memory device according to the sixth modification of the sixth embodiment enters a write state in error when power is turned on;

DESCRIPTION OF THE PREFERRED EMBODIMENTS

Description will be given of embodiments of the present invention below with reference to the drawings. Note that the same symbols in the figures indicate the same or corresponding constituents.

First Embodiment

Figure 1:
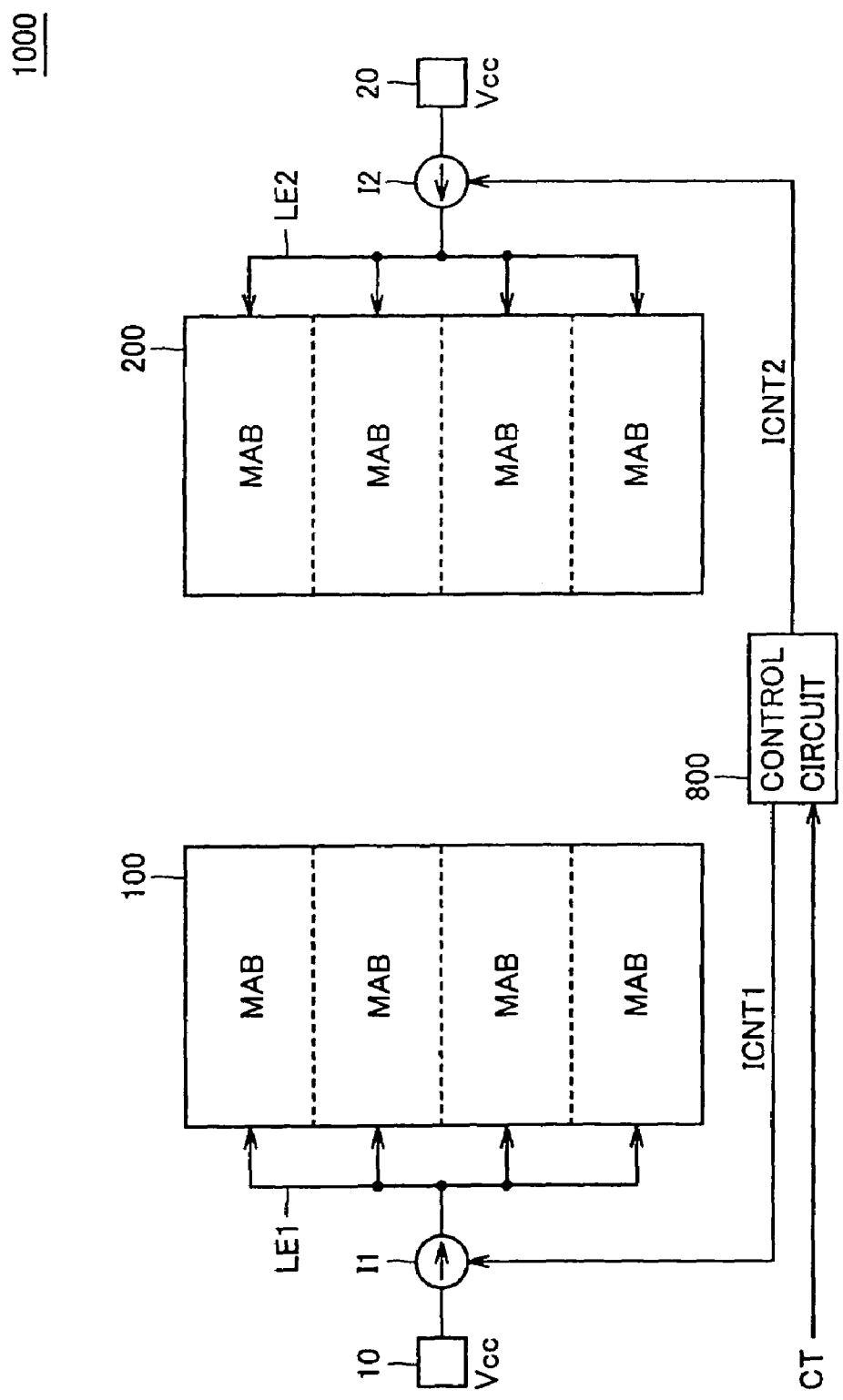
FIG. 1 is a schematic diagram showing a configuration of a non-volatile memory device according to a first embodiment.

Referring to FIG. 1, a non-volatile memory device 1000 includes memory array mats 100 and 200, power supply terminals 10 and 20, and current sources I1 and I2.

Memory array mats 100 and 200 are divided into a plurality of memory array blocks MAB, respectively. For example, memory array mats 100 and 200 are divided into four memory blocks MAB, respectively. Though details thereof will be described later, each of memory array blocks MAB includes, as an example, a plurality of memory cells arranged in rows and columns, an address decoder, bit lines, write digit lines and read word lines. Note that a memory array mat may be configured so that one address decoder selects a bit line, a write digit line and a read word line included in a plurality of memory array blocks.

A power supply voltage Vcc is supplied to power supply terminals 10 and 20 from outside. Power supply terminals 10 and 20 supply power supply voltage Vcc to current sources I1 and I2, respectively. Current source I1 supplies a current to each of memory array blocks MAB in memory array mat 100 through a current source wire LE1. Current source I2 supplies a current to each of memory array blocks MAB in memory array mat 200 through a current source wire LE2.

Current sources I1 and I2 supply currents to each of memory array blocks MAB in memory array mats 100 and 200 through current source wires LE1 and LE2, respectively. Note that in the following description, a signal having a main symbol attached with an additional symbol "/" before itself is an inverted signal of an signal having only the main symbol not attached with the symbol "/".

Figure 2:
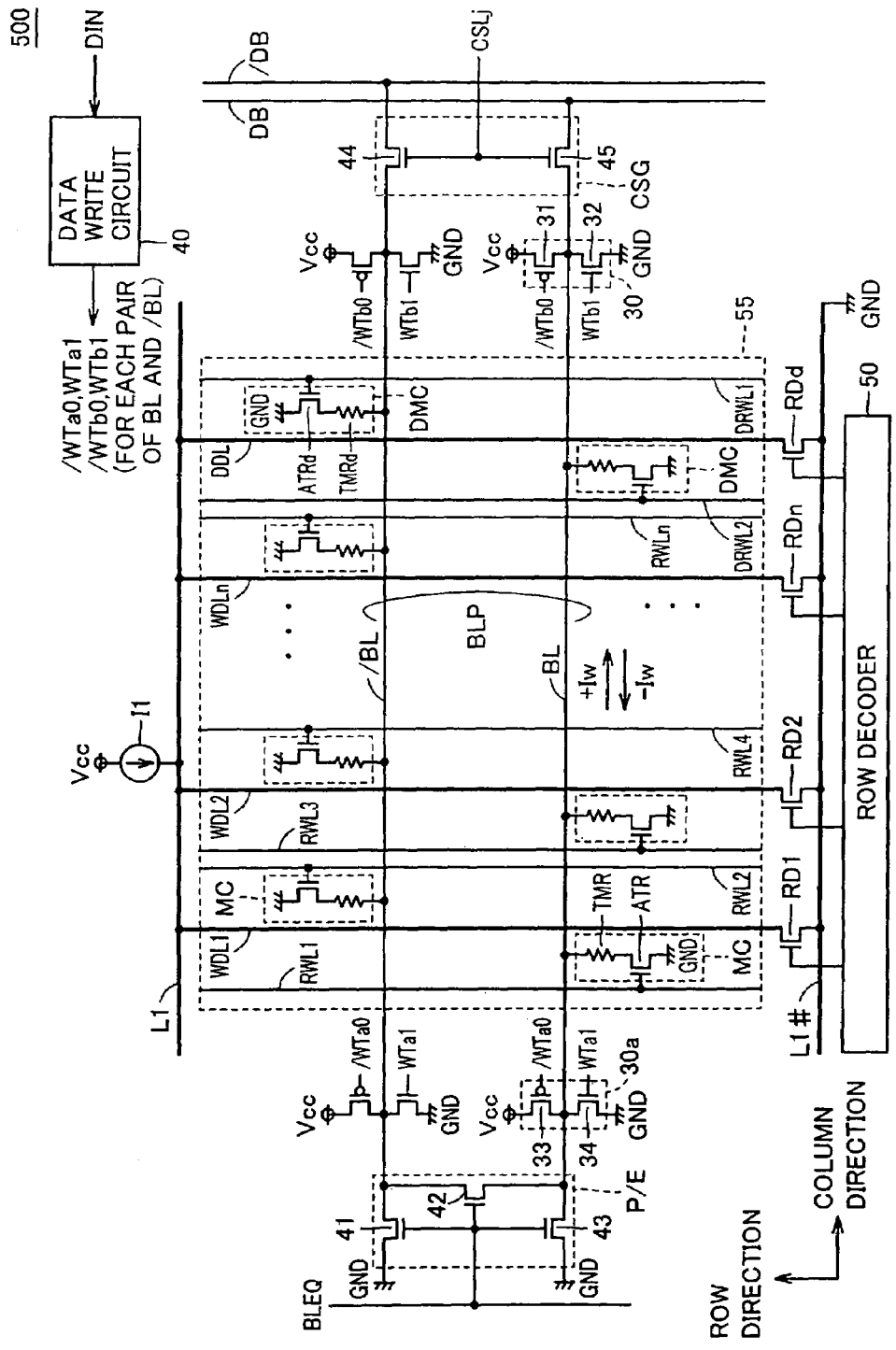
FIG. 2 is a circuit diagram showing a configuration of a memory array in a memory array block.

FIG. 2 is a circuit diagram showing a configuration of a memory array 500 in memory array block MAB. Note that in FIG. 2, there is also shown current source I1 not included in memory array 500 for convenience in description.

Referring to FIG. 2, memory array 500 includes a memory cell array 55 and a row decoder 50.

Memory cell array 55 has a plurality of MTJ memory cells. The MTJ memory cells are classified into normal memory cells (hereinafter, also simply referred to as a "memory cell MC") and dummy memory cells DMC arranged in a row direction. A row on which dummy memory cells DMC are arranged is hereinafter also referred to as a "dummy cell row." Dummy memory cells DMC have the same characteristics (a shape and structure) as memory cell MC and arranged so as to share a memory cell row with memory cells MC.

Herein, description will be given of a structure of an MTJ memory cell and a principle of data storage.

Figure 3:
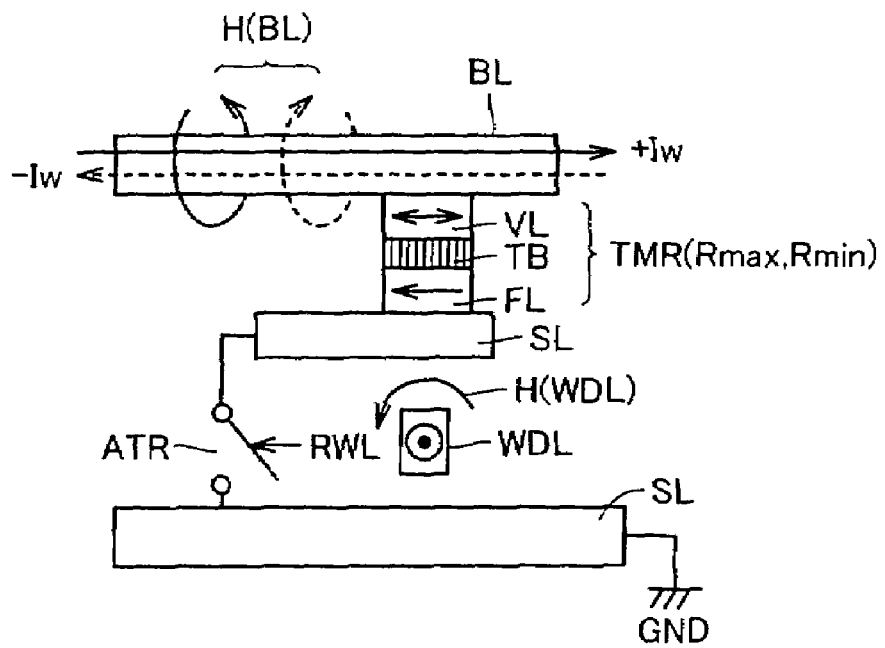
FIG. 3 is a conceptual diagram describing a structure of an MTJ memory cell and a principle of data storage therein.

Referring to FIG. 3, a tunneling magneto-resistance element TMR has a ferromagnetic layer having a fixed magnetic direction (hereinafter, also simply referred to as a "fixed magnetic layer) FL, and a ferromagnetic layer capable of being magnetized in a direction corresponding to an externally applied magnetic field (hereinafter, also simply referred to as a "free magnetic layer") VL. A tunneling barrier (tunneling film) TB made of an insulating film is provided between fixed magnetic layer FL and free magnetic layer VL. Free magnetic layer VL is magnetized in a direction in parallel or anti-parallel to a magnetic direction of fixed magnetic layer FL depending on a level of storage data to be written. A magnetic tunnel junction is formed of fixed magnetic layer FL, tunneling barrier TB and free magnetic layer VL.

An electric resistance of tunneling magneto-resistance element TMR alters depending on a relative relationship in magnetic direction between fixed magnetic layer FL and free magnetic layer VL. To be concrete, an electric resistance of tunneling magneto-resistance element TMR takes the minimum value Rmin in a case where magnetic directions of free magnetic layer VL and fixed magnetic layer FL are the same as (in parallel to) each other, while taking the maximum value Rmax in a case where magnetic directions of both layers are opposite to each other (in anti-parallel).

When data is written, read word line RWL is deactivated to turn off access transistor ATR. In this state, data write currents for magnetizing free magnetic layer VL flow in directions depending on a level of write data in bit line BL and write digit line WDL.

Figure 4:
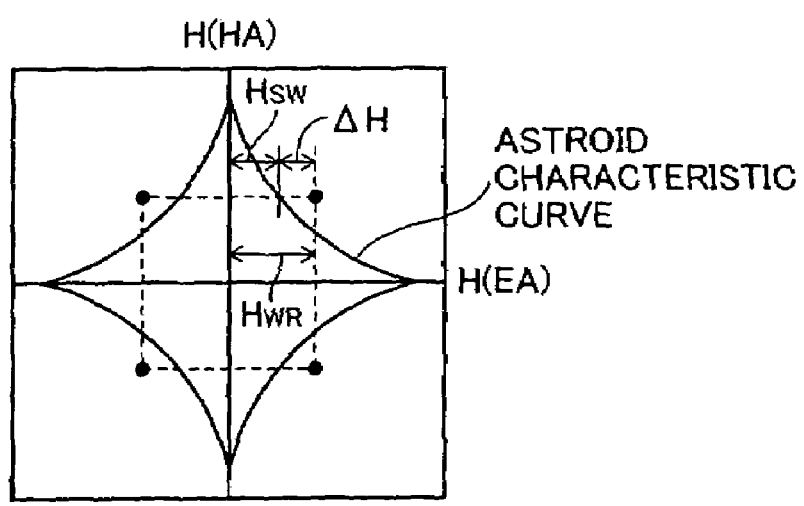
FIG. 4 is a conceptual diagram showing a relationship between a data write current in an MTJ memory cell and a magnetic direction of a tunneling magneto-resistance element.

Referring to FIG. 4, the abscissa H (EA) is used for plotting a magnetic field applied in a magnetic easy axis (EA) direction in free magnetic layer VL in tunneling magneto-resistance element TMR. On the other hand, the ordinate H (HA) is assigned to a magnetic field acting in a magnetic hard axis (HA) direction in free magnetic layer VL therein. Magnetic fields H (EA) and H (HA) correspond to magnetic fields generated by respective currents flowing in bit line BL and write digit line WDL.

In an MTJ memory cell, a fixed magnetic direction of fixed magnetic layer FL is present along a magnetic easy axis of free magnetic layer VL and free magnetic layer VL is magnetized in parallel to (the same as) or anti-parallel to (opposite to) the magnetic direction of fixed magnetic layer FL along the magnetic easy axis depending on a level of storage data in an MTJ memory cell. An MTJ memory cell can store 1 bit data corresponding to one of two magnetic directions of free magnetic layer VL.

A magnetic direction of free magnetic layer VL can be rewritten only when the sum of applied magnetic fields H (EA) and H (HA) amounts to a point in a region outside an Astroid characteristic curve shown in FIG. 4. That is, if an applied data write magnetic field is of a strength in a region inside the Astroid characteristic curve, no change in magnetic direction occurs in free magnetic layer VL.

As shown in the Astroid characteristic curve, with application of a magnetic field in a magnetic hard axis direction onto free magnetic layer VL, reduction is achieved in a magnetization threshold value necessary for altering a magnetic direction along magnetic easy axis H (EA). An operating point when data is written, as shown in FIG. 4, is designed to be located so that when predetermined currents are caused to flow in write digit line WDL and bit line BL, storage data in an MTJ memory cell, that is, a magnetic direction of tunneling magneto-resistance element TMR can be rewritten.

A data write magnetic field in a magnetic easy axis in an MTJ memory cell, which is an object for data writing, is designed so that a strength of the magnetic field takes $H_{WR}$ at an operating point shown in FIG. 4 as an example. That is, a value of a data write current flowing bit line BL or write digit line WDL is designed so that the data write magnetic field $H_{WR}$ is obtained. Generally, a data write magnetic field $H_{WR}$ is expressed as the sum of between a switching magnetic field $H_{SW}$ necessary for changing-over magnetic directions and a margin $\Delta H$, that is, $H_{WR}=H_{SW}+\Delta H$.

A magnetic direction once written to tunneling magneto-resistance element TMR, that is, storage data of an MTJ memory cell is held in a non-volatile manner till new data writing is performed. Though an electric resistance of each memory cell is, strictly speaking, the sum of on-resistance values of tunneling magneto-resistance element TMR and access transistor ATR, and another parasitic resistance, a resistive component other than that of tunneling magneto-resistance element TMR is constant regardless of storage data; therefore, two kinds of electric resistance values of a normal memory cell corresponding to storage data are expressed as Rmax and Rmin and a difference between both is expressed as $\Delta R$ (i.e., $\Delta R=Rmax-Rmin$).

Referring again to FIG. 2, in memory cell array 55, read word lines RWL1 to RWLn and write digit lines WDL1 to WDLn are provided correspondingly to memory cell rows shared between memory cells MC and dummy memory cells DMC, respectively. A bit line pair BLP are provided correspondingly to memory cell columns constituted of memory cells MC, respectively, and a dummy digit line DDL is provided correspondingly to a dummy cell row. Bit line pair BLP is constituted of two bit lines /BL and BL complementary to each other. While no dummy digit line DDL is used in data writing, it is used when current source wires are precharged, which will be described later.

Memory cells MC in an odd-numbered row are connected to one bit line BL, while memory cells MC in an even-numbered row are connected to the other bit line /BL. Each memory cell MC has tunneling magneto-resistance element TMR acting as a magnetic storage section electric resistance of which alters depending on a level of storage data, and an access transistor ATR acting as an access gate, both being connected in series with each other. As described above, a MOS transistor is used as access transistor ATR, which is a field effect transistor formed on a semiconductor substrate. Tunneling magneto-resistance element TMR is magnetized in one of two directions to set an electric resistance value thereof to one of Rmin and Rmax.

Memory array 500 further includes row decode transistors RD1 to RDn, dummy row decode transistor RDd, and current source wire L1 and L1#.

In the following description, read word lines RWL1 to RWLn, write digit lines WDL1 to WDLn and row decode transistors RD1 to RDn are also collectively referred to as read word line RWL, write digit line WDL and row decode transistor RD, respectively. Furthermore, a high voltage state (power supply voltage Vcc) and a low voltage state (ground voltage GND), which are binary values, in combination, of a signal and on a signal line, are also referred to as "H level" and "L level", respectively.

Moreover, in a case where only a configuration of one of the plurality of memory array blocks is shown in the figure, a current source wire connecting a current source outside a memory array mat electrically to the one memory array block is connected electrically to a current source wire to which a current source in the memory array is connected electrically when the current source is connected electrically to the current source wire in the memory array. For example, in FIG. 1, current source wire LE1 connecting current source I1 electrically to each memory array block MAB is connected electrically to current source line L1 in FIG. 2 to which current source I1 is connected electrically.

Moreover, in a case where only a configuration of one of the plurality of memory array blocks is shown in the figure, a current source wire corresponding to current source wire L1 for supplying a write current to desired write digit line WDL is also present in other memory array blocks. For example, each of the current source lines in the other memory array blocks in memory array mat 100 is connected electrically to current source wire LE1 outside memory array mat 100. Therefore, in the following description, for example, in a case where a voltage state on and a current amount flowing in current source wire L1 are shown in an operating waveform diagram, a similar operating waveform diagram is also shown with respect to a current source wire in each of the other memory array blocks.

Each row decode transistors RD is provided between write digit line WDL and current source line L1#. N-channel MOS transistors are used as each of row decode transistors RD in a configuration in which a current is supplied to a memory array from a current source, while P-channel MOS transistors are used as each of row decode transistors RD in a configuration in which a current is supplied to a current source from a memory array. Each of the gates of row decode transistors RD are connected to row decoder 50.

Dummy row decode transistor RDd is provided between dummy digit line DDL and current source L1#. An N-channel MOS transistor is used as dummy row decode transistor RDd in a configuration in which a current is supplied to a memory array from a current source, while a P-channel MOS transistor is used as dummy row decode transistor RDd in a configuration in which a current is supplied to a current source from a memory array.

The gate of dummy row decode transistor RDd is connected to a row decoder 50.

Row decoder 50 sends a signal at H level to the gate of desired row decode transistor RD or dummy row decode transistor RDd according to a row address signal to connect desired write digit line WDL electrically to current source wire L1# or connect dummy digit line DDL electrically to current source wire L1#. Row decoder 50 is activated when a supplied voltage is raised to a value equal to or more than a predetermined level.

Current source wire L1 is connected electrically to current source I1 through a current source wire LE1 (not shown). A predetermined current is supplied to current source wire L1 from current source I1. An end of current source wire L1# is connected to ground voltage GND and the other end thereof is set to be in a floating state.

Memory array 500 further includes a column select gate CGS, a precharge-equalize circuit P/E and data lines DB and /DB, all being provided to each bit line pair BLP.

Column select gate SCG has N-channel MOS transistors 44 and 45. N-channel MOS transistors 44 and 45 are provided between bit line /BL and data line /DB and between bit line BL and data line DB, respectively. If a column select signal CSLj is inputted to the gates of N-channel MOS transistors 44 and 45 when data is read from memory cell MC, N-channel MOS transistors 44 and 45 connect bit lines /BL and BL electrically to data lines /DB and DB, respectively.

Thereafter, a small difference in potential produced between bit lines /BL and BL are inputted to a sense amplifier (not shown) through data lines /DB and DB to be amplified there.

Precharge-equalize circuit P/E has N-channel MOS transistors 41, 42 and 43. N-channel MOS transistors 41 and 43 are provided between bit lines /BL and BL and ground voltage GND, respectively. N-channel MOS transistor 42 is provided between bit lines /BL and BL. When a precharge-equalize signal BLEQ at H level is inputted to the gates of N-channel MOS transistors 41, 42 and 43, bit lines /BL and BL are precharged to and equalized at ground voltage GND. Precharge-equalize signal BLEQ at L level, when data is read, is inputted to the gates of N-channel MOS transistors 41, 42 and 43 to cancel precharging and equalization on bit lines /BL and BL.

Then, description will be given of configurations for supply of a data write current to bit line BL and for data reading therefrom using FIG. 2.

Referring to FIG. 2, memory array 500 further includes bit line drivers 30a and 30 and a data write circuit 40, which are provided correspondingly to each memory cell column.

Bit line driver 30a has driver transistors 33 and 34 connected between one end side of a corresponding bit line BL and power supply voltage Vcc and between the one end side of a corresponding bit line BL and ground voltage GND, respectively. Likewise, bit line driver 30 has driver transistors 31 and 32 connected between the other end side of the corresponding bit line BL and power supply voltage Vcc and between the other end side of the corresponding bit line BL and ground voltage GND, respectively. Driver transistors 33 and 31 are P-channel MOS transistors and driver transistors 34 and 32 are N-channel MOS transistors.

Write control signals /WTa0 and WTa1 are inputted to the gates of respective driver transistors 33 and 34, respectively, and write control signals /WTh0 and WTh1 are inputted to the gates of respective driver transistors 31 and 32, respectively.

In each of memory cell columns, bit line driver 30a drives the one end side of a corresponding bit line BL with power supply voltage Vcc or ground voltage GND in response to write control signals /WTa0 and WTa1 or alternatively, causes the one end side of the corresponding bit line BL to be in a floating state without connecting any of the voltages. Likewise, bit line driver 30 drives the other end side of the corresponding bit line BL with power supply voltage Vcc or ground voltage GND in response to write control signals /WTb0 and WTh1 or alternatively, causes the other end side of the corresponding bit line BL to be in a floating state.

Data write circuit 40 controls write control signals /WTa0, WTa1, /WTb0 and WTb1 on each memory cell column according to write data DIN and a result of column selection. Write control signals /WTa0, WTa1, /WTb0 and WTb1 are set so that a data write current +Iw or −Iw in a direction corresponding to write data DIN flows into bit line BL of a selected column. Hereinafter, data write currents +Iw and −Iw in opposed directions in bit line BL are also collectively referred to as data write current ±Iw.

Data write circuit 40 sets write control signals /WTa0 and /WTb0 at H level and write control signals WTa1 and WTb1 at L level on each memory cell column during a time other than when data is written. Thereby, each bit line BL is set to be in a floating state during a time other than when data is written.

Furthermore, data write circuit 40, when data is written, sets each of write control signals /WTa0, WTa1, /WTb0 and WTb1 for a non-selected memory cell column to H level. Hence, both ends of bit line BL of a non-selected column when data is written are connected to ground voltage GND so as not to cause a current to flow therein unintentionally.

On the other hand, data write circuit 40, when data is written, sets write control signals /WTa0, WTa1, /WTb0 and WTb1 for a selected memory cell column according to write data DIN.

To be concrete, when write data DIN is at H level, write control signals /WTa0 and WTa1 are set to L level while write control signals /WTb0 and WTh1 are set to H level. Thereby, data write current +Iw flows in bit line BL of a selected column in a direction from bit line driver 30a to bit line driver 30.

On the other hand, when write data DIN is at L level, write control signals /WTa0 and WTa1 are set to H level while write control signals /WTb0 and WTb1 are set to L level. Thereby, data write current −Iw flows in bit line BL of a selected column in a direction from bit line driver 30 to bit line driver 30a. Note that drive voltages of bit line drivers 30a and 30 can also be set to independent voltages different from ground voltage GND or power supply voltage Vcc.

Then, description will be given of operations for causing a current to flow into write digit line WDL when data is written. When a row address signal is inputted to row decoder 50, desired row decode transistor RD is turned on to connect a corresponding write digit line WDL electrically to current source wire L1#. Therefore, a current flows in selected write digit line WDL from current source I1 connected to current source wire L1 to ground voltage GND connected to current source wire L1#.

A data write magnetic field along a magnetic easy axis (EA) is applied to MTJ memory cell MC by data write current ±Iw. In MTJ memory cell MC for which data write currents are caused to flow in both of corresponding write digit line WDL and corresponding bit line BL, respectively, write data corresponding to a direction of data write current ±Iw in bit line BL is written magnetically.

While in the above description, description has been given of configurations for supply of a data write current into bit line BL and for data reading therefrom, configurations for supply of a data write current to bit line /BL and for data reading therefrom is similar to the case of bit line BL, so no detailed description thereof will be repeated.

Referring again to FIG. 1, non-volatile memory device 1000 further includes a control circuit 800.

Control circuit 800 outputs a current control signal ICNT1 or ICNT2 according to a control signal CT generated in an internal circuit (not shown) according to an address signal. Current sources I1 and I2 are activated by current control signals ICNT1 and ICNT2, respectively.

Control signal CT is set so that control circuit 800 transmits current control signal ICNT1 to current source I1 when a write operation is performed on a memory cell in a memory array block MAB of memory array mat 100, that is, when memory array mat 100 is selected as an object for data writing. On the other hand, control signal CT is set so that control circuit 800 transmits current control signal ICNT2 to current source I2 when a write operation is performed on a memory cell in a memory array block MAB of memory array mat 200. Note that no specific limitation is imposed on one memory array block, which becomes an object for writing, but a plurality of memory array blocks may simultaneously be objects for writing.

That is, one memory array mat is divided into two parts and current sources are provided correspondingly to each of the parts of the memory array mat and the current sources are selectively activated, thereby enabling a wiring length from a current source to a selected memory cell to be halved. Therefore, since wiring resistance from a current source to a selected memory cell is also halved, fluctuations in write currents can be reduced.

In non-volatile memory device 1000 according to the first embodiment, as described above, a stable current, when data is written, can be supplied to a memory cell to reduce a probability for erroneous writing.

First Modification of First Embodiment

Figure 5:
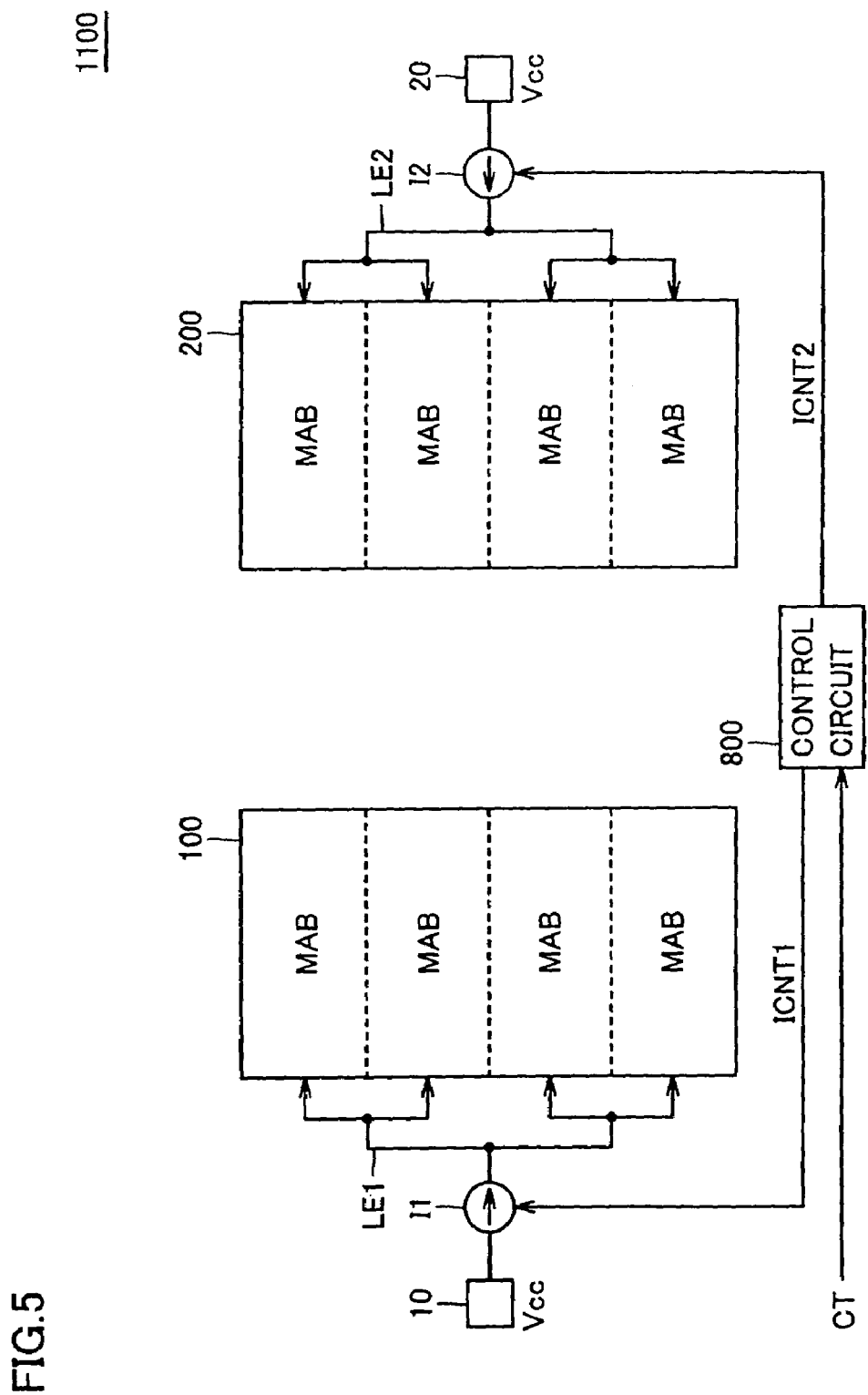
FIGS. 5 and 6 are schematic diagrams showing configurations of non-volatile memory devices of first and second modifications of the first embodiment, respectively.

Referring to FIG. 5, a non-volatile memory device 1100 is different from non-volatile memory device 1000 according to the first embodiment shown in FIG. 1 by comparison in an aspect that wiring lengths of current source wire LE1 from current source I1 to memory array blocks MAB of memory array mat 100 are equal to each other and wiring lengths current source wire LE2 from current source I2 to memory array blocks MAB of memory array mat 200 are equal to each other. Since the other constituents in the configuration and operations therein are the same as in non-volatile memory device 1000, none of detailed descriptions thereof will be repeated.

Accordingly, non-volatile memory device 1100 can reduce fluctuations in wiring lengths from a current source to memory array blocks MAB to a lower value than non-volatile memory device 1000.

As a result, non-volatile memory device 1100 can further reduce fluctuations in write currents to a lower value than non-volatile memory device 1000 in addition to the effect exerted by non-volatile memory device 1000.

Second Modification of First Embodiment

Figure 6:
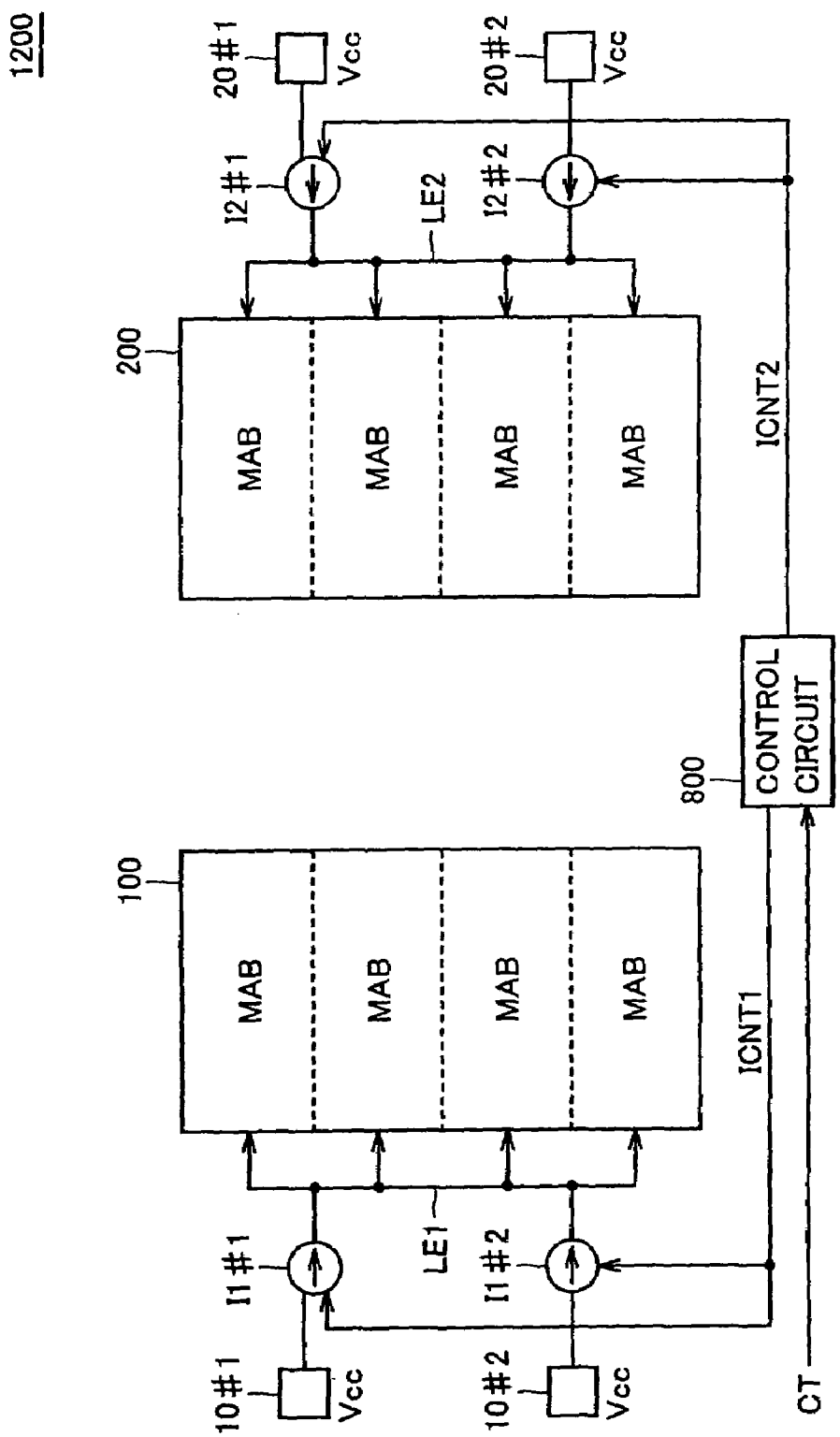

Referring to FIG. 6, a non-volatile memory device 1200 is different from non-volatile memory device 1000 according to the first embodiment shown in FIG. 1 by comparison in an aspect that provided are power supply terminals 10#1, 10#2, 20#1 and 20#2 and current sources I1#1, I1#2, I2#1 and I2#2 instead of power supply terminals 10 and 20 and current sources I1 and I2.

Power supply voltage Vcc is supplied to power supply terminals 10#1, 10#2, 20#1 and 20#2 from outside. Power supply terminals 10#1, 10#2, 20#1 and 20#2 supply power supply voltage Vcc to current sources I1#1, I1#2, I2#1 and I2#2. Current sources I1#1 and I1#2 supply currents to memory array blocks MAB of memory array mat 100 through current source wire LE1. Current sources I2#1 and I2#2 supply currents to memory array blocks MAB of memory array mat 200 through current source wire LE2. Since the other constituents in the configuration are the same as in non-volatile memory device 1000, none of detailed descriptions thereof will be repeated.

Control circuit 800 transmits current control signal ICNT1 to current sources I1# and I1#2 according to control signal CT. Control circuit 800 further transmits current control signal ICNT2 to current sources I2#1 and I2#2 according to control signal CT.

Current sources I1#1 and I1#2 are activated in response to current control signal ICNT1 and current sources I2#1 and I2#2 are activated in response to current control signal ICNT2.

In a case where a write operation is performed on a memory cell in memory array block MAB of memory array mat 100, control signal CT is set so that control circuit 800 transmits current control signal ICNT1 to current sources I1#1 and I1#2. On the other hand, in a case where a write operation is performed on a memory cell in memory array block MAB of memory array mat 200, control signal CT is set so that control circuit 800 transmits current control signal ICNT2 to current sources I2#1 and I2#2. Note that no specific limitation is imposed on one memory array block, which becomes an object for writing, but a plurality of memory array blocks may simultaneously be objects for writing.

Therefore, non-volatile memory device 1200 has an advantage that reduction occurs in wiring lengths to each of memory blocks MAB of memory array mats 100 and 200 from the current sources by connecting two current sources to each of current source wires LE1 and LE2 to smaller values than non-volatile memory device 1000 in addition the effect exerted by non-volatile memory device 1000.

As a result, non-volatile memory device 1200 can further reduce fluctuations in write currents to a lower value than non-volatile memory device 1000 in addition to the effect exerted by non-volatile memory device 1000.

Note that in this embodiment, a configuration has been shown in which two current sources are connected to a current source wire, write currents to memory array blocks of a memory array mat can be further stabilized by connecting three or more current sources to a current source wire. Furthermore, while in this embodiment, an example has been shown in which a plurality of current sources connected to one current source wire are all activated, the present invention is not limited to such a configuration. The present invention can also be applied to a configuration in which a signal from a control circuit is transmitted to each of current sources independently of the other to enable only a desired current source to be selectively activated by the control circuit.

Second Embodiment

Figure 7:
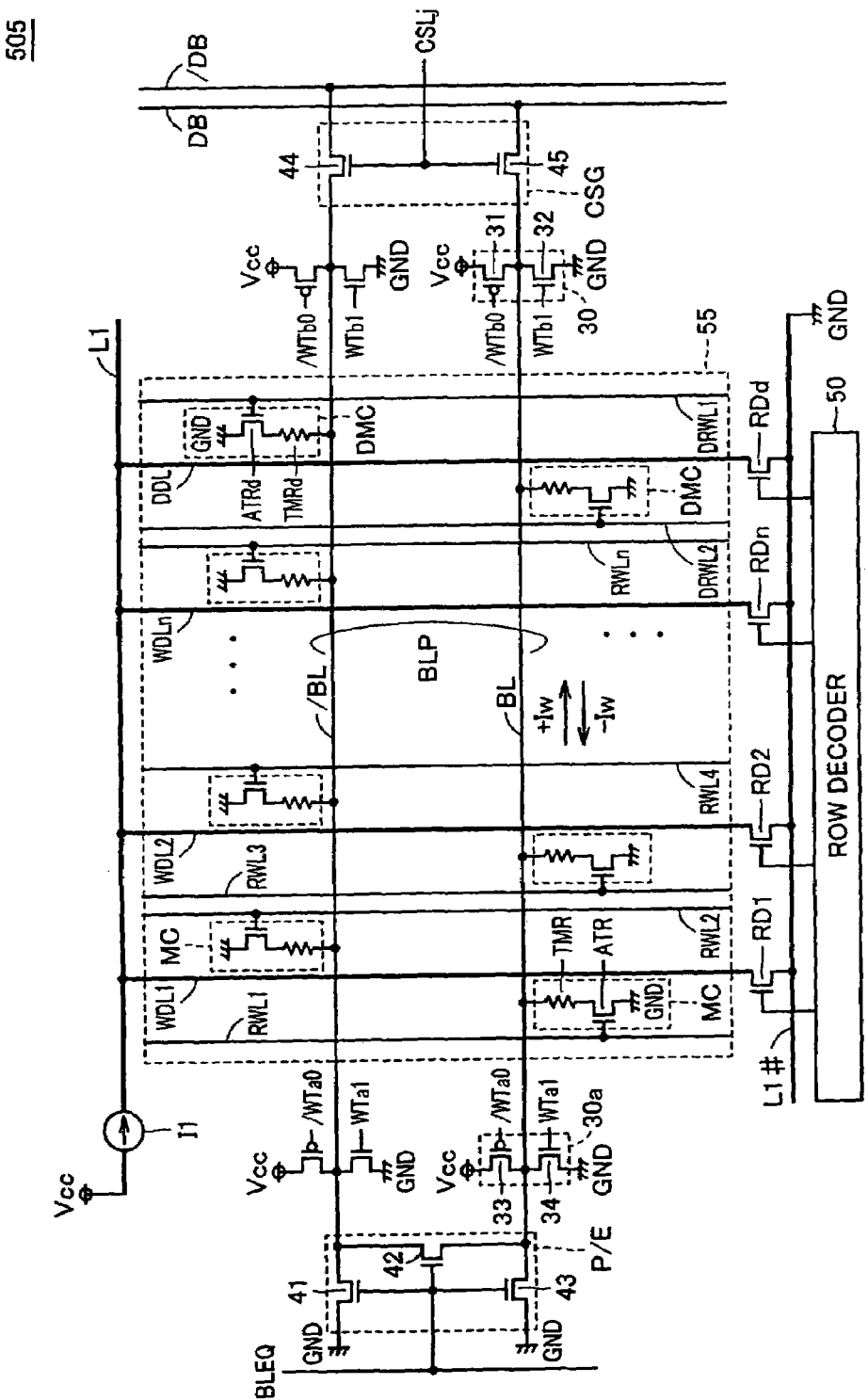
FIGS. 7 and 8 are circuit diagrams showing configurations of memory arrays in memory array blocks according to the first embodiment.

FIG. 7 is a circuit diagram showing a configuration of a memory array 505 in memory array block MAB according to the first embodiment. Note that since an operation in data write circuit 40 has been described in the first embodiment, no data write circuit 40 is shown in the figure.

Referring to FIG. 7, memory array 505 is different from memory array 500 according to the first embodiment by comparison in an aspect that current source I1 is connected to one end of current source wire L1 instead of a point in the vicinity of a center between locations thereon to which write digit lines WDL1 and WDLn are connected. Since the other constituents in the configuration are the same as in memory array 500 shown in the first embodiment, none of detailed descriptions thereof will be repeated.

Current source I1 connected to current source wire L1 is located at a position thereon diagonal with respect to ground voltage GND connected to current source wire L1#. Therefore, for example, a wiring length from current source I1 to ground voltage GND connected to current source wire L1# when row decode transistor RD1 is turned on is equal to a wiring length from current source I1 to ground voltage GND connected to current source wire L1# when row decode transistor RD2 is turned on. That is, even if any memory cell is selected when data is written, a wiring length from current source I1 to ground voltage GND connected to current source wire L1# is constant. Therefore, wiring resistance between current source I1 and current source wire L1# is constant. Accordingly, almost no fluctuation occurs in write currents when data is written.

In memory array 505 according to the second embodiment, as described above, write currents can be stabilized.

First Modification of Second Embodiment

Figure 8:
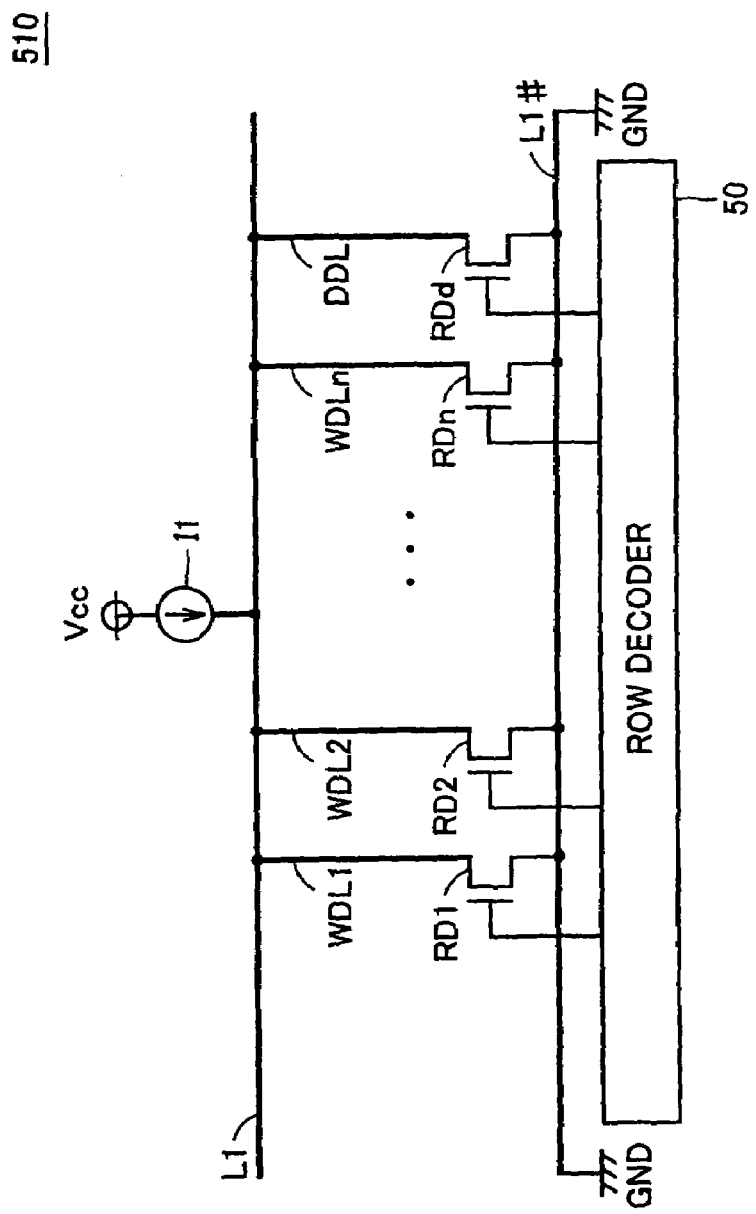

Referring to FIG. 8, a memory array 510 is different from memory array 500 according to the first embodiment by comparison in an aspect that ground voltage GND is connected to both ends of current source wire L1# instead of one end of current source wire L1#. Note that in memory array 510 shown in FIG. 8, since the configuration is the same as memory array 500 except for current source I1, current source wires L1 and L1#, write digit line WDL, dummy digit line DDL, row decode transistor RD, dummy row decode transistor RDd and row decoder 50, only part necessary for description thereof is shown in the figure.

Since in memory array 510, ground voltage GND is connected to both ends of current source wire L1#, a stronger force is exerted that fixes current source wire L1# to ground voltage GND than in the case of memory array 500 in which ground voltage GND is connected to one end of current source wire L1#. Therefore, a current flowing in current source wire L1# of memory array 510 is stabilized more than in the configuration of memory array 500. Furthermore, a wiring length from current source I1 to ground voltage. GND is shorter in memory array 510 than in the configuration of memory array 500 by connecting ground voltage GND to current source wire L1# not at only one end but at both ends thereof. Therefore, fluctuations in write currents can be further reduced.

In memory array 510 according to the first modification of the second embodiment, as described above, write currents can be further stabilized to a higher level than in memory array 500 according to the second embodiment.

Second Modification of Second Embodiment

Figure 9:
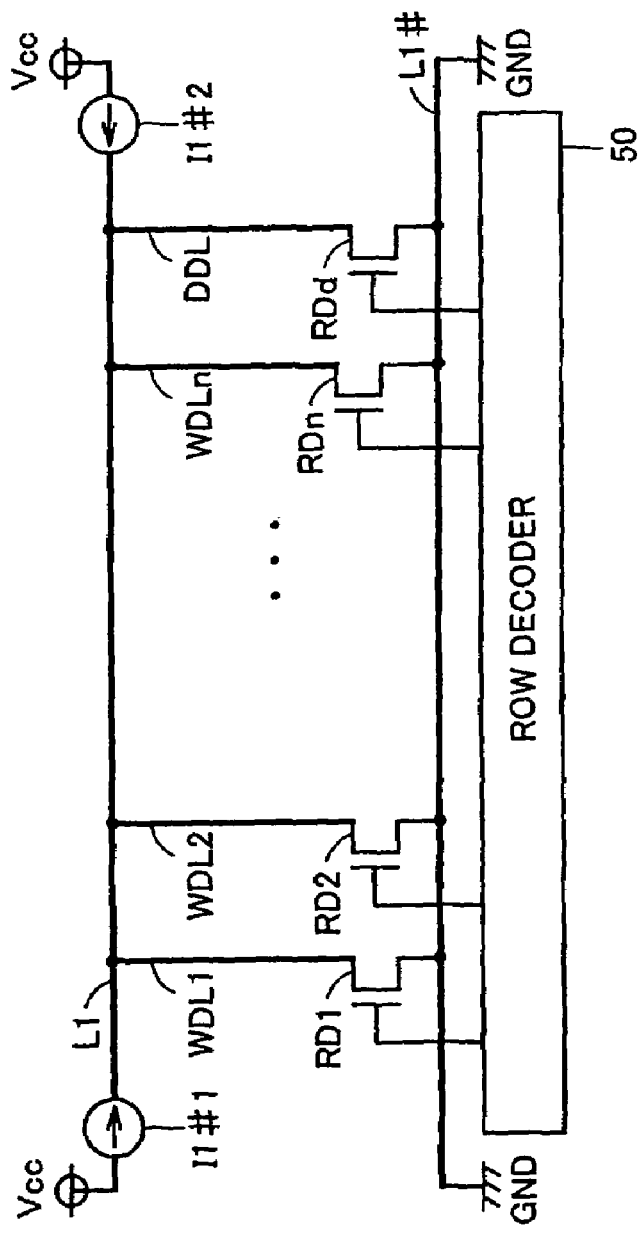
FIGS. 9 to 11 are schematic diagrams showing configurations of memory arrays according to second to fourth modifications of a second embodiment, respectively.

Referring to FIG. 9, a memory array 520 is different from memory array 510 according to the first modification of the second embodiment by comparison in an aspect that current sources I1#1 and I1#2 are provided instead of current source I1.

Memory array 520 is further different from memory array 510 by comparison in an aspect that current sources I1#1 and I1#2 are connected to one end and the other end, respectively, of current source wire L1 instead of current source I1 connected to a point in the vicinity of the center between locations on current source wire L1 to which write digit lines WDL1 and WDLn are connected. Current sources I1#1 and I12 supply the same amount of currents as the amount that current source I1 does. Since the other constituents in the configuration are similar to corresponding constituents in the configuration of memory array 510, none of detailed descriptions thereof will be repeated. Note that in the following description, current sources I1#1 and I1#2 are also collectively referred to as current source I1.

Since current source I1 supplied with power supply voltage Vcc is connected to both ends of current source wire L1 in memory array 520, a stronger force is exerted that fixes current source wire L1 to power supply voltage Vcc than in the case of memory array 510 in which current source I1 is connected to only one end of current source wire L1. Therefore, a current flowing write digit line WDL when data is written is more stabilized in memory array 520 than in the configuration of memory array 510.

In memory array 520 according to the second modification of the second embodiment, as described above, a write current can be stabilized.

Third Modification of Second Embodiment

Figure 10:
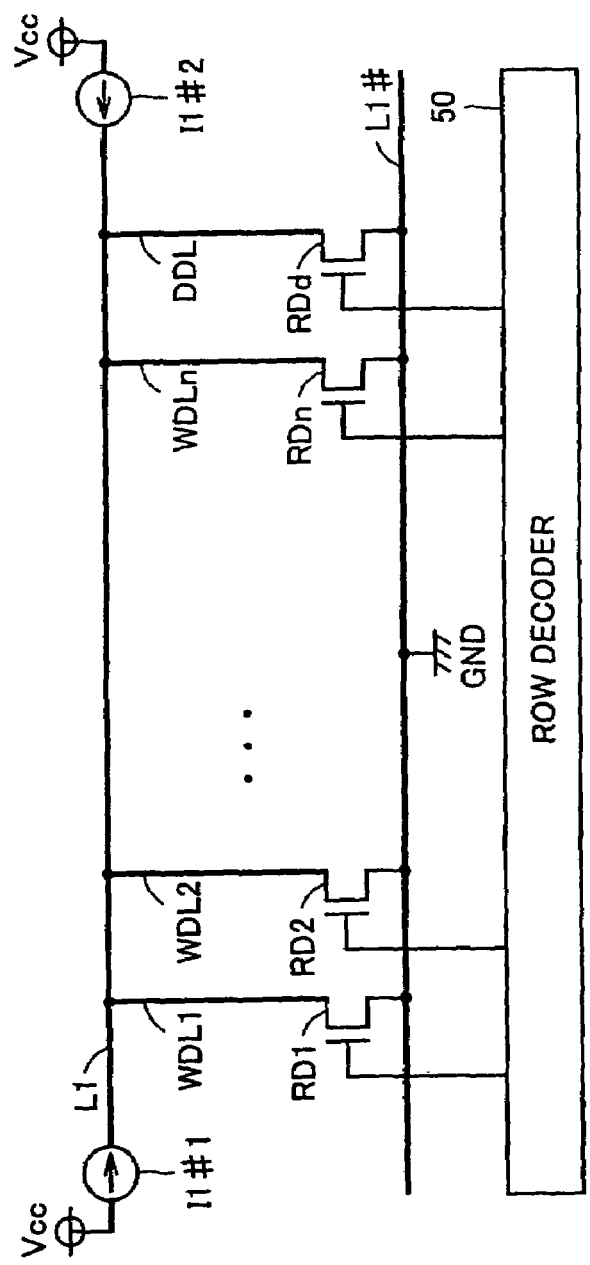

Referring to FIG. 10, a memory array 530 is different from memory array 520 according to the second modification of the second embodiment shown in FIG. 9 by comparison in an aspect that ground voltage GND is connected to a point in the vicinity of the center between locations on current source wire L1# to which row decode transistor RD1 and row decode transistor RDn, respectively, are connected instead of ground voltage GND being connected to both ends of current source wire L1#. Since the other constituents in the configuration are the same as in memory array 520, none of detailed descriptions thereof will be repeated.

Since ground voltage GND, in memory array 530, is connected to one point in the vicinity of the center between locations on current source wire L1# to which write digit lines WDL1 and WDLn, respectively, are connected, a weaker force is exerted that fixes current source wire L1# to ground voltage GND than in the case of memory array 520 in which ground voltage GND is connected to both ends of current source wire L1#. Therefore, when data is written, a current flowing into write digit line WDL is more destabilized, though to some extent, in memory array 530 than in the configuration of memory array 520.

Fluctuations are reduced in path lengths from current source I1 to ground voltage GND caused by locations of selected write digit line WDL, when data is written, in memory array 530 to a lower level than in the configuration of memory array 520.

In memory array 530 according to the third modification of the second embodiment, therefore, a write current can be stabilized.

Fourth Modification of Second Embodiment

Figure 11:
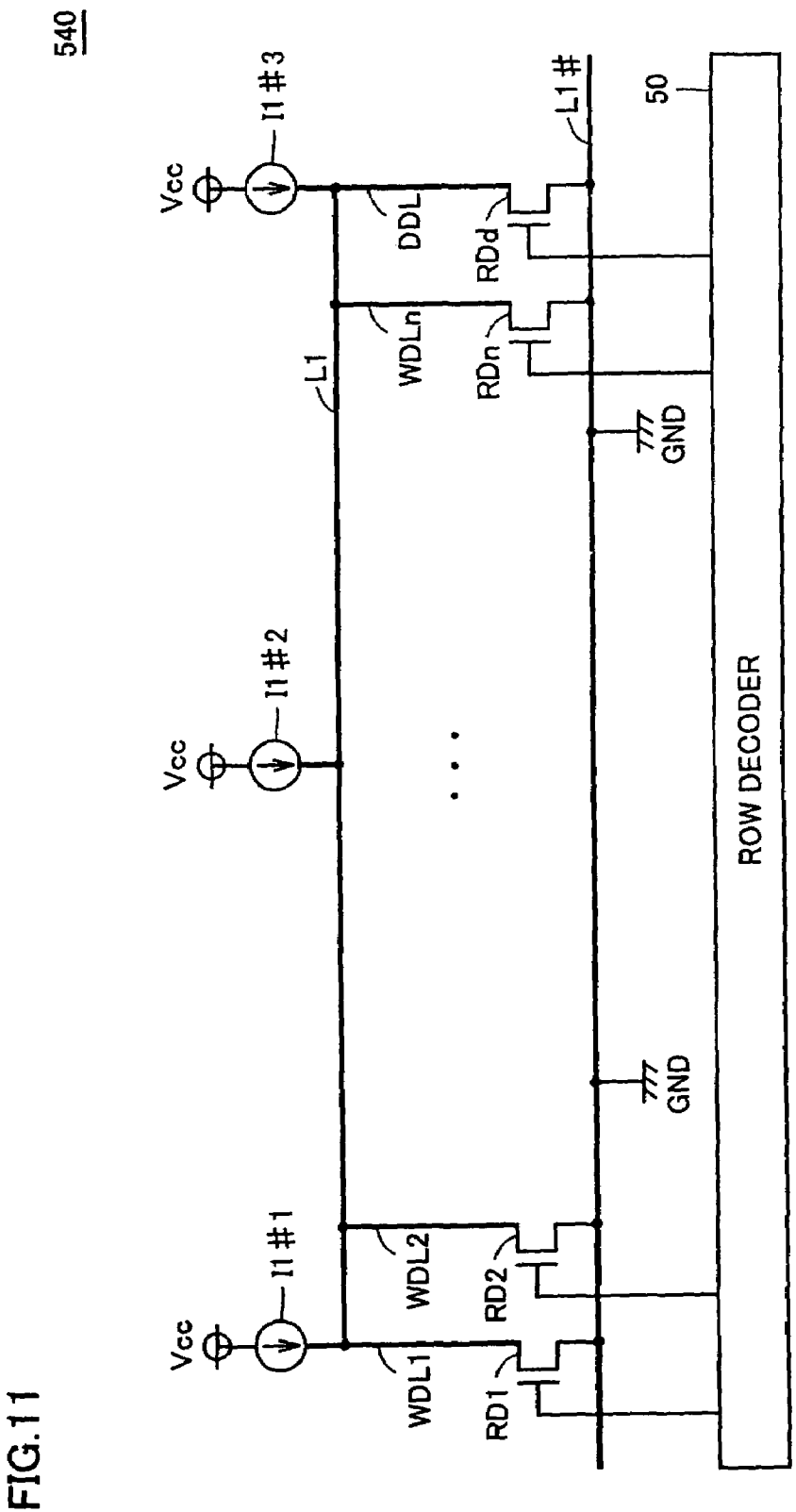

Referring to FIG. 11, a memory array 540 is different from memory array 530 according to the third modification of the second embodiment shown in FIG. 10 by comparison in aspects that current sources I1#1 and I1#3 are connected to one end and the other end, respectively of current source wire L1 instead of current sources I1#1 and I1#2 being connected to one end and the other end, respectively, of current source wire L1 and that current source I1#2 is connected to a point in the vicinity of the center between locations on current source wire L1 to which respective current sources I1#1 and I1#3 are connected.

Memory array 540 is further different from memory array 530 by comparison in an aspect that ground voltage GND is connected to a location on current source wire L1# to which row decode transistor RD corresponding to write digit line WDL connected to a point on current source wire L1 in the vicinity of the center between locations thereon to which current sources I1#1 and I1#2 are connected, instead of ground voltage GND being connected to a point on current source wire L1# in the vicinity of the center between locations to which row decode transistor RD1 and row decode transistor RDn, respectively, are connected.

Memory array 540 is further different from memory array 530 by comparison in an aspect that ground voltage GND is connected to a location on current source wire L1# to which row decode transistor RD corresponding to write digit line WDL connected to a point on current source line L1 in the vicinity of the center between locations thereon to which respective current sources I1#2 and I1#3 are connected. Since the other constituents in the configuration are the same as in memory array 530, none of detailed descriptions thereof will be repeated. Note that in the following description, current sources I1#1, I1#2 and I1#3 are also collectively referred to as current source I1.

Since in memory array 540, current source I1 is connected to three locations on current source wire L1, a stronger force is exerted that fixes current source wire L1 to power supply voltage Vcc than in memory array 530 in which current source I1 is connected to both ends of current source wire L1. Moreover, since in memory array 540, ground voltage GND is connected to two locations on current source wire L1#, a stronger force is exerted that fixes current source wire L1# to ground voltage GND than in memory array 530 in which ground voltage GND is connected to one location on current source wire L1#.

Furthermore, since in memory array 540, current source I1 is connected to three locations on current source wire L1 and ground voltage GND is connected to two locations on current source wire L1#, reduction occurs in fluctuations in path lengths from current source I1 to ground voltage GND caused by locations of selected digit lines WDL when data is written to a lower level than in the configuration of memory array 530. Therefore, a current flowing write digit line WDL when data is written is stabilized in memory array 540 to a higher level than in the configuration of memory array 530.

In memory array 540 according to the fourth modification of the second embodiment, therefore, a write current can be further stabilized to a higher level than in memory array 530 according to the third modification of the second embodiment.

In this embodiment, there has been shown the configuration in which current source I1 is connected at three locations on current source wire L1 and ground voltage GND is connected at two locations on current source wire L1#. Note that fluctuations in path lengths from current source I1 to ground voltage GND caused by locations of respective selected write digit lines WDL when data is written, would be further reduced with a further increased number of current sources connected to current source wire L1 and with a further increased number of locations on current source wire L1# to which ground voltage GND is connected. Therefore, a write current can be further stabilized.

Third Embodiment

Figure 12:
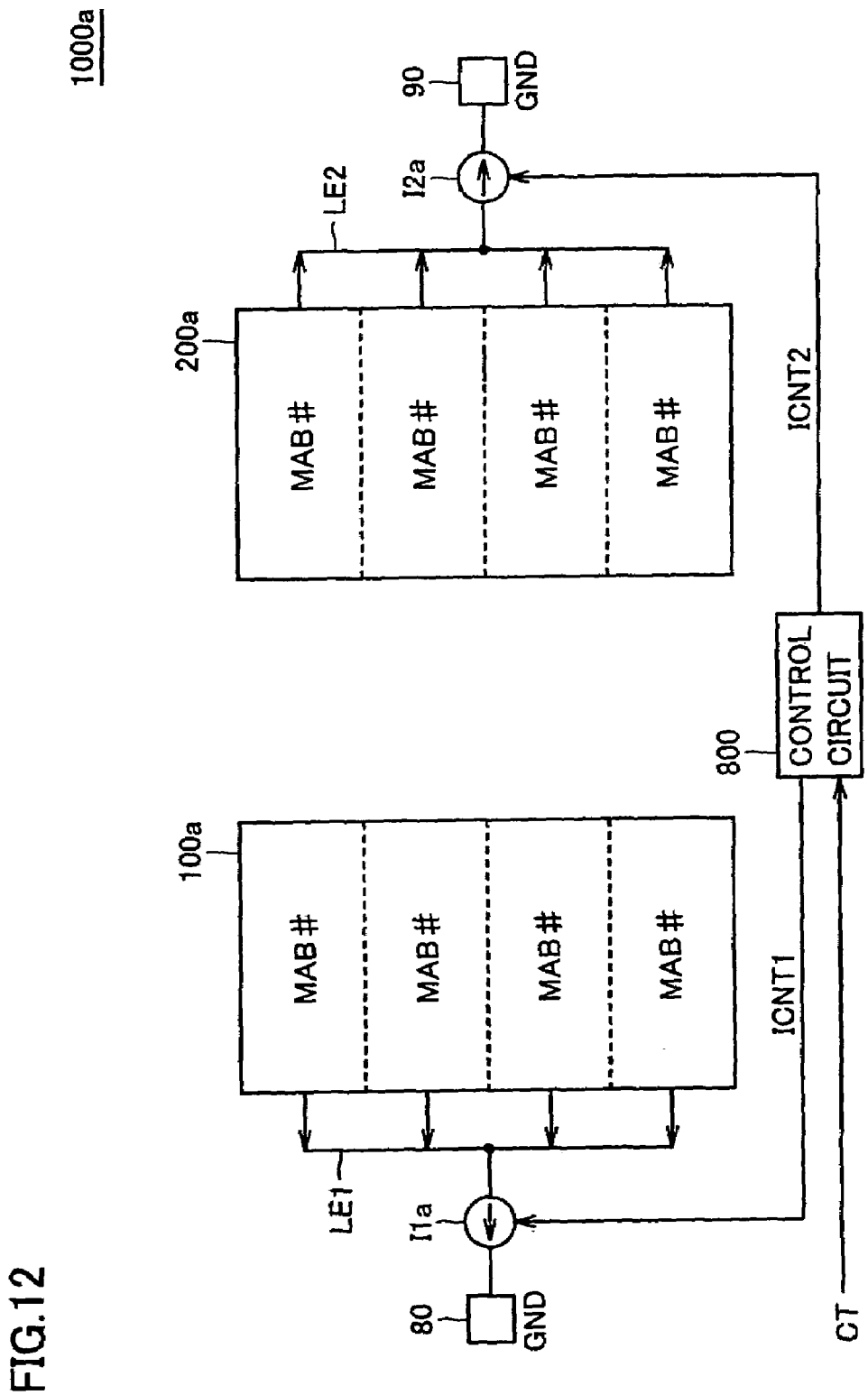
FIG. 12 is a schematic diagram showing a configuration of a non-volatile memory device according to a third embodiment.

Referring to FIG. 12, a non-volatile memory device 1000a is different from non-volatile memory device 1000 according to the first embodiment by comparison in aspects that memory array mats 100a and 200a are provided instead of memory array mats 100 and 200, that power supply terminals 80 and 90 are provided instead of power supply terminals 10 and 20, and that current sources I1a and I2a are provided instead of current sources I1 and I2.

Memory array mats 100a and 200a are each divided into, as an example, four memory array blocks MAB# in a similar way to the way in memory array mats 100 and 200. Though details will be described later, each of memory array block MAB# includes, as an example, a plurality of memory cells arranged in rows and columns, an address decoder, bit lines, write digit lines and read word lines. Note that memory array mats 100a and 200a may be configured so that a bit line, a write digit line and a read word line included in a plurality of memory array blocks are selected with one address decoder.

Non-volatile memory device 1000a is further different from non-volatile memory device 1000 by comparison in aspects that a current is supplied from each of memory array block MAB# of memory array mat 100a to current source I1a through current source wire LE1 instead of current source I1 supplying a current to each memory array block MAB of memory array mat 100 through current source wire LE1, and that currents are supplied to current source I2a from each memory array block MAB# of memory array mat 200a through current source wire LE2 instead of current source I2 supplying currents to each memory array block MAB of memory array mat 200 through current source wire LE2. Since the other constituents in the configuration are similar to corresponding constituents in the configuration of non-volatile memory device 1000, none of detailed descriptions thereof will be repeated.

Current sources I1a and I2a cause currents to flow to respective power supply terminals 80 and 90 connected to ground voltage GND. Current sources I1a and I2a are activated according to respective current control signals ICNT1 and ICNT2.

Figure 13:
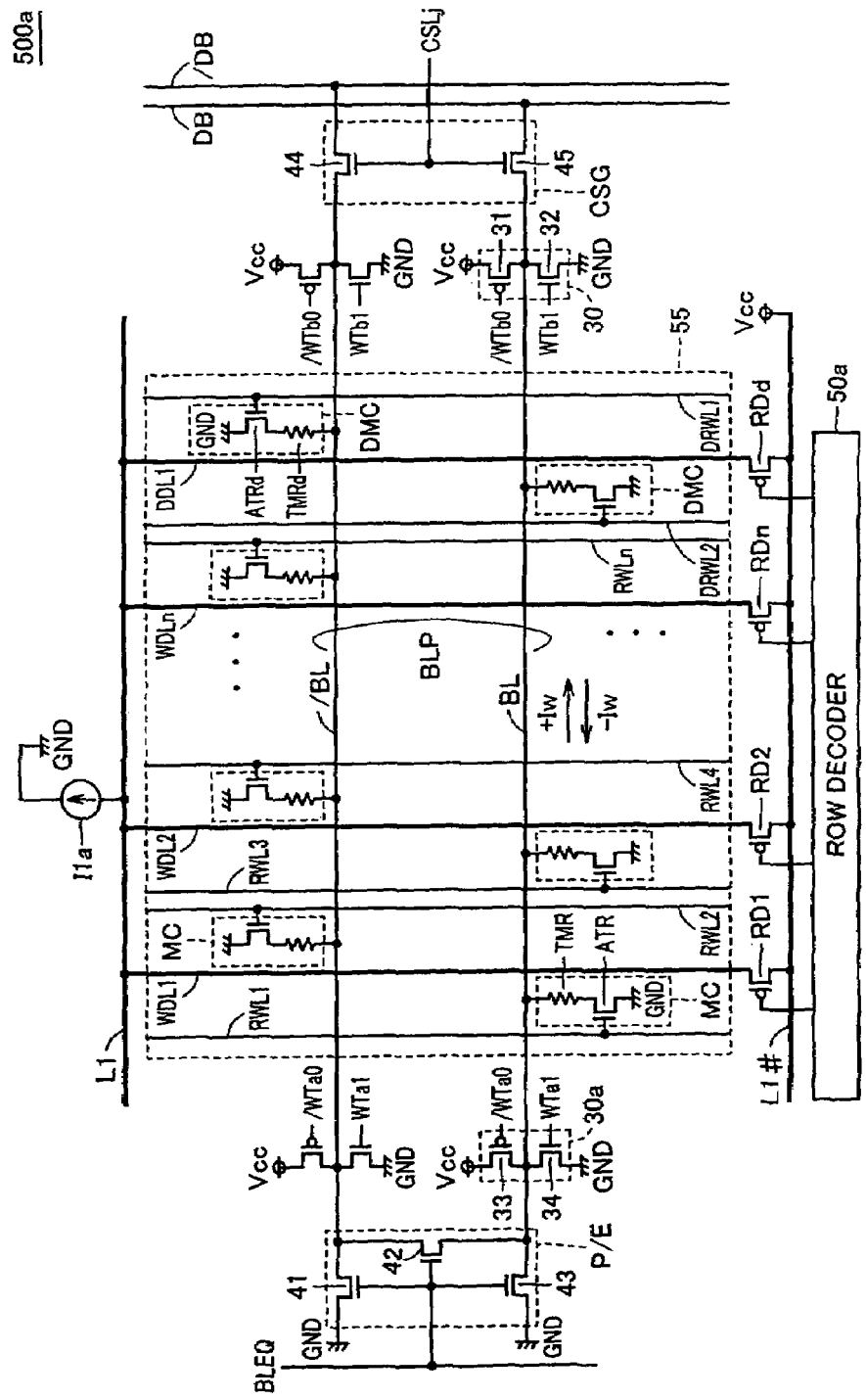
FIG. 13 is a circuit diagram showing a configuration of a memory array in a memory array block according to the third embodiment.

FIG. 13 is a circuit diagram showing a configuration of a memory array 500a in memory array block MAB# according to the third embodiment. Note that in FIG. 13, there is also shown current source I1a not included in memory array 500a for convenience in description.

Referring to FIG. 13, memory array 500a is different from memory array 500 according to the first embodiment by comparison in aspects that a row decoder 50a is included instead of row decoder 50, that current source I1a is connected to current source line L1 instead of current source I1, and that power supply voltage Vcc is connected to one end of current source wire L1# instead of ground voltage GND. In this configuration, a P-channel MOS transistor is used as each of row decode transistors RD and a P-channel MOS transistor is used as dummy decode transistor RDd. Since the other constituents in the configuration are similar to corresponding constituents in the configuration of memory array 500, none of detailed descriptions thereof will be repeated.

Row decoder 50a sends a signal at L level to the gate of desired row decode transistor RD or dummy row decode transistor RDd according to a row address signal to connect desired write digit line WDL electrically to current source wire L1# or connect dummy digit line DDL electrically to current source wire L1#.

Since a configuration for supplying a data write current into bit line BL and a configuration for data reading are similar to the corresponding configurations in memory array 500, none of detailed descriptions thereof will be repeated.

Then, description will be given of operations in causing a current to flow into write digit line WDL in memory array 500a when data is written. When a row address signal is inputted to row decoder 50a, desired row decode transistor RD is turned on to connect corresponding write digit line WDL electrically to current source wire L1#. Therefore, a current flows to current source I1a connected to current source wire L1 through selected write digit line WDL from power supply voltage Vcc connected to current source wire L1#.

Referring again to FIG. 12, description will be given of operations in non-volatile memory device 1000a. In a case where a write operation is performed on a memory cell in memory array block MAB# of memory array mat 100a, control signal CT is set so that control circuit 800 transmits current control signal ICNT1 to current source I1a. On the other hand, in a case where a write operation is performed on a memory cell in memory array block MAB# of memory array mat 200a, control signal CT is set so that control circuit 800 transmits current control signal ICNT2 to current source I2a. Note that no specific limitation is imposed on one memory array block, which becomes an object for writing, but a plurality of memory array blocks may simultaneously be objects for writing.

That is, even if non-volatile memory device 1000a is configured so that currents are supplied to power supply terminals 80 and 90 from memory array blocks MAB# of respective memory array mats 100a and 200a, one memory array mat is divided into two parts in similar way to the way in non-volatile memory device 1000 to provide current sources correspondingly to respective two memory array mats and to selectively activate one thereof, thereby enabling a wiring length from a current source to a selected memory cell to be halved. Hence, wiring resistance from a current source to a selected memory cell is halved, thereby enabling fluctuations in write currents to be reduced.

In non-volatile memory device 1000a according to the third embodiment, as described above, there can be obtained an effect similar to the effect of non-volatile memory device 1000 according to the first embodiment.

First Modification of Third Embodiment

Figure 14:
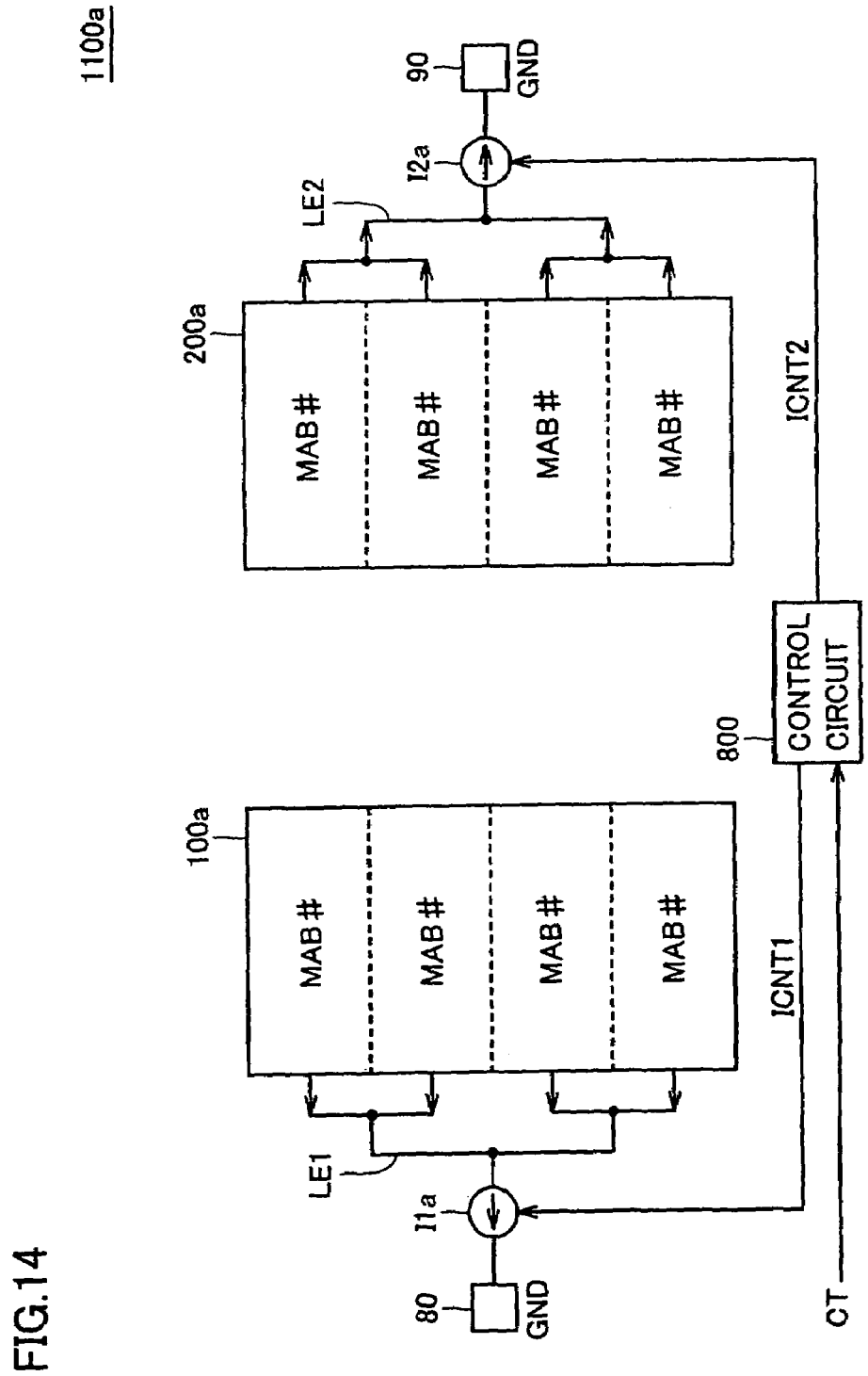
FIGS. 14 and 15 are schematic diagrams showing configurations of non-volatile memory devices according to the first and second modifications of the third embodiment, respectively.

Referring to FIG. 14, a non-volatile memory device 1100a is different from non-volatile memory device 1000a according to the third embodiment shown in FIG. 12 by comparison in an aspect that non-volatile memory device 1100a is configured so that wiring lengths of current source wire LE1 from memory blocks MAB# of memory array mat 100a to current source I1a are equal to each other and wiring lengths of current source wire LE2 from memory blocks MAB# of memory array mat 200a to current source I2a are equal to each other. Since the other constituents in the configuration and the operations therein are the same as in the configuration of non-volatile memory device 1000a, none of detailed descriptions thereof will be repeated.

Non-volatile memory device 100a, therefore, can reduce fluctuations in wiring lengths from selected memory cells in each of memory array blocks MAB of memory array mats 100a and 200a to the current source to a lower level than non-volatile memory device 1000a.

As a result, non-volatile memory device 1100a can further reduce fluctuations in write currents to a lower level than non-volatile memory device 1000a in addition to the effect exerted by non-volatile memory device 1000a.

Second Modification of Third Embodiment

Figure 15:
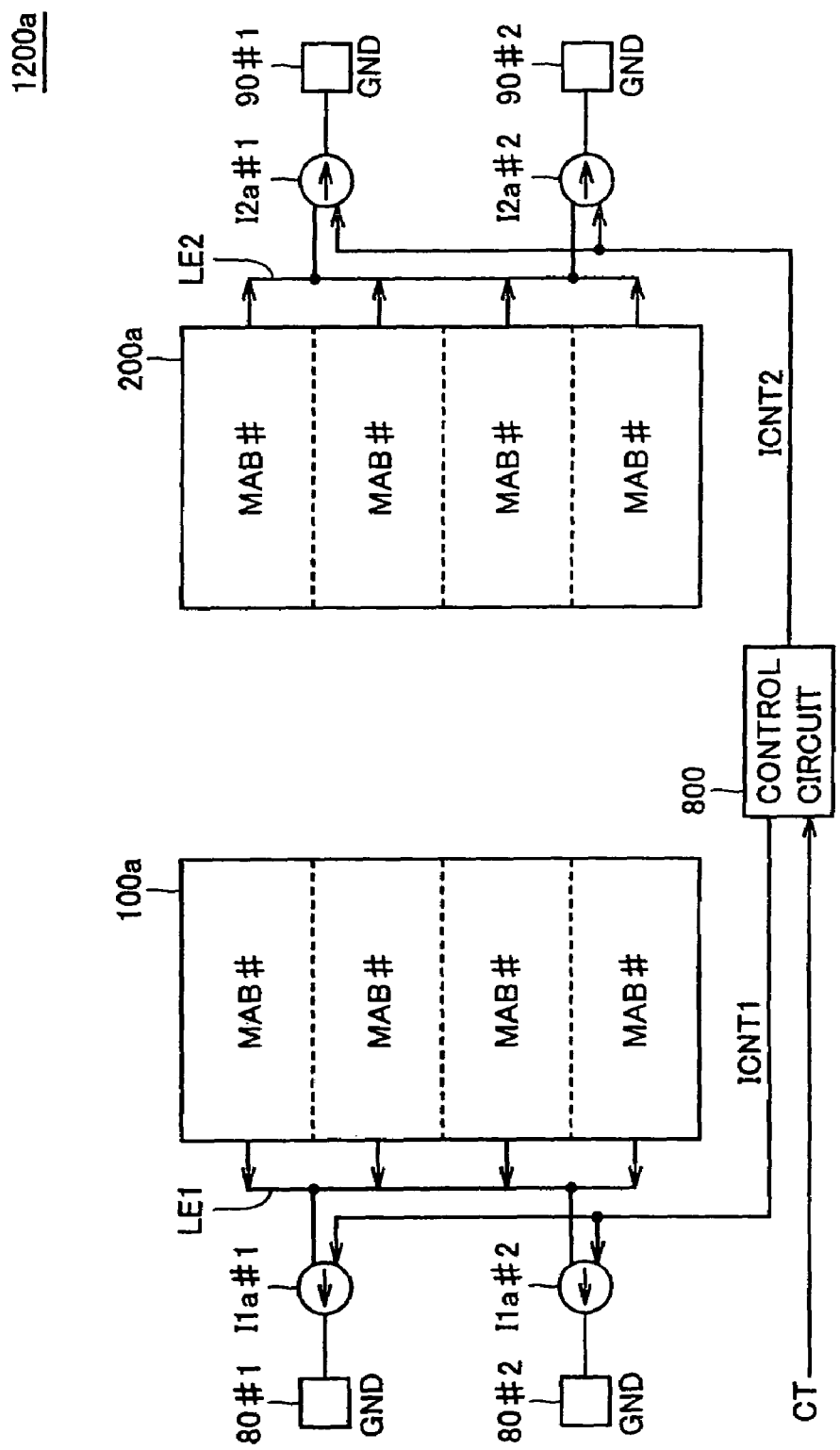

Referring to FIG. 15, a non-volatile memory device 1200a is different from non-volatile memory device 1000a according to the third embodiment shown in FIG. 12 by comparison in an aspect that power terminals 80#1, 80#2, 90#1 and 90#2, and current sources I1a#1, I1a#2, I2a#1 and I2a#2 are provided instead of power supply terminals 80 and 90, and current sources I1a and I2a. Current sources I1a#1, I1a#2, I2a#1 and I2a#2 are connected to power supply terminals 80#1, 80#2, 90#1 and 90#2.

Each memory array block MAB# of memory array mat 100a supplies currents to current sources I1a#1 and I1a#2 through current source wire LE1. Each memory array block MAB# of memory array mat 200a supplies currents to current sources I2a#1 and I2a#2 through current source wire LE2. Current sources I1a#1, I1a#2, I2a#1 and I2a#2 cause currents to flow into respective power supply terminals 80#1, 80#2, 90#1 and 90#2, all connected to ground voltage GND. Since the other constituents in the configuration are similar to corresponding constituents of the configuration of non-volatile memory device 1000a, none of detailed descriptions thereof will be repeated.

Control circuit 800 transmits current control signal ICNT1 to current sources I1a#1 and I1a#2 according to control signal CT. Control circuit 800 further transmits current control signal ICNT2 to current sources I2a#1 and I2a#2 according to control signal CT.

Current sources I1a#1 and I1a#2 are activated according to current control signal ICNT1. Current sources I2a#1 and I2a#2 are activated according to current control signal ICNT2.

In a case where a write operation is performed on a memory cell in memory array block MAB# of memory array mat 100a, control signal CT is set so that control circuit 800 transmits current control signal ICNT1 to current sources I1a#1 and I1a#2. On the other hand, in a case where a write operation is performed on a memory cell in memory array block MAB# of memory array mat 200a, control signal CT is set so, that control circuit 800 transmits current control signal ICNT2 to current sources I2a#1 and I2a#2. Note that no specific limitation is imposed on one memory array block, which becomes an object for writing, but a plurality of memory array blocks may simultaneously be objects for writing.

Therefore, non-volatile memory device 1200a has an advantage that reduction occurs in wiring lengths to current sources from selected memory cells in memory blocks MAB# of each of memory array mats 100a and 200a by connecting the two current sources to each of current source wires LE1 and LE2.

As a result, non-volatile memory device 1200a can further reduce fluctuations in write currents to a lower level than non-volatile memory device 1000a in addition to the effect exerted by non-volatile memory device 1000a.

Note that in this embodiment, a configuration has been shown in which two current sources are connected to a current source wire, write currents to selected memory cells can be further stabilized by connecting three or more current sources to a current source wire. Furthermore, while in this embodiment, an example has been shown in which a plurality of current sources connected to one current source wire are all activated, the present invention is not limited to such a configuration. The present invention can also be applied to a configuration in which a signal from a control circuit is transmitted to each of current sources independently of the other to enable only a desired current source to be selectively activated by the control circuit.

Fourth Embodiment

Figure 16:
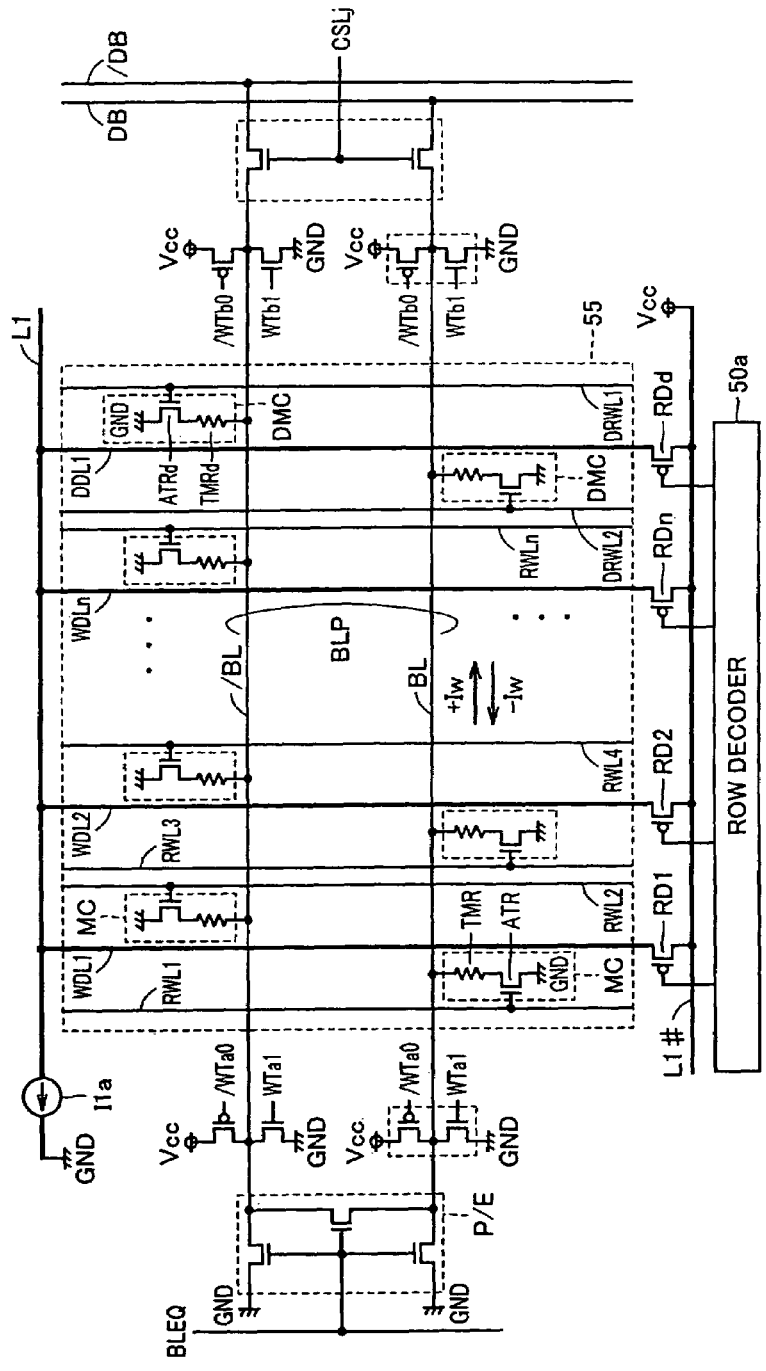
FIGS. 16 and 17 are circuit diagrams showing configurations of memory arrays in memory array blocks according to the third embodiment.

Referring to FIG. 16, a memory array 505a is different from memory array 505 according to the second embodiment shown in FIG. 7 by comparison in aspects that a row decoder 50a is included instead of row decoder 50, that current source I1a is connected to one end of current source line L1 instead of current source I1, and that power supply voltage Vcc is connected to one end of current source wire L1# instead of ground voltage GND. Current source I1a is connected to ground voltage GND. In this configuration, a P-channel MOS transistor is used as each of row decode transistors RD and a P-channel MOS transistor is used as dummy row decode transistor RDd. Since the other constituents in the configuration are similar to corresponding constituents in the configuration of memory array 505, none of detailed descriptions thereof will be repeated.

That is, similar to memory array 505, in memory array 505a, current source I1a connected to current source wire L1 is located at a position thereon diagonal with respect to power supply voltage Vcc connected to current source wire L1#.

Therefore, in memory array 505a according to the fourth embodiment, there can be obtained an effect similar to the effect of memory array 505 according to the second embodiment.

First Modification of Fourth Embodiment

Figure 17:
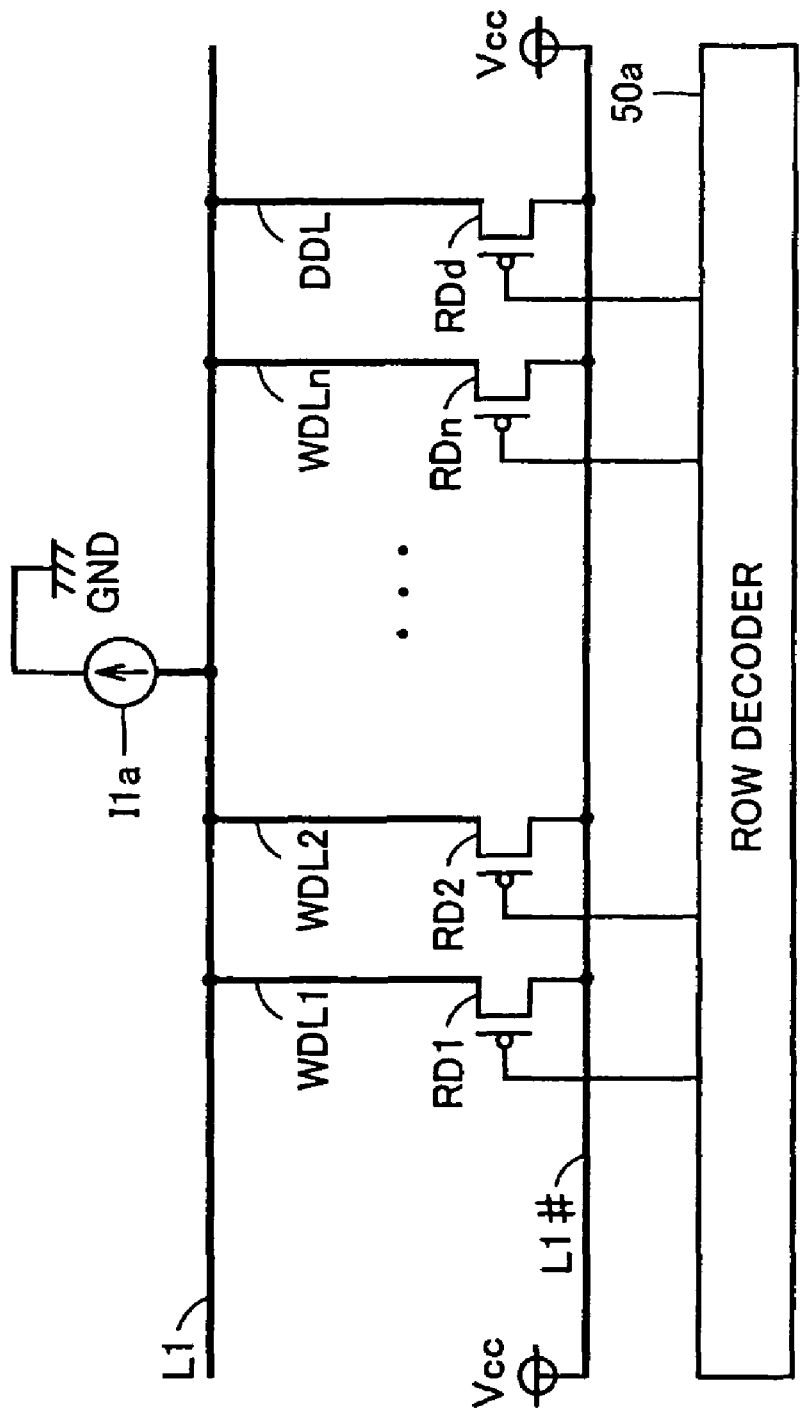

Referring to FIG. 17, a memory array 510a is different from memory array 510 according to the first modification of the second embodiment shown in FIG. 8 by comparison in aspects that a row decoder 50a is included instead of row decoder 50, that current source I1a is connected to current source wire L1 instead of current source I1, and that power supply voltage Vcc is connected to both ends of current source wire L1# instead of ground voltage GND. Current source I1a is connected to ground voltage GND. In this configuration, a P-channel MOS transistor is used as each of row decode transistors RD and a P-channel MOS transistor is used as dummy row decode transistor RDd. Since the other constituents in the configuration are similar to corresponding constituents in the configuration of memory array 510, none of detailed descriptions thereof will be repeated.

While memory array 510a is configured so that in the configuration of memory array 510, current sources and ground voltage are reversed in arrangement, an effect similar to the effect of memory array 510 can be obtained.

Second Modification of Fourth Embodiment

Figure 18:
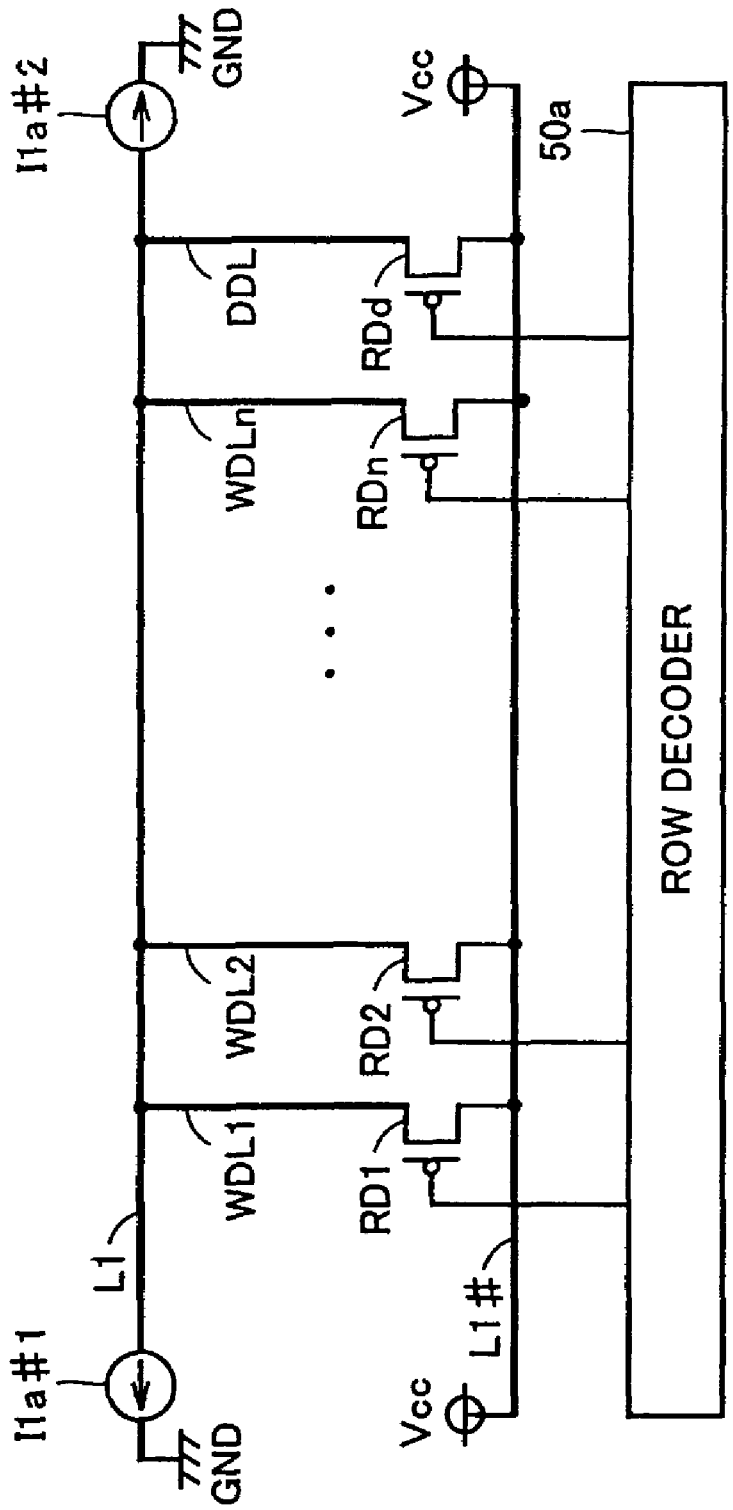
FIGS. 18 to 20 are schematic diagrams showing configurations of memory arrays according to second to fourth modifications of a fourth embodiment, respectively.

Referring to FIG. 18, a memory array 520a is different from memory array 520 according to the second modification of the second embodiment shown in FIG. 9 by comparison in aspects that a row decoder 50a is included instead of row decoder 50, that current sources I1a#1 and I1a#2 are connected to one end and the other end, respectively, of current source wire L1 instead of current sources I1#1 and I1#2, and that power supply voltage Vcc is connected to both ends of current source wire L1# instead of ground voltage GND. Current sources I1a#1 and I1a#2 are connected to ground voltage GND. In this configuration, a P-channel MOS transistor is used as each of row decode transistor RD and a P-channel MOS transistor is used as dummy row decode transistor RDd. Since the other constituents in the configuration are similar to corresponding constituents in the configuration of memory array 520, none of detailed descriptions thereof will be repeated.

While memory array 520a is configured so that in the configuration of memory array 520, current sources and ground voltage are reversed in arrangement, an effect similar to the effect of memory array 520 can be obtained.

Third Modification of Fourth Embodiment

Figure 19:
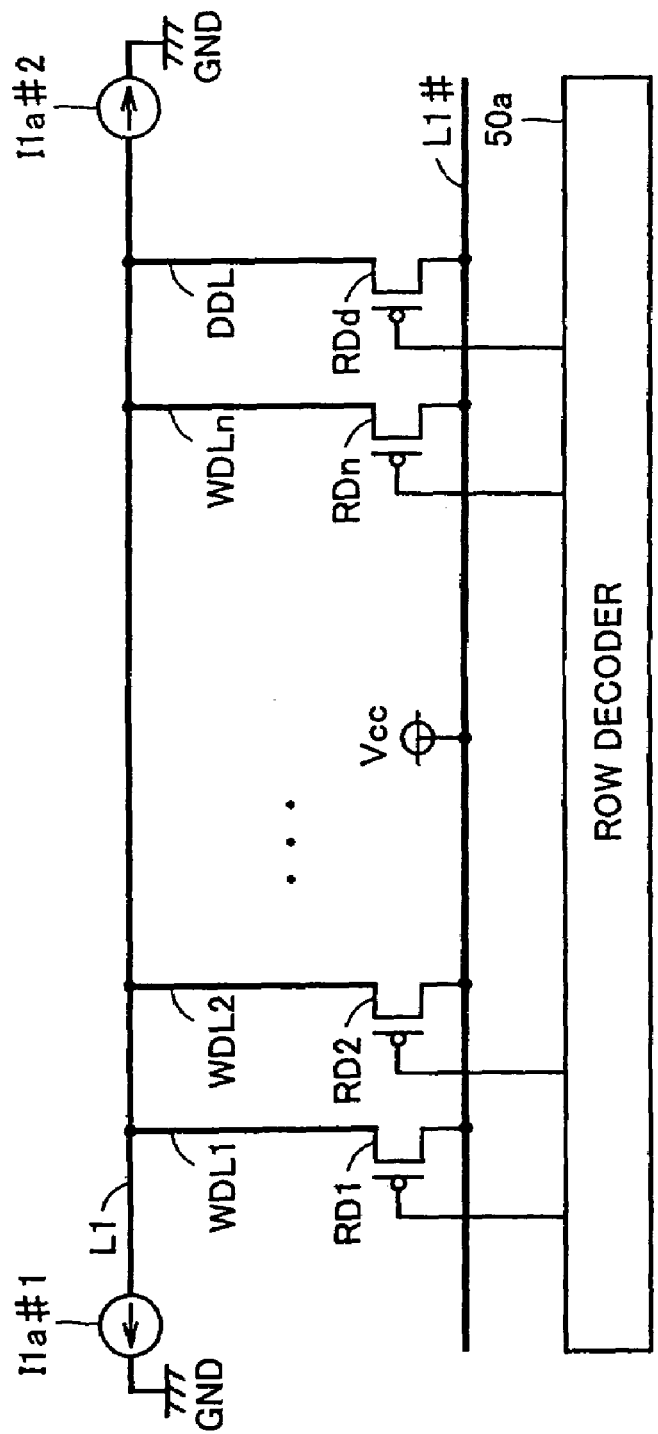

Referring to FIG. 19, a memory array 530a is different from memory array 530 according to the third modification of the second embodiment shown in FIG. 10 by comparison in aspects that a row decoder 50a is included instead of row decoder 50, that current sources I1a#1 and I1a#2 are connected to one end and the other end, respectively, of current source wire L1 instead of current sources I1#1 and I1#2, and that power supply voltage Vcc is connected to a point on current source wire L1# in the vicinity of the center between locations thereon to which row decode transistor RD1 and row decode transistor RDn are connected instead of ground voltage GND. Current sources I1a#1 and I1a#2 are connected to ground voltage GND. In this configuration, a P-channel MOS transistor is used as each of row decode transistor RD and a P-channel MOS transistor is used as dummy row decode transistor RDd. Since the other constituents in the configuration are similar to corresponding constituents in the configuration of memory array 530, none of detailed descriptions thereof will be repeated.

While memory array 530a is configured so that in the configuration of memory array 530, current sources and ground voltage are reversed in arrangement, an effect similar to the effect of memory array 530 can be obtained.

Fourth Modification of Fourth Embodiment

Figure 20:
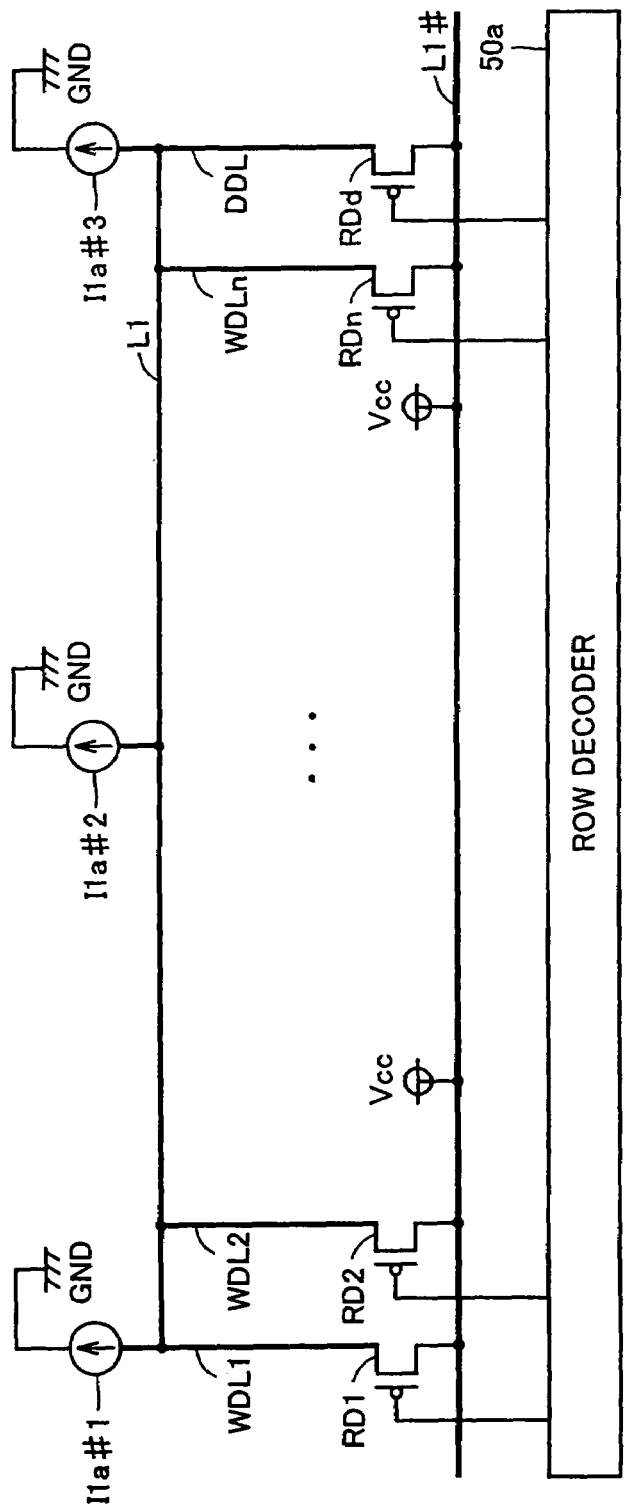

Referring to FIG. 20, a memory array 540a is different from memory array 540 according to the fourth modification of the second embodiment shown in FIG. 11 by comparison in aspects that a row decoder 50a is included instead of row decoder 50, that current sources I1a#1, I1a#2 and I1a#3 are connected to locations on current source wire L1 to which current sources I1#1, I1#2 and I1#3 are connected instead of current sources I1#1, I1#2 and I1#3, and that power supply voltage Vcc is connected to locations on current source wire L1# to which ground voltage GND is connected instead of ground voltage GND. Current sources I1a#1, I1a#2 and I1a#3 are connected to ground voltage GND. In this configuration, a P-channel MOS transistor is used as each of row decode transistor RD and a P-channel MOS transistor is used as dummy row decode transistor RDd. Since the other constituents in the configuration are similar to corresponding constituents in the configuration of memory array 540, none of detailed descriptions thereof will be repeated.

While memory array 540a is configured so that in the configuration of memory array 540, current sources and ground voltage are reversed in arrangement, an effect similar to the effect of memory array 540 can be obtained.

Fifth Embodiment

Then, part of non-volatile memory device 1000 described above is shown in detail for comparison with a non-volatile memory device according to this embodiment and description will be given of a problem thereof.

Figure 21:
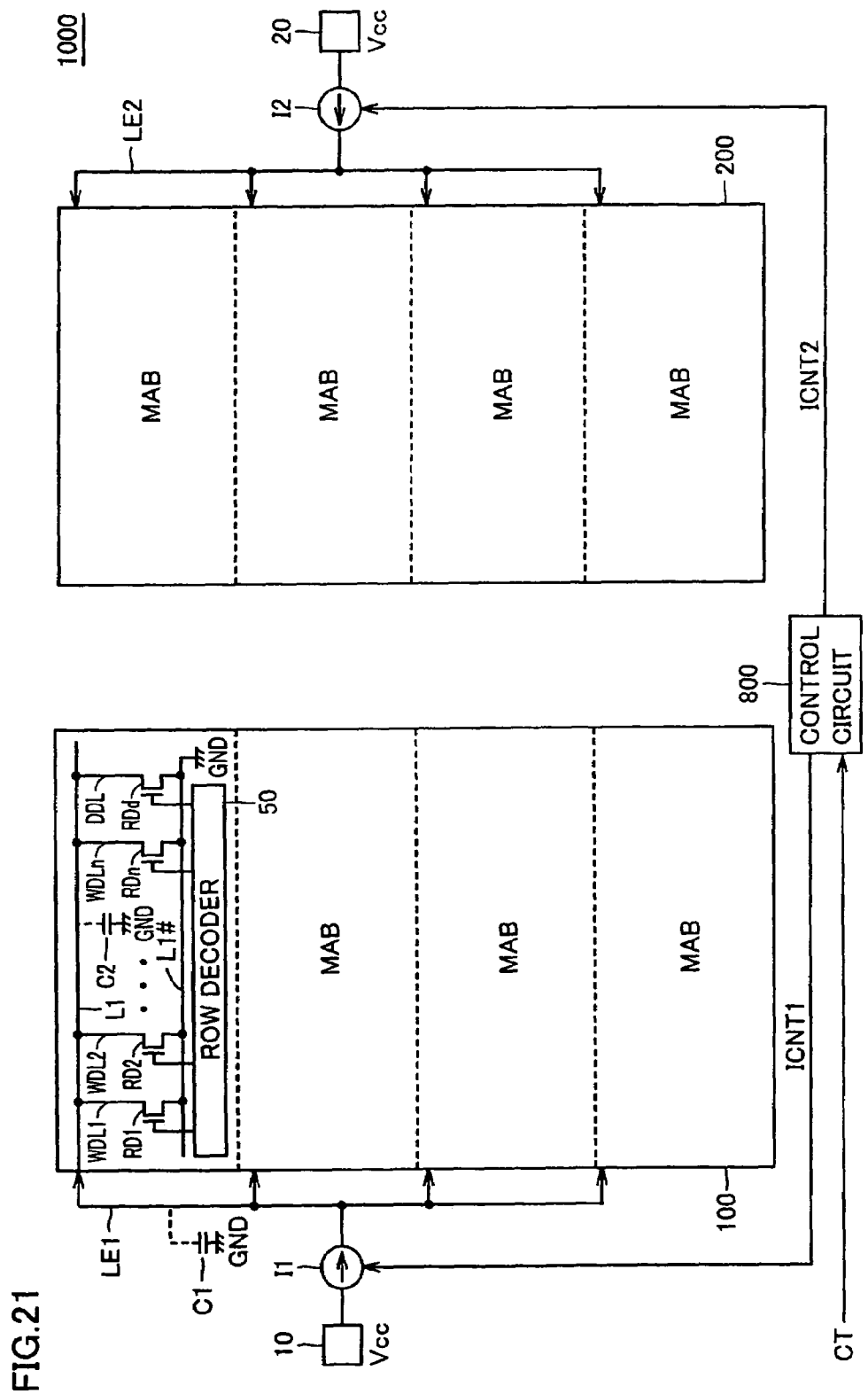
FIG. 21 is a diagram showing details of one of memory blocks in a memory array mat of a non-volatile memory device according to the first embodiment.

In FIG. 21, there is shown a configuration of memory array 505 for description in one of memory blocks MAB of non-volatile memory device 1000.

Parasitic capacitances C1 and C2 are generated in current source wires LE1 and L1, respectively. Since current source wire L1 is generally longer than current source wire LE1, parasitic capacitance C2 is larger than parasitic capacitance C1.

In the configuration non-volatile memory device 1000 shown in FIG. 21, if current source wire L1 is precharged with power supply voltage Vcc before activation of row decoder 50, a current produced from parasitic capacitance C2 generating on current source wire L1 is superimposed on a write current flowing in selected write word line WDL after activation of row decoder 50. For the reason, an excessively large current is produced that is larger than an ordinary write current in write word line WDL to create a possibility that erroneous data writing occurs on a non-selected memory cell arranged in the vicinity of selected write word line WDL.

Furthermore, in the configuration of non-volatile memory device 1000 shown in FIG. 21, a voltage supplied to a current source for generating a write current is higher than a voltage used in a memory array mat. Therefore, before row decoder 50 is activated when power is turned on, that is, when a possibility exists that write digit line WDL is in a selected state, a current produced from parasitic capacitance C2 is superimposed on a current from a current source to generate an excessive large current and to thereby, produce a possibility that erroneous data writing is performed on a memory cell arranged in the vicinity of write word line WDL.

In order to solve the problem, current source wires LE1 and L1 are precharged to ground voltage GND differing from power supply voltage Vcc to thereby prevent generation of an excessive large current.

Figure 22:
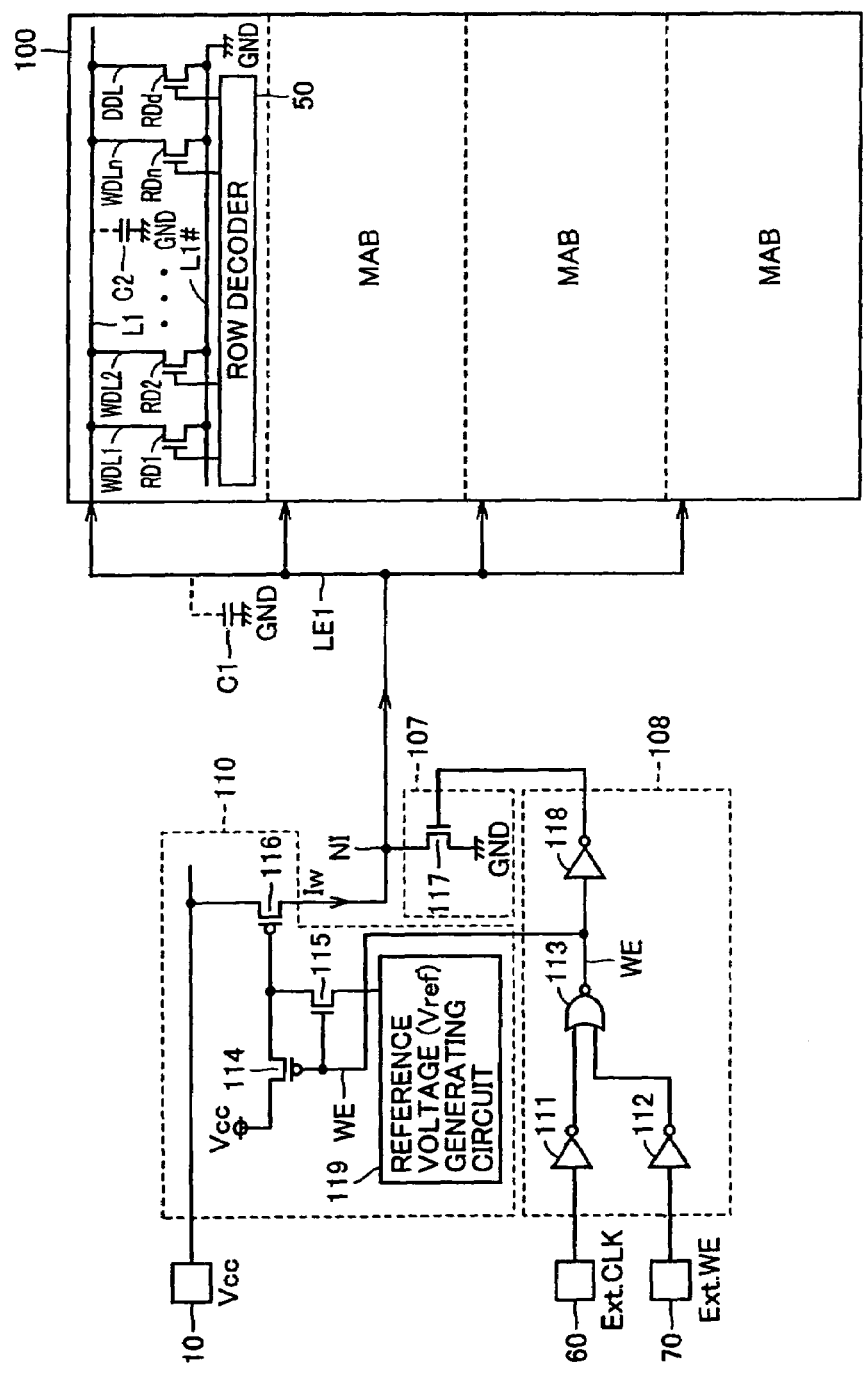
FIG. 22 is a schematic diagram showing a configuration of a non-volatile memory device according to a fifth embodiment.

Referring to FIG. 22, non-volatile memory device 1500 includes a memory array mat 100, a power supply terminal 10, a clock terminal 60, a control terminal 70, a voltage setting circuit 107, a control circuit 108 and a current source I10.

Power supply voltage Vcc is supplied to power supply terminal 10. An external clock Ext.CLK is inputted to clock terminal 60. An external write signal Ext.WE is inputted to control terminal 70. Voltage setting circuit 107 includes an N-channel MOS transistor 117 provided between a node NI and ground voltage GND.

Control circuit 108 includes inverters 111, 112 and 118, and a NOR circuit 113. Inverter 111 outputs a signal at an inverted level of external clock Ext.CLK inputted from clock terminal 60. Inverter 112 outputs a signal at an inverted level of external write signal Ext.WE inputted from control terminal 70. NOR circuit 113 outputs a signal WE obtained by performing a NOR operation on output signals of inverters 111 and 112. That is, when output signals of inverters 111 and 112 are both at L level, signal WE is set at H level. Inverter 118 inputs a signal at an inverted level of signal WE to the gate of N-channel MOS transistor 117 in voltage setting circuit 107.

Current source I10 includes P-channel MOS transistors 114 and 116, an N-channel MOS transistor 115, and a reference voltage generating circuit 119.

P-channel MOS transistor 116 is provided between power supply terminal 10 and node NI. The source and drain of P-channel MOS transistor 114 are connected to power supply voltage Vcc and the gate of P-channel MOS transistor 116, respectively. The source and drain of N-channel MOS transistor 115 are connected to a connection node between the drain of P-channel MOS transistor 114 and the gate of N-channel MOS transistor 116, and reference voltage generating circuit 119, respectively. Signal WE is inputted to the gates of P-channel MOS transistor 114 and N-channel MOS transistor 115.

Node NI is connected to current source wire LE1 for supplying a current to each memory array block MAB of memory array mat 100.

Reference voltage generating circuit 119 generates a voltage Vref at which a write current flowing in write digit line WDL in memory array mat 100 becomes optimal. Vref is generally set to an intermediate level between power supply voltage Vcc and ground voltage GND.

While N-channel MOS transistor 117 is in the on state during a period in which signal WE is at L level, P-channel MOS transistor 116 is not in the on state. Therefore, during a period in which signal WE is at L level, voltages on current source wires LE1 and L1 are precharged to ground voltage GND at all times by an operation of voltage setting circuit 107.

On the other hand, when signal WE is set to H level, N-channel MOS transistor 117 is turned off while N-channel MOS transistor 115 is turned on. Therefore, since voltage Vref is applied to the gate of P-channel MOS transistor 116, P-channel MOS transistor 116 is turned on. As a result, voltage levels of current source wires LE1 and L1 are set to power supply voltage Vcc.

Figure 23:
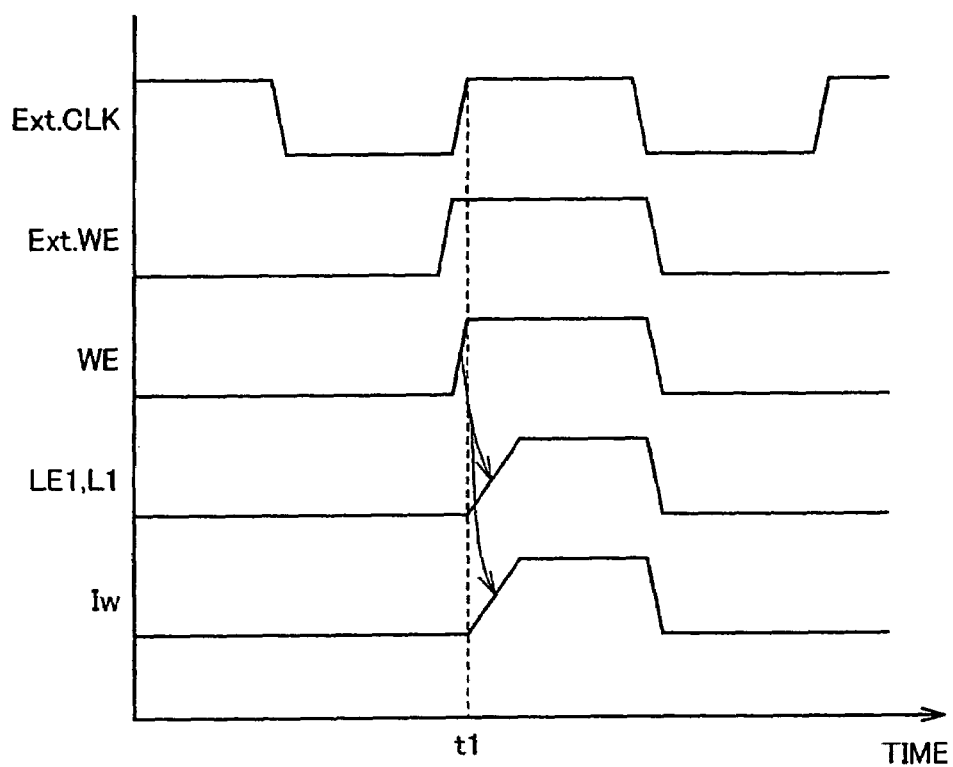
FIG. 23 is an operating waveform diagram describing operations in generation of a write current in a non-volatile memory device according to the fifth embodiment.

FIG. 23 is an operating waveform diagram describing operations in generation of a write current in a non-volatile memory device 1500 according to the fifth embodiment. In FIG. 23, LE1 and L1 show a change in voltage level of current source wires LE1 and L1. Iw shows a change in write current flowing out from current source I10.

Then, description will be given of operations in generation of a write current in non-volatile memory device 1500 using FIGS. 22 and 23. Current source wires LE1 and L1 are in a precharged state at ground voltage GND during a period in which at least one of external clock Ext.CLK and external write signal Ext.WE is at L level. Signal WE takes H level at time point t1 when external clock Ext.CLK and external write signal Ext.WE take H level. In company with this, voltage level of current source wires LE1 and L1 transit from ground voltage GND to power supply voltage Vcc. Simultaneously, not only does a voltage level of current source wire L1 rise, but write current Iw flowing out from current source 110 also increases.

Figure 24:
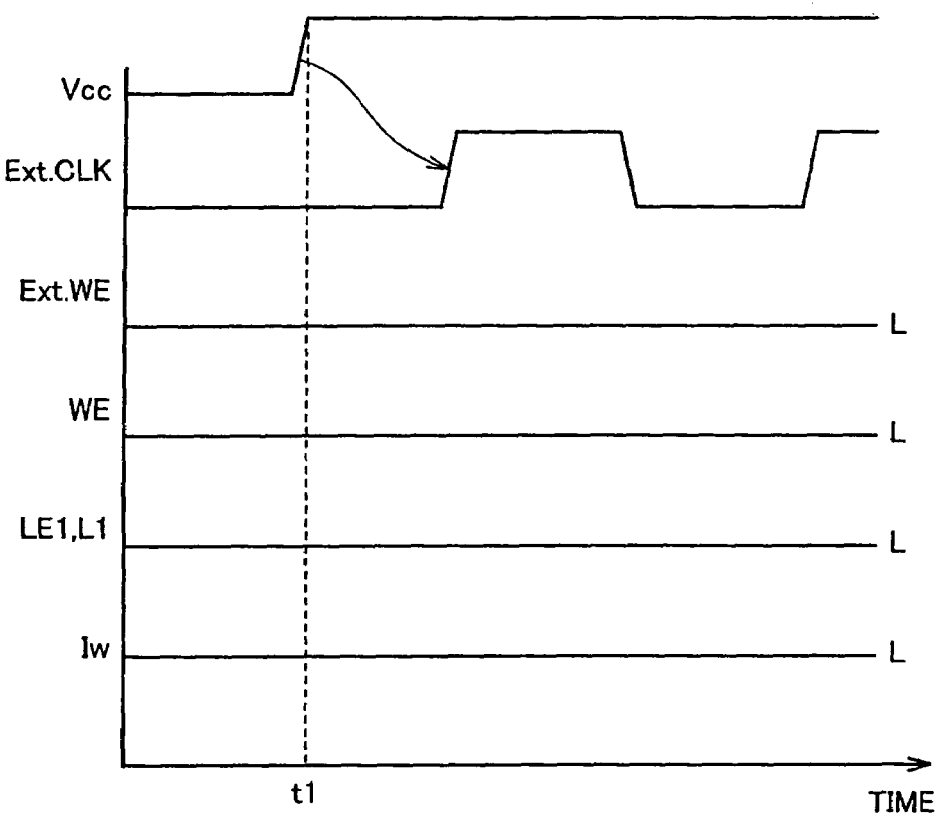
FIG. 24 is an operating waveform diagram describing operations when power is turned on of a non-volatile memory device according to the fifth embodiment.

Then, description will be given of operations when power is turned on in non-volatile memory device 1500 using FIGS. 22 and 24. If power supply voltage Vcc supplied to current source 110 reaches a predetermined level at time point t1 after power is turned on, signal WE stays at L level without a data write instruction from outside even if external clock Ext.CLK is inputted, that is, if external write signal Ext.WE is at L level. Therefore, there occurs no generation of write current Iw flowing out from current source 110 because of no rise in voltage level of current source wires LE1 and L1.

In non-volatile memory device 1500 according to the fifth embodiment, as described above, since current source wires LE1 and L1 are normally precharged at ground voltage GND, no charging of parasitic capacitances C1 and C2 occurs till generation of a write current. Therefore, an excessively large current is prevented from flowing into write digit line WDL selected by row decoder 50 in memory array mat 100; thereby enabling prevention of erroneous data writing when ordinary data writing is performed and when power is turned on as well.

First Modification of Fifth Embodiment

Non-volatile memory device 1500 according to the fifth embodiment is configured so that current source wires LE1 and L1 are normally precharged at ground voltage GND and when data is written, voltage levels of current source wires LE1 and L1 are raised to thereby prevent erroneous data writing. In the configuration of non-volatile memory device 1500, however, if voltage levels of current source wires LE1 and L1 are normally precharged at ground voltage GND, a voltage level of current source wire L1 takes time to be raised to a voltage at which a sufficient write current is supplied, which causes a long time required for data writing to a selected memory cell. Therefore, description will be given of a configuration below in which not only is an excessively large current generated in write digit line WDL prevented from occurring, but a time required for data writing to a selected memory cell is also shorter. To be concrete, current source wires LE1 and L1 are precharged not at ground voltage GND but at an intermediate voltage.

Figure 25:
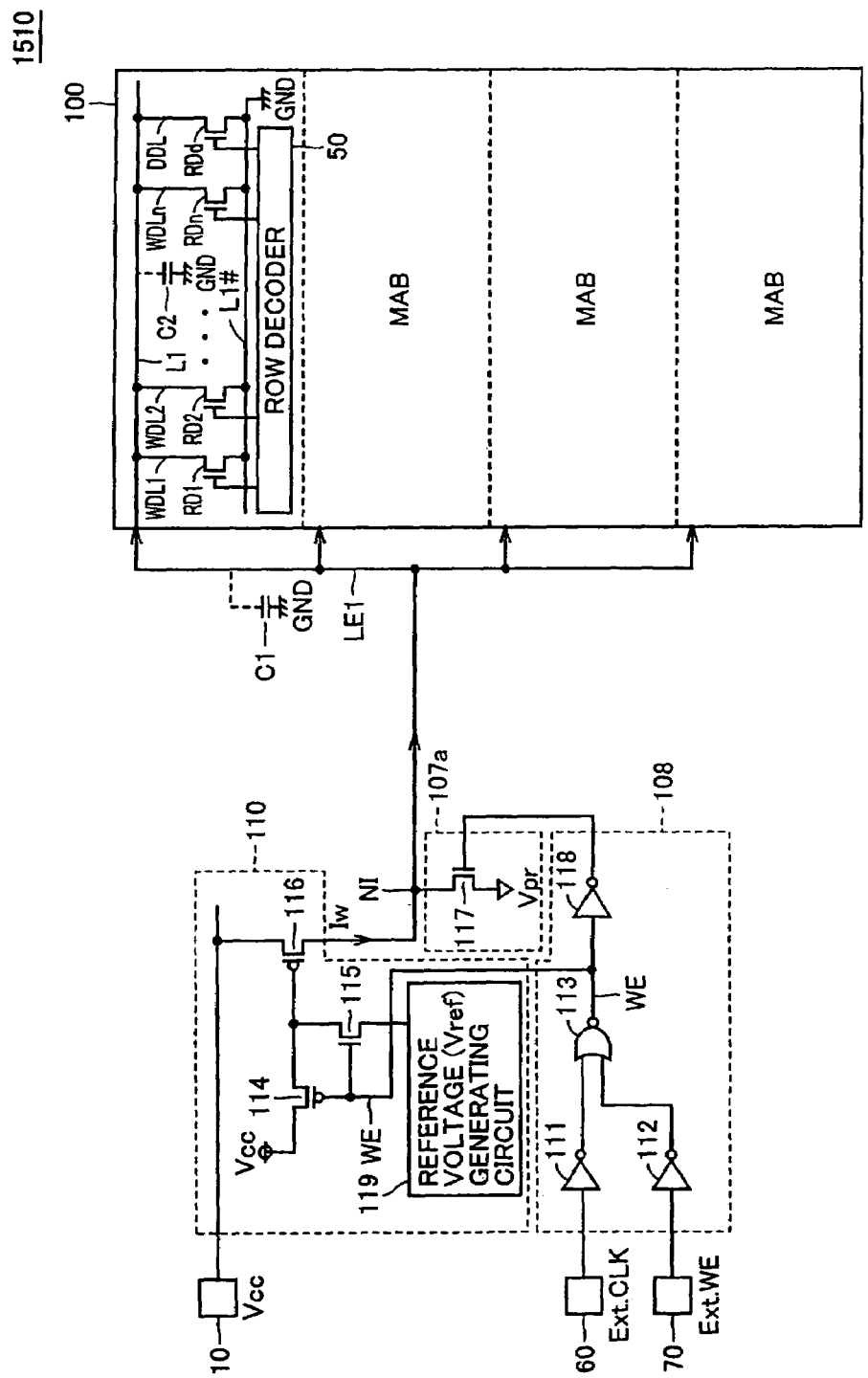
FIG. 25 is a schematic diagram showing a configuration of a non-volatile memory device according to a first modification of the fifth embodiment.

Referring to FIG. 25, a non-volatile memory device 1510 is different from non-volatile memory device 1500 according to the fifth embodiment shown in FIG. 22 by comparison in an aspect that a voltage setting circuit 107a is provided instead of voltage setting circuit 107.

Voltage setting circuit 107a supplies intermediate voltage Vpr to the source of N-channel MOS transistor 117 instead of ground voltage GND being connected to the source thereof, compared with the case where voltage setting circuit 107 is used. Since the other constituents in the configuration are similar to corresponding constituents in the configuration of non-volatile memory device 1500, none of detailed descriptions thereof will be repeated.

Intermediate voltage Vpr is set to a voltage equal to or lower than Vw, which is a voltage level at which internal current source wire L1 causes a sufficient write current to flow into desired write digit line WDL. Note that power supply voltage Vcc is equal to voltage Vw in this embodiment.

Therefore, in non-volatile memory device 1510, voltages on current source wires LE1 and L1 are always precharged at intermediate voltage Vpr during a period in which signal WE is at L level. On the other hand, when signal WE is set to H level, voltage levels on current source wires LE1 and L1 are set to voltage Vw.

Figure 26:
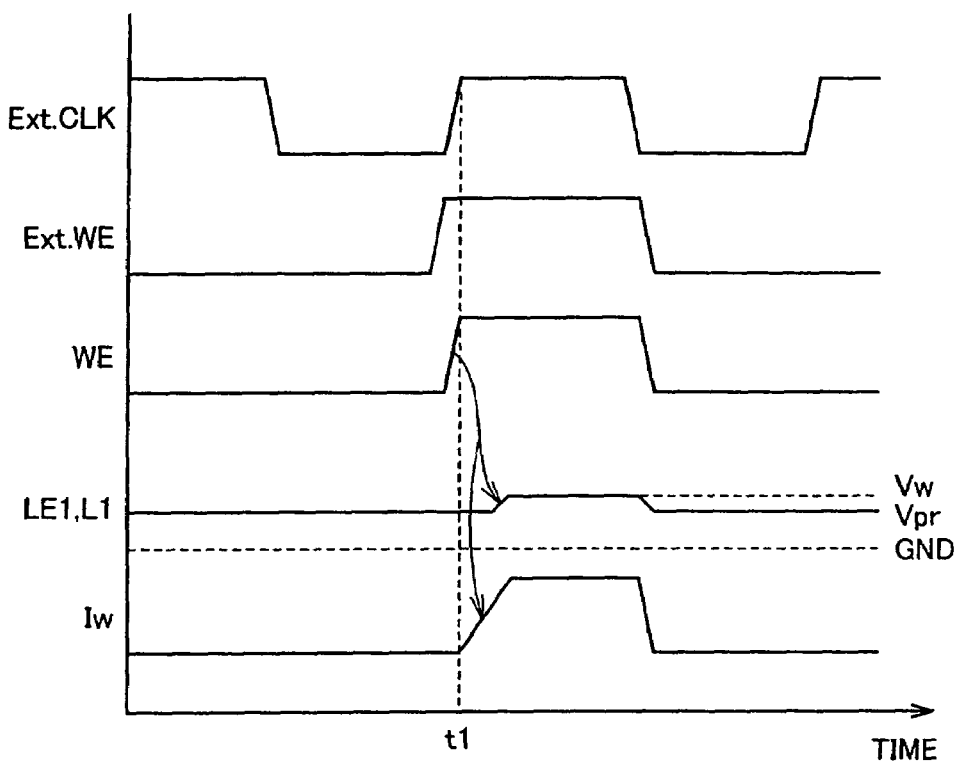
FIG. 26 is an operating waveform diagram describing operations in generation of a write current of a non-volatile memory device according to the first modification of the fifth embodiment.

FIG. 26 is an operating waveform diagram describing operations in generation of a write current in non-volatile memory device 1510 according to the first modification of the fifth embodiment. In FIG. 26, LE1 and L1 show a change in voltage level of current source wires LE1 and L1. Iw shows a change in write current flowing out from current source 110.

Then, description will be given of operations in generation of a write current in non-volatile memory device 1510 using FIGS. 25 and 26. Current source wires LE1 and L1 are in a precharged state at voltage Vpr during a period in which at least one of external clock Ext.CLK and external write signal Ext.WE is at L level. Signal WE takes H level at time point t1 when external clock Ext.CLK and external write signal Ext.WE take H level. In company with this, write current Iw flowing out from current source 110 also increases and voltage levels of current source wires LE1 and L1 rise from intermediate voltage Vpr to voltage equal to or higher than a voltage Vw at which a sufficient write current can be supplied.

While with the operations described above applied, currents generated from parasitic capacitances C1 and C2 precharged at intermediate voltage Vpr occur in current source wires LE1 and L1 when data is written, an amount of the currents is about a half of the amount when precharging is performed at power supply voltage Vcc, so that an excessively large current can be prevented from flowing into write digit line WDL. Furthermore, current source wire L1 is precharged at intermediate voltage Vpr and a voltage level of current source wire L1 can thereby reach a desired voltage faster than when precharging is performed at ground voltage GND, thereby enabling a time required for data writing to a selected memory cell to be shorter.

Second Modification of Fifth Embodiment

Then, description will be given below of a configuration in which current source wire L1 is precharged at intermediate voltage Vpr using dummy digit line DDL, which is not used when data is written.

Figure 27:
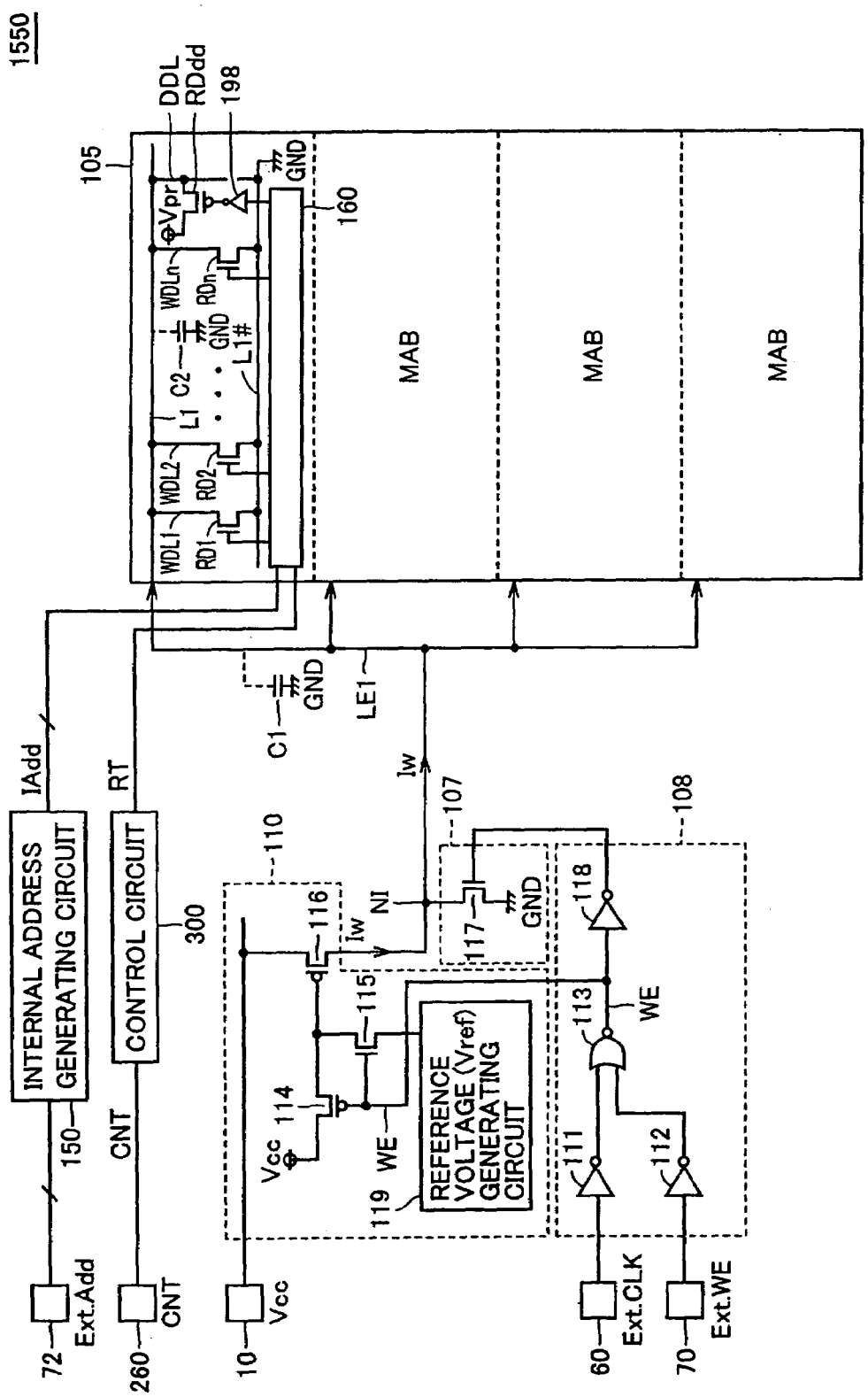
FIG. 27 is a schematic diagram showing a configuration of a non-volatile memory device according to a second modification of the fifth embodiment.

Referring to FIG. 27, non-volatile memory device 1550 is different from non-volatile memory device 1500 according to the fifth embodiment shown in FIG. 22 by comparison in an aspect that further provided are an address terminal 72, an internal address generating circuit 150, a control terminal 260 and a control circuit 300.

Non-volatile memory device 1550 is further different from non-volatile memory device 1500 by comparison in an aspect that a memory array mat 105 is provided instead of memory array mat 100.

Memory array mat 105 is different from memory array mat 100 shown in FIG. 22 by comparison in aspects that a P-channel MOS transistor RDdd is provided between dummy digit line DDL and power supply voltage Vpr supplying intermediate voltage Vpr, that an address decode control circuit 160 is included instead of row decoder 50, that an inverter 198 is further included and that no dummy row decode transistor RDd is included.

Power supply voltage Vpr is set to a voltage equal to or lower than Vw, at which current source wire L1 can cause a sufficient write current to flow into desired write digit line WDL. Dummy digit line DDL and current source wire L1# are electrically disconnected from each other. Since the other constituents in the configuration are similar to corresponding constituents in the configuration of non-volatile memory device 1510, none of detailed descriptions thereof will be repeated.

Inverter 198 inputs a signal at an inverted level of a control signal from address decode control circuit 160 to the gate of P-channel MOS transistor RDdd. That is, P-channel MOS transistor RDdd is turned on by a signal at H level from address decode control circuit 160. When P-channel MOS transistor RDdd is turned on, current source wire L1 connected electrically to power supply voltage Vpr is precharged to intermediate voltage Vpr. When a signal at L level is inputted to inverter 198, P-channel MOS transistor RDdd is turned off.

An external address Ext.Add is inputted to address terminal 72. Internal address generating circuit 150 receives external address signal Ext.Add from address terminal 72 to convert it to an internal row address signal IAdd and to output the latter signal to address decode control circuit 160. A control signal CNT is inputted to control terminal 260. Control circuit 300 receives control signal CNT to output a control signal RT to address decode control circuit 160.

Figure 28:
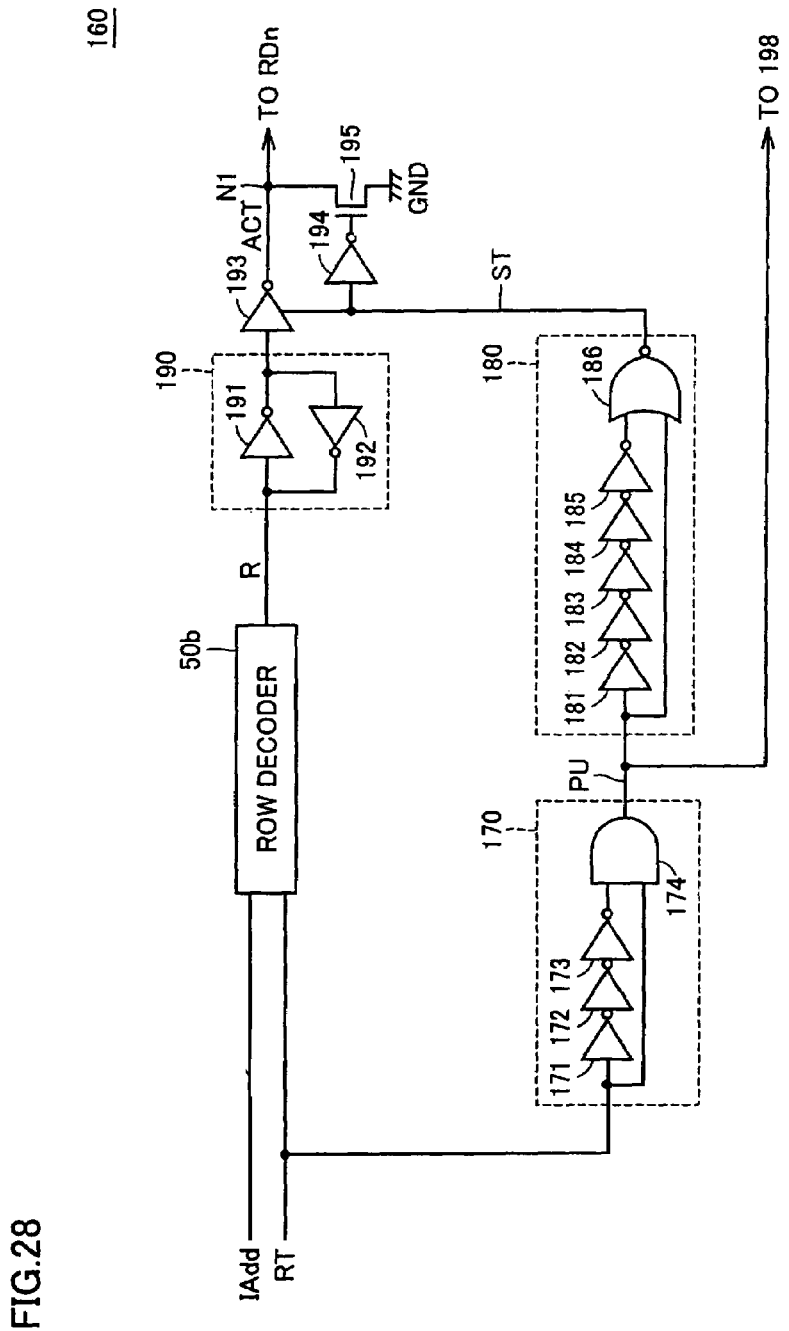
FIG. 28 is circuit diagram showing a configuration of the interior of an address decode control circuit.

Referring to FIG. 28, address decode circuit 160 includes a row decoder 50b, a latch circuit 190, a tri-state buffer 193, a one-shot pulse generating circuit 170, a fall detecting circuit 180, an inverter 194, and an N-channel MOS transistor 195. Latch circuit 190 has inverters 191 and 192 therein. Latch circuit 190 holds an inputted signal temporarily to output a signal at an inverted level of the inputted signal. N-channel MOS transistor 195 is provided between node N1 and ground voltage GND.

Control signal RT is inputted to row decoder 50b and one-shot pulse generating circuit 170. Internal address signal IAdd is inputted to row decoder 50b.

Row decoder 50b is activated when control signal RT at H level is inputted thereto. Furthermore, row decoder 50b, when internal row address signal IAdd is inputted thereto, outputs a signal R for activating desired row decode transistor RDn. Signal R is held temporarily at a data level in latch circuit 190.

One-shot pulse generating circuit 170 includes inverters 171, 172 and 173 in odd-number (as an example, three inverters) connected in series to each other, and an AND circuit 174. Control signal RT is inputted to inverter 171. An output signal of inverter 173 and signal RT are inputted to AND circuit 174 to output a one-shot pulse signal PU obtained by performing an operation of a logical product thereon to inverter 198 and fall detecting circuit 180. In one-shot pulse generating circuit 170', a time during which one-shot pulse signal PU is held at H level, which is an output signal, is determined by the number of inverters connected in series with each other and characteristics thereof. That is, with an increased number of inverters, a longer period is obtained during which one-shot pulse signal PU is held at H level.

Fall detecting circuit 180 has inverters 181, 182, 183, 184 and 185 in odd-number (as an example, five inverters) connected in series to each other, and NOR circuit 186 therein. One-shot pulse signal PU is inputted to inverter 181. An output signal of inverter 185 and one-shot pulse signal PU are inputted to NOR circuit 186 to output signal ST obtained by performing an NOR operation thereon. In fall detecting circuit 180, a time in which an output signal thereof is held at H level is determined by the number of inverters connected in series to each other and characteristics thereof. That is, with an increased number of inverters, a longer period is obtained during which output signal ST is held at H level.

Tri-state buffer 193, when signal ST at H level is inputted to the control terminal thereof, outputs a signal at an inverted level of data outputted from latch circuit 190 as signal ACT to desired row decode transistor RDn through node N1. Inverter 194 outputs a signal at an inverted level of signal ST to the gate of an N-channel MOS transistor 195.

Figure 29:
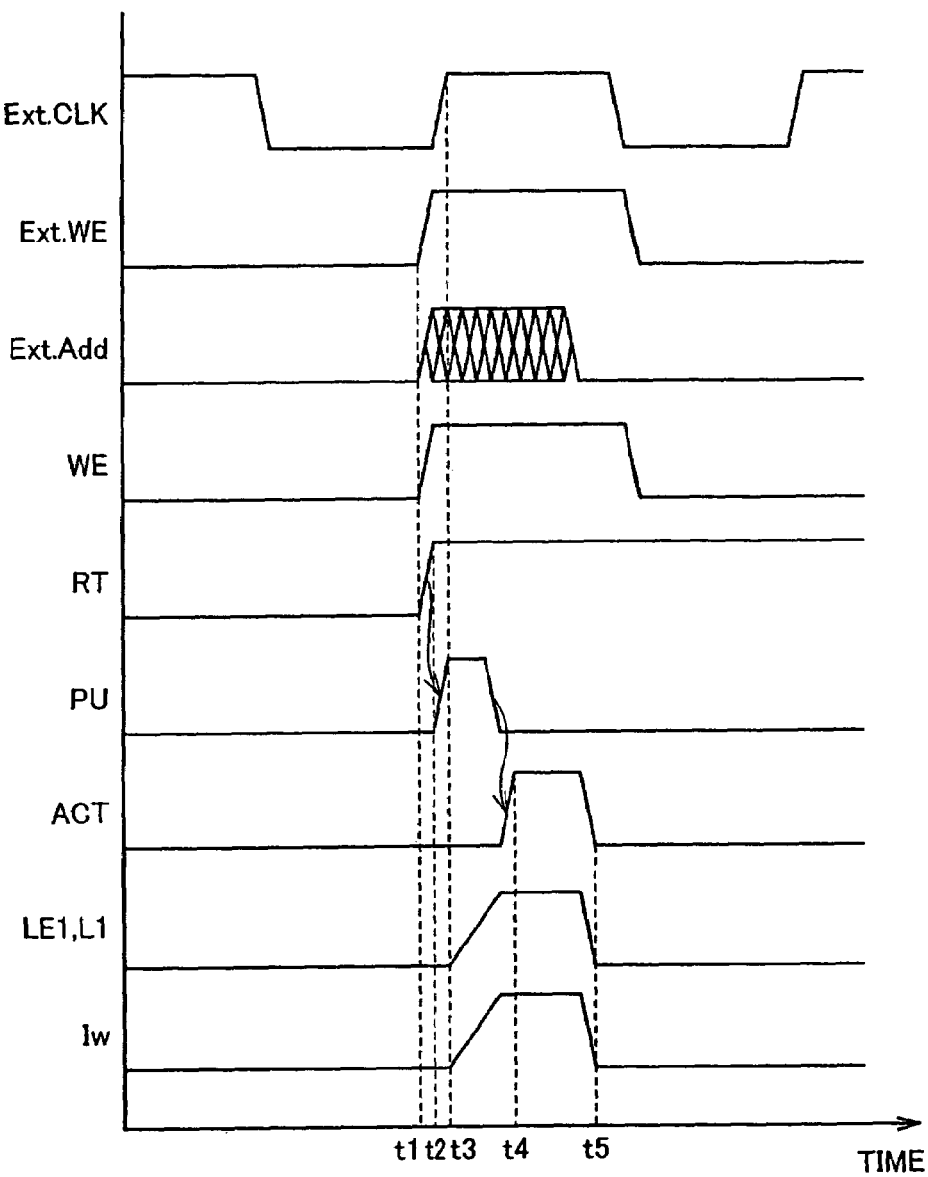
FIG. 29 is an operating waveform diagram showing operations in generation of a write current in a non-volatile memory device according to the second modification of the fifth embodiment.

FIG. 29 is an operating waveform diagram showing operations in generation of a write current in non-volatile memory device 1550 according to the second modification of the fifth embodiment. In FIG. 29, LE1 and L1 show a change in voltage level of current source wires LE1 and L1. Iw shows a change in write current flowing out from current source 110.

Then, description will be given of operations in generation of a write current in non-volatile memory device 1550 using FIGS. 27, 28 and 29. Current source wires LE1 and L1 are precharged at ground voltage GND during a period in which at least one of external clock Ext.CLK and external write signal Ext.WE is at L level. External address Ext.Add is inputted to address terminal 72 at time point t1 when a data write operation is started. External address Ext.Add is converted to internal row address signal LAdd by internal address generating circuit 150. Simultaneously, control signal CNT is inputted to control circuit 300 from control terminal 260 and signal RT at L level starts to rise to H level.

Simultaneously, internal row address signal IAdd is inputted to row decoder 50b in address decode control circuit 160. Row decoder 50b requires a time till it outputs signal R at H level for activating desired row decode transistor RDn. If signal RT takes H level at a time point t2 in a period till signal R at H level is outputted from row decoder 50b, one-shot pulse signal PU is outputted from one-shot pulse generating circuit 170.

Thereafter, signal WE takes H level: at a time point t3 when external clock Ext.CLK and external write signal WE both take H level. In company with this, voltage levels on current source wires LE1 and L1 start to rise to power supply voltage Vcc from ground voltage GND. Furthermore, write current Iw flowing out from current source 110 also starts to increase.

One-shot pulse signal PU at H level is inputted to inverter 198 and P-channel MOS transistor RDdd is in the on state during a period in which one-shot pulse signal PU is at H level and current source wire L1 connected electrically to power supply voltage Vpr is precharged to intermediate voltage Vpr. Thereafter, signal R at H level is outputted from row decoder 50b in address decode control circuit 160. Signal R at H level is converted to a signal at L level in latch circuit 190 and held temporarily there.

Fall detecting circuit 180, when detecting a fall of one-shot pulse signal PU, outputs signal ST at H level. When one-shot pulse signal PU takes L level, precharging of current source wire L1 at intermediate voltage Vpr is canceled. Tri-state buffer 193, when signal ST at H level is inputted to the control terminal thereof, outputs signal R at L level held in latch circuit 190 as signal ACT at H level at time point t4 to the gate of desired row decode transistor RDn to turn on it. Thereafter, when signal ST takes L level, N-channel MOS transistor 195 is turned on to cause a voltage at node N1 to be at L level. Simultaneously, signal ST at L level is also inputted to the control terminal of tri-state buffer 193; therefore, signal ACT takes L level at a time point t5 to cause row decode transistor RDn to be turned off.

A voltage on current source wire L1 has reached a voltage capable of causing a sufficient write current to flow into write digit line WDL at a time point t4 when row decode transistor RDn is turned on, thereby enabling a stable write current to flow into write digit line WDL corresponding to row decode transistor RDn.

In non-volatile memory device 1550 according to the second modification of the fifth embodiment, as described above, current source wire L1 is precharged to an intermediate voltage using dummy digit line DDL in a period during which an address signal is decoded to effectively use the period during which the address signal is decoded, thereby enabling supply of stable write current into desired write digit line WDL.

Third Modification of Fifth Embodiment

While in the fifth embodiment, the configuration has been shown in which a current is caused to flow from a current source to a memory array mat, a configuration will be shown below in which a current is caused to flow from a memory array mat to a current source. Note that the following configuration can also be applied in a similar way when ordinary data writing is performed and when power is turned on.

Then, there is shown in detail part of non-volatile memory device 1000a described above for comparison with a non-volatile memory device according to this embodiment and description will be given of a problem thereof.

Figure 30:
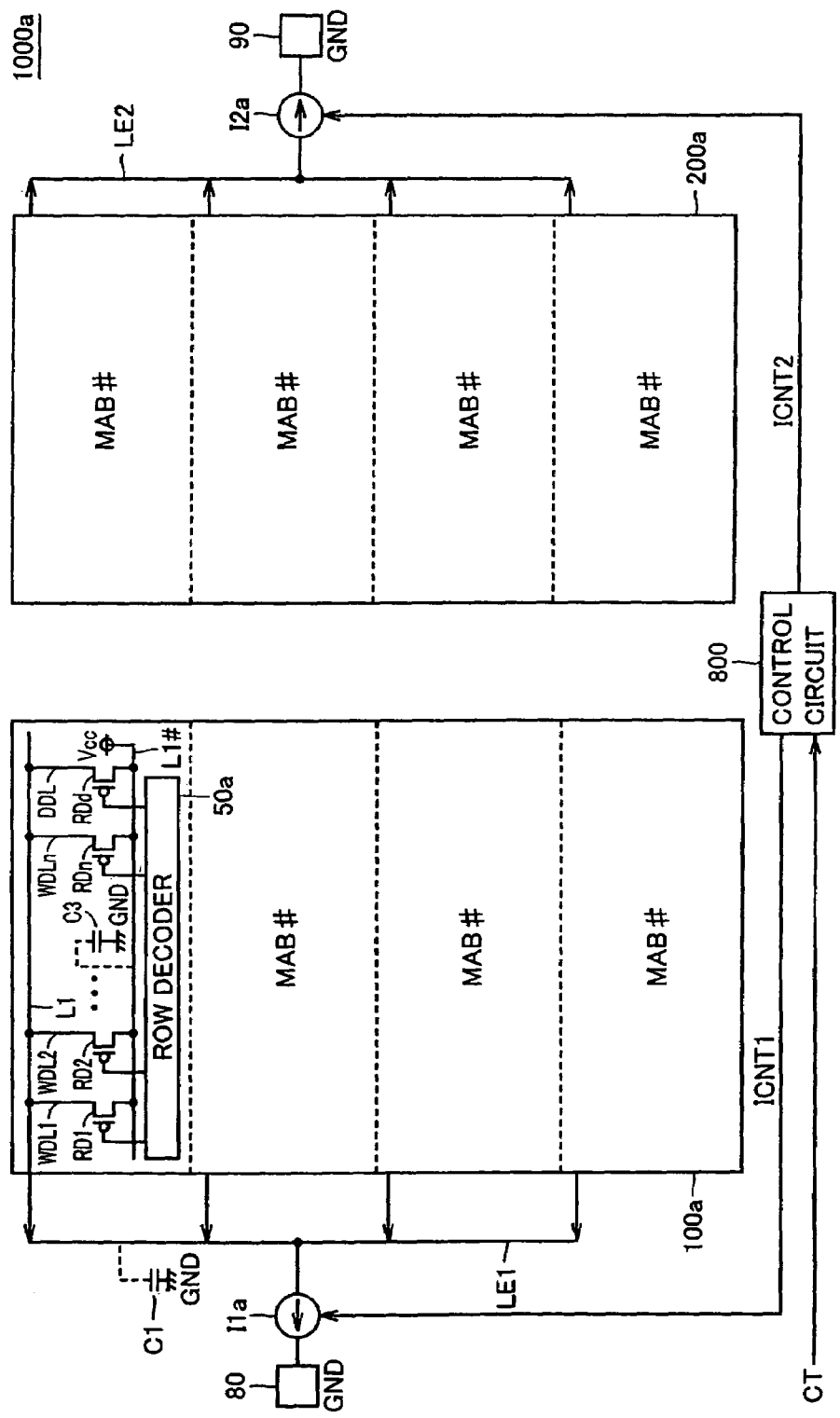
FIG. 30 is a diagram showing details of one of memory array blocks in a memory array mat of a non-volatile memory device according to the third embodiment.

In FIG. 30, for description shown is a configuration of memory array 505a in one of memory array blocks MAB# of non-volatile memory device 1000a.

Parasitic capacitances C1 and C3 are generated on respective current source wires LE1 and L1#. Since current source wire L1# is generally longer than current source wire LE1, parasitic capacitance C3 is larger than parasitic capacitance C1.

In the configuration of non-volatile memory device 1000a shown in FIG. 30, if current source wires LE1 and L1 are precharged at ground voltage GND before activation of row decoder 50a, a current generated from parasitic capacitance C3 occurring on current source wire L1# is superimposed on a write current flowing in selected write word line WDL after activation of row decoder 50a. Therefore, an excessively large current larger than an ordinary write current is generated in write word line WDL and a possibility arises that erroneous data writing is performed on a non-selected memory cell arranged in the vicinity of selected write word line WDL. In order to solve the above problem, current source wires LE1 and L1 are precharged at power supply voltage Vcc, differing from the case where current source wires LE1 and L1 are precharged at ground voltage GND, thereby preventing generation of an excessively large current.

Figure 31:
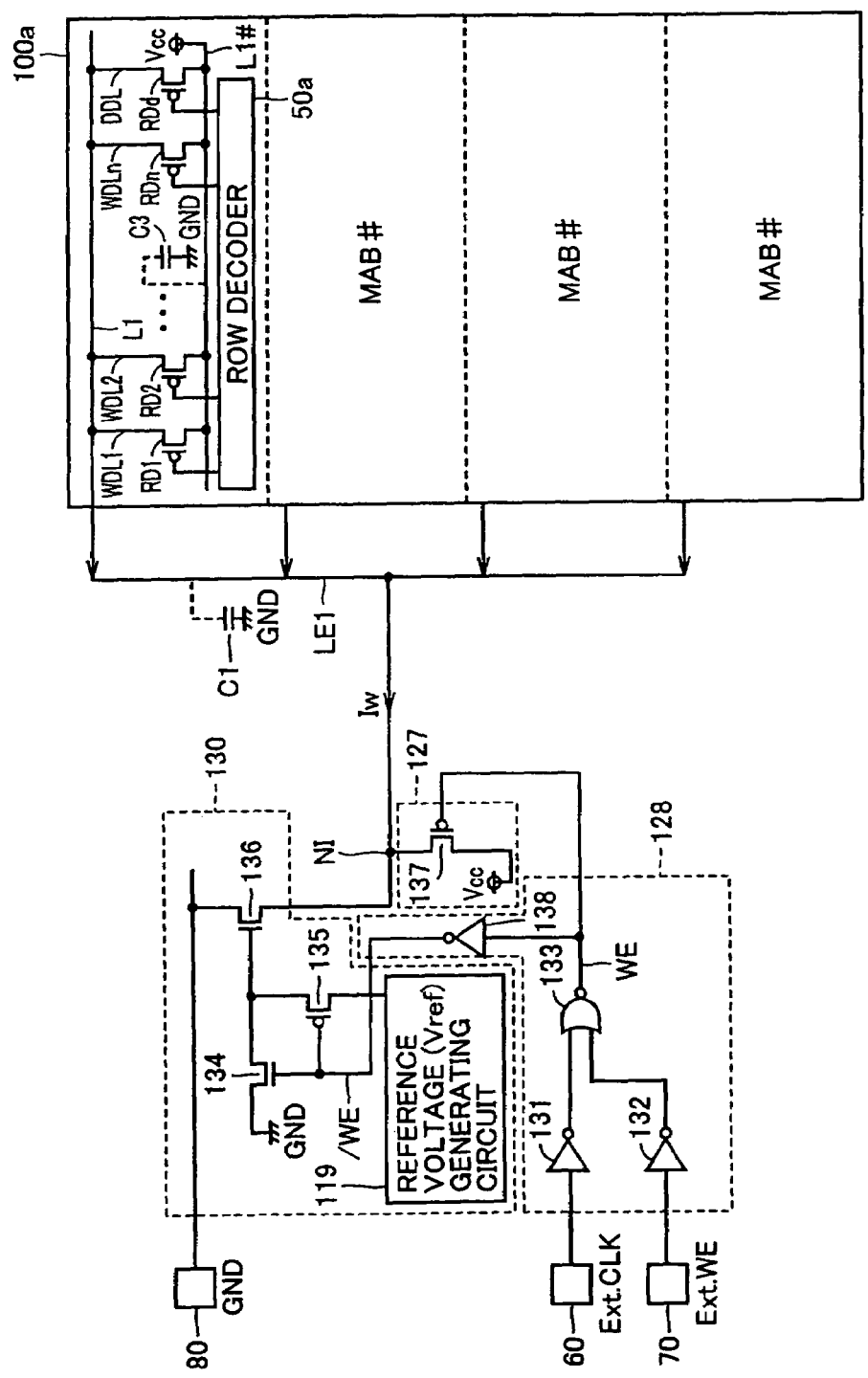
FIGS. 31 to 33 are schematic diagrams showing configurations of non-volatile memory devices according to third to fifth modifications of the fifth embodiment, respectively.

Referring to FIG. 31, non-volatile memory device 1500a is different from non-volatile memory device 1500 shown in FIG. 22 by comparison in aspects that a memory array mat 100a is provided instead of memory array mat 100 and that a power supply terminal 80 is provided instead of power supply terminal 10.

Non-volatile memory device 1500a is further different from non-volatile memory device 1500 by comparison in an aspect that voltage setting circuit 127, control circuit 128 and current source 130 are provided instead of voltage setting circuit 107, control circuit 108 and current source 110, respectively. Since the other constituents in the configuration are similar to corresponding constituents in the configuration of non-volatile memory device 1500, none of detailed descriptions thereof will be repeated.

Power supply terminal 80 is connected to ground voltage GND. Power supply terminal 80 receives a current from current source 130.

Control circuit 128 includes inverters 131, 132 and 138, and a NOR circuit 133. Inverter 131 outputs a signal at an inverted level of external dock Ext.CLK inputted thereto from clock terminal 60. Inverter 132 outputs a signal at an inverted level of external write signal Ext.WE inputted thereto from control terminal 70. NOR circuit 133 outputs signal WE obtained by performing a NOR operation on output signals of inverters 131 and 132. That is, when output signals of inverters 131 and 132 are both at L level, signal WE is set to H level. Inverter 138 outputs signal /WE at an inverted level of signal WE.

Voltage setting circuit 127 includes a P-channel MOS transistor-137 provided between power supply voltage Vcc and node NI. Signal WE is inputted to the gate of P-channel MOS transistor 137.

Current source 130 includes N-channel MOS transistors 134 and 136, a P-channel MOS transistor 135, and a reference voltage generating circuit 119.

N-channel MOS transistor 136 is provided between power supply terminal 80 and node NI. The drain and source of N-channel MOS transistor 134 are connected to the gate of N-channel MOS transistor 136 and ground voltage GND, respectively. The drain and source of P-channel MOS transistor 135 are connected to a connection node between the drain of N-channel MOS transistor 134 and the gate of N-channel MOS transistor 136, and reference voltage generating circuit 119, respectively. Signal /WE is inputted to the gates of N-channel MOS transistor 134 and P-channel MOS transistor 135.

Reference voltage generating circuit 119 generates voltage Vref so that a write current flowing in write digit line WDL in memory array mat 100a becomes optimal. Vref is generally set at an intermediate level between power supply voltage Vcc and ground voltage GND.

In a period in which signal WE is at L level, P-channel MOS transistor 137 is turned on, while N-channel MOS transistor 136 is not turned on. Therefore, in a period in which signal WE is at L level, voltages on current source wires LE1 and L1 are precharged to power supply voltage Vcc at all times by an operation of voltage setting circuit 127.

On the other hand, when signal WE is set to H level, P-channel MOS transistor 137 is turned off, while P-channel MOS transistor 135 is turned on. Accordingly, voltage Vref is applied to the gate of N-channel MOS transistor 136, therefore, N-channel MOS transistor 136 is turned on. As a result, voltage levels of current source wires LE1 and L1 are set to ground Voltage GND.

Then, description will be given of operations in generation of a write current in non-volatile memory device 1500a. Current source wires LE1 and L1 are in a precharged state at power supply voltage Vcc during a period in which at least one of external clock Ext.CLK and external write signal Ext.WE is at L level. When external clock Ext.CLK and external write signal Ext.WE both take H level, signal WE is set to H level. In company with this, voltage levels of current source wires LE1 and L1 transition from power supply voltage Vcc to ground voltage GND. An amount of current Iw flowing from memory array mat 100a to current source 130 increases at the same time that voltage levels of current source wires LE1 and L1 fall.

As described above, in current source wires LE1 and L1, when current Iw starts to occur by application of the above operations, voltage levels of current source wires L1 and L1# are equal to each other, so an excessively large current is prevented from flowing in write digit line WDL selected by row decoder 50a in memory array mat 100a regardless of parasitic capacitance C3 having been charged; thereby enabling prevention of erroneous data writing.

Fourth Modification of Fifth Embodiment

While non-volatile memory device 1500a according to the third modification of the fifth embodiment is configured so that current source wires LE1 and L1 are precharged at power supply voltage Vcc before data writing is performed, thereby preventing a data write operation from occurring, a time is required till a voltage level of current source wire L1 reaches ground voltage GND in the case where current source wires LE1 and L1 are precharged at power supply voltage Vcc, which makes a timing of data writing to a selected memory cell delayed. Therefore, description will be given of a configuration for preventing not only generation of an excessively large current in write digit line WDL from occurring, but also making it earlier in timing to perform data writing to the selected memory cell. To be concrete, current source wires LE1 and L1 is precharged not to power supply voltage Vcc, but to an intermediate potential.

Figure 32:
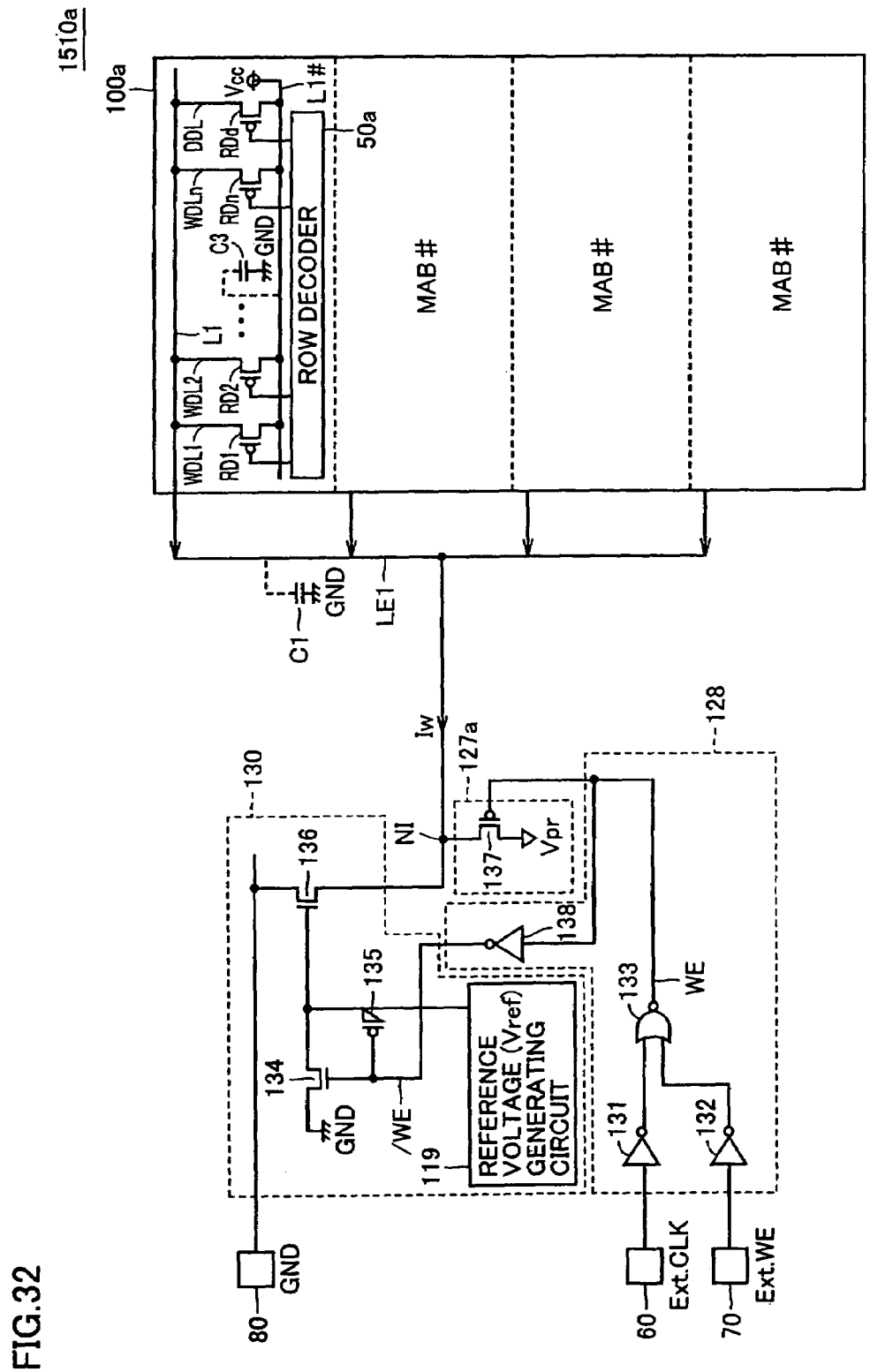

Referring to FIG. 32, a non-volatile memory device 1510a is different from non-volatile memory device 1500a according to the third modification of the fifth embodiment by comparison in an aspect that a voltage setting circuit 127a is provided instead of voltage setting circuit 127.

In voltage setting circuit 127a, in comparison with voltage setting circuit 127, intermediate voltage Vpr is connected to the source of P-channel MOS transistor 137 instead of power supply voltage Vcc. Since the other constituents in the configuration are the same in the configuration in non-volatile memory device 1500, none of detailed descriptions thereof will be repeated.

Intermediate voltage Vpr is set to a voltage equal to or less than Vw, which is a voltage level, at which current source wire L1# can cause a sufficient write current to flow into desired write digit line WDL. Note that in this embodiment, power supply voltage Vcc is equal to voltage Vw.

Therefore, in non-volatile memory device 1510a, voltages on current source wires LE1 and L1 are in a precharged state at intermediate voltage Vpr during a period in which signal WE is at L level. On the other hand, when signal WE is set to H level, voltage levels of current source wires LE1 and L1 are set to ground Voltage GND.

Then, description will be given of operations in generation of a write current in non-volatile memory device 1510a. Current source wires LE1 and L1 are in a precharged state at intermediate voltage Vpr during a period in which at least one of external dock Ext.CLK and external write signal Ext.WE is at L level. Signal WE is set to H level when external clock Ext.CLK and external write signal Ext.WE both take H level. In company with this, voltage levels of current source wires LE1 and L1 transit from intermediate voltage Vpr to ground voltage GND. An amount of current Iw flowing from memory array mat 100a to current source 130 also increases at the same time that voltage levels of current source wires LE1 and L1 fall.

If current source wire L1 is precharged at intermediate voltage Vpr by application of the above operations before data writing is performed, a current is generated by an electric charge of parasitic capacitance C3 under a potential difference between current source wires L1 and L1#, when data writing is performed, but the current generated from parasitic capacitance C3 is less than in a case where current source wire L1 is precharged at ground voltage GND.

Therefore, an excessively large current flowing into write digit line WDL can be prevented from occurring at a higher level than in a case where current source wire L1 is precharged at ground voltage GND. Furthermore, a voltage on current source wire L1 can reach ground voltage faster and a timing of data writing to a selected memory cell can be earlier by precharging current source wire L1 at intermediate voltage Vpr than in a case where current source wire L1 is precharged at power supply voltage Vcc.

Fifth Modification of Fifth Embodiment

Then, description will be given below of a configuration in which current source wire L1 is precharged at intermediate potential using dummy digit line DDL.

Figure 33:
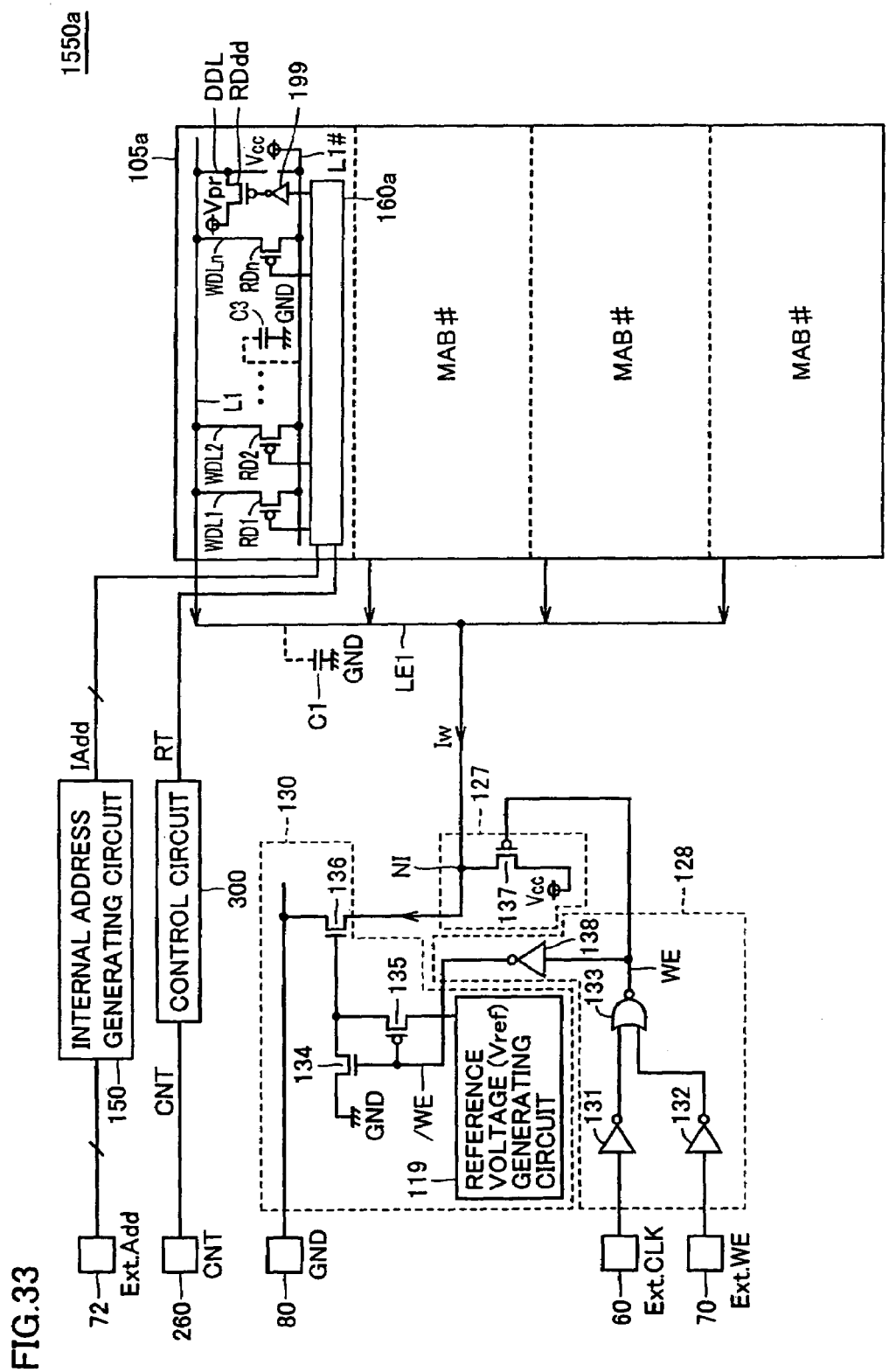

Referring to FIG. 33, a non-volatile memory device 1550a is different from non-volatile memory device 1500a according to the third modification of the fifth embodiment shown in FIG. 31 by comparison in an aspect that further provided are an address terminal 72, an internal address generating circuit 150, a control terminal 260 and a control circuit 300.

Non-volatile memory device 1550a is further different from non-volatile memory device 1500a by comparison in an aspect that a memory array mat 105a is provided instead of memory array mat 100a.

Memory array mat 105a is different from memory array mat-100a shown in FIG. 31 by comparison in aspects that a P-channel MOS transistor RDdd is provided between dummy digit line DDL and power supply voltage Vpr supplying intermediate voltage Vpr, that an address decode control circuit 160a is included instead of row decoder 50a, that an inverter 199 is further provided, and that no dummy row decode transistor RDd is included. In this configuration, a P-channel MOS transistor is used as each of row decode transistor RD.

Power supply voltage Vpr is set to a voltage equal to or less than Vw, which is a voltage level, at which current source wire L1# can cause a sufficient write current to flow into desired write digit line WDL. Dummy digit line DDL is disconnected electrically from current source wire L1#. Since the other constituents in the configuration are similar to corresponding constituents in the configuration of non-volatile memory device 1510a, none of detailed descriptions thereof will be repeated.

Address decode control circuit 160a is different from address decode control circuit 160 by comparison in an aspect that an output signal of one-shot pulse generating circuit 170 is transmitted to inverter 199 instead of inverter 198. The other constituents in the configuration and functions of the circuit are similar to corresponding constituents in the configuration and the functions of address decode control circuit 160.

Since operations in internal address generating circuit 150, control circuit 300 and address decode control circuit 160a, in the case where current source wire L1 is precharged to an intermediate potential using dummy digit line DDL, are similar to the operations in non-volatile memory device 1550 according to the second modification of the fifth embodiment, none of description thereof will be repeated.

In the non-volatile memory device 1550a according to the fifth modification of the fifth embodiment, therefore, there can also be obtained an effect similar to the effect of non-volatile memory device 1550 according the second modification of the fifth embodiment.

Sixth Embodiment

Referring again to FIG. 21, parasitic capacitances C1 and C2 occur on current source wires LE1 and L1 as described above in the configuration of non-volatile memory device 1000 according to the first embodiment.

Moreover, in non-volatile memory device 1000, a voltage supplied to a current source for generating a write current is higher than a voltage used in the interior of a memory array mat. For this reason, if non-volatile memory device 1000 enters a write state by mistake, before row decoder 50 is activated when power is turned on, that is, when a possibility exists that write digit line WDL is in a selected state, a possibility arises that a current generated from parasitic capacitance C2 is superimposed on a current from a current source to result in an excessively large current and to perform erroneous data writing on a memory cell arranged in the vicinity of write digit line WDL.

In order to solve the above problem, a configuration can be conceived in which decoupling capacitance for suppressing fluctuations in power supply voltage is provided onto a power supply wire. A high frequency current flowing in a current source wire such as a peak current passes through the decoupling capacitance.

Figure 34:
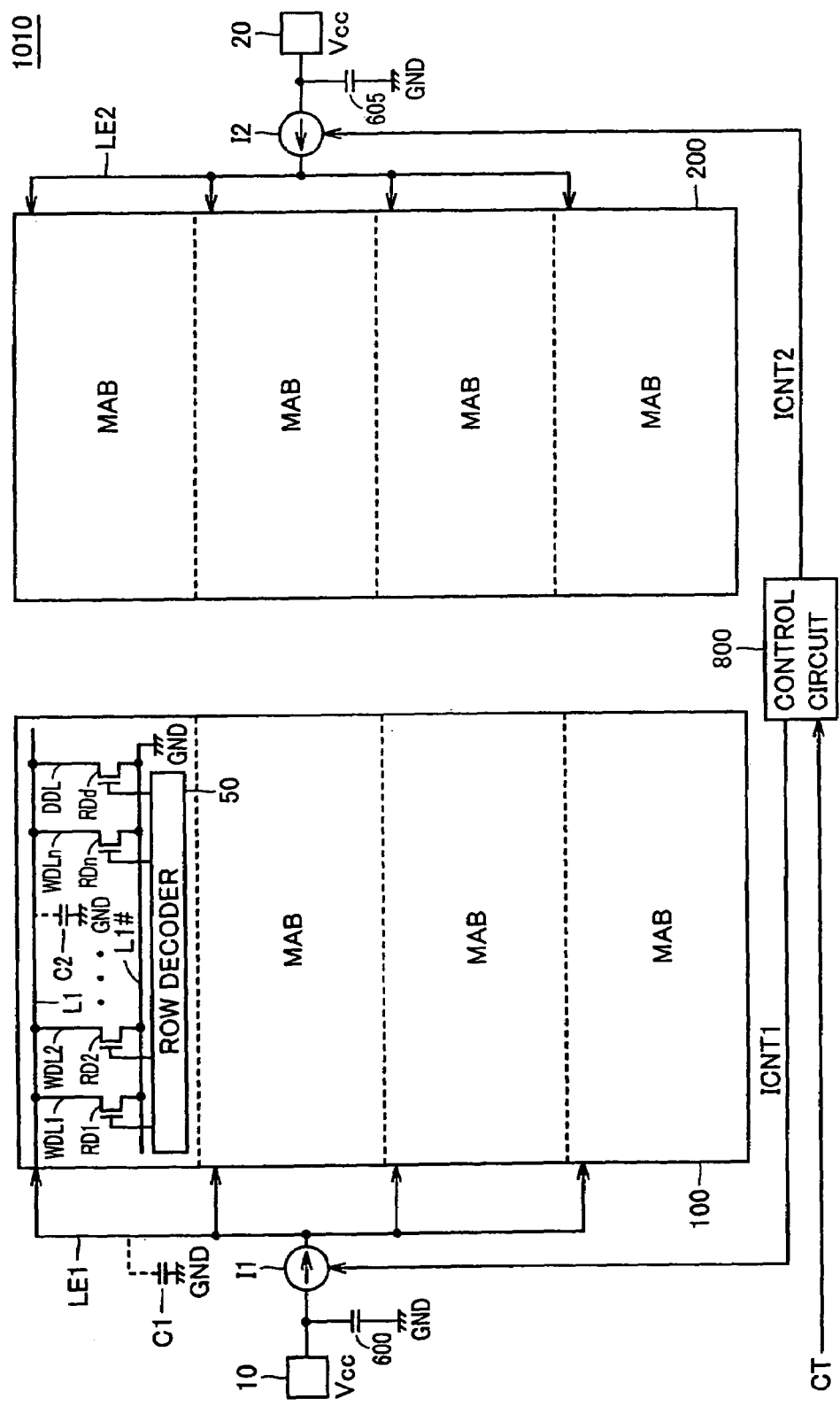
FIG. 34 is a schematic diagram showing a configuration of a non-volatile memory device to which decoupling capacitance is connected according to a sixth embodiment.

Referring to FIG. 34, a non-volatile memory device 1010 is different from non-volatile memory device 1000 shown in FIG. 21 by comparison in an aspect that decoupling capacitances 600 and 605 are further provided. Since the other constituents in the configuration are similar to corresponding constituents in the configuration of non-volatile memory device 1000, none of detailed descriptions thereof will be repeated.

Decoupling capacitance 600 is connected electrically between a connection node between power supply terminal 10 and current source I1, and ground voltage GND. Decoupling capacitance 605 is connected electrically between a connection node between power supply terminal 20 and current source I2, and ground voltage GND. With such a configuration adopted, peak currents generated by consumed currents in current sources I1 and I2 when power is turned on are removed by decoupling capacitances 600 and 605. Therefore, current sources I1 and I2 can supply stable write currents to respective memory array mats 100 and 200.

Therefore, non-volatile memory device 1010 according to the sixth embodiment can remove peak currents when power is turned on, thereby enabling a stable write current to be supplied.

Note that while in this embodiment, the configuration is adopted in which decoupling capacitance is arranged in non-volatile memory device 1000, an effect similar to the effect of non-volatile memory device 1010 can also be obtained in non-volatile memory devices 1100 and 1200 by connecting decoupling capacitance electrically between a connection node between a power supply terminal and a current source, and ground voltage GND in a similar way.

First Modification of Sixth Embodiment

Figure 35:
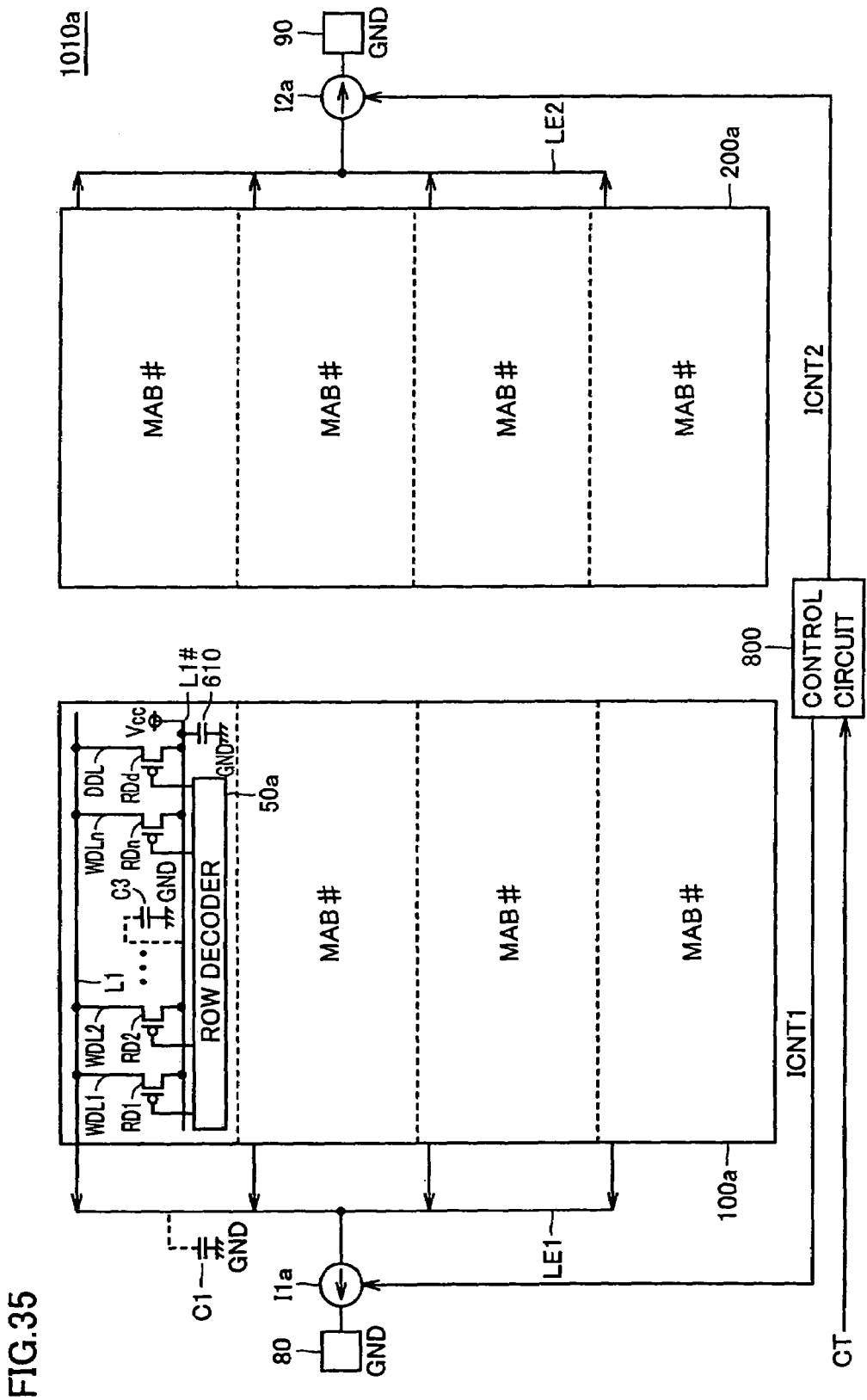
FIGS. 35 to 37 are schematic diagrams showing configurations of non-volatile memory devices to each of which decoupling capacitance is connected according to first to third modifications of the sixth embodiment, respectively.

Referring to FIG. 35, a non-volatile memory device 1010a is different from non-volatile memory device 1000a shown in FIG. 30 by comparison in an aspect that one of memory array blocks MAB# in memory array mat 100a further includes a decoupling capacitance 610. Since the other constituents in the configuration are similar to corresponding constituents in the configuration of non-volatile memory device 1000a, none of detailed descriptions thereof will be repeated.

Decoupling capacitance 610 is connected electrically between a connection node between power supply voltage Vcc connected to one end of current source wire L1# in memory array block MAB# and dummy row decode transistor RDd, and ground voltage GND. In such a configuration, there can be obtained an effect similar to the effect of non-volatile memory device 1010 according to the sixth embodiment.

Note that even if a configuration in memory array block MAB# is the configuration of memory array 510a shown in FIG. 17, there can also be obtained an effect similar to the effect of non-volatile memory device 1010 according to the sixth embodiment by providing decoupling capacitance between a connection node between power supply voltage Vcc connected to current source wire L1# and dummy row decode transistor RDd, and ground voltage GND; and further providing decoupling capacitance between a connection node between power supply voltage Vcc connected to current source wire L1# and row decode transistor RD1, and ground voltage GND.

Second Modification of Sixth Embodiment

Figure 36:
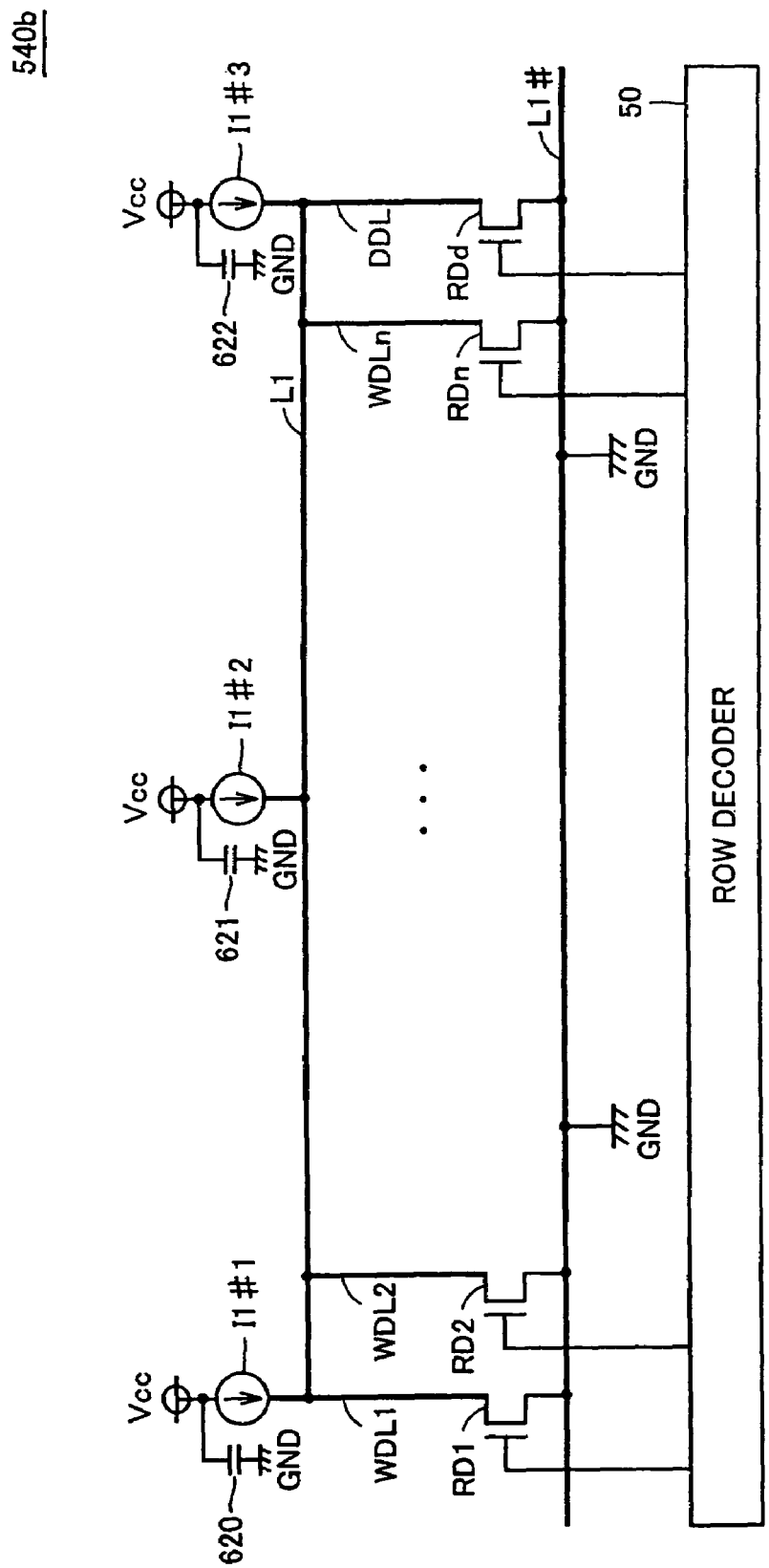

Referring to FIG. 36, a memory array 540b is different from memory array 540 according to the fourth modification of the second embodiment shown in FIG. 11 by comparison in an aspect that decoupling capacitances 620, 621 and 622 are further provided. Since the other constituents in the configuration are similar to corresponding constituents in the configuration of memory array 540, none of detailed descriptions thereof will be repeated.

Decoupling capacitances 620, 621 and 622 are connected electrically between each of connection nodes between power supply voltage Vcc and respective current sources I1#1, I1#2 and I1#3, and ground voltage GND.

Therefore, memory array 540*b* according to the second modification of the sixth embodiment has an advantage that peak currents when power is turned on can be removed; thereby enabling a stable write current to be supplied in addition to the effect exerted by memory array 540 according to the fourth modification of the second embodiment.

Third Modification of Sixth Embodiment

Figure 37:
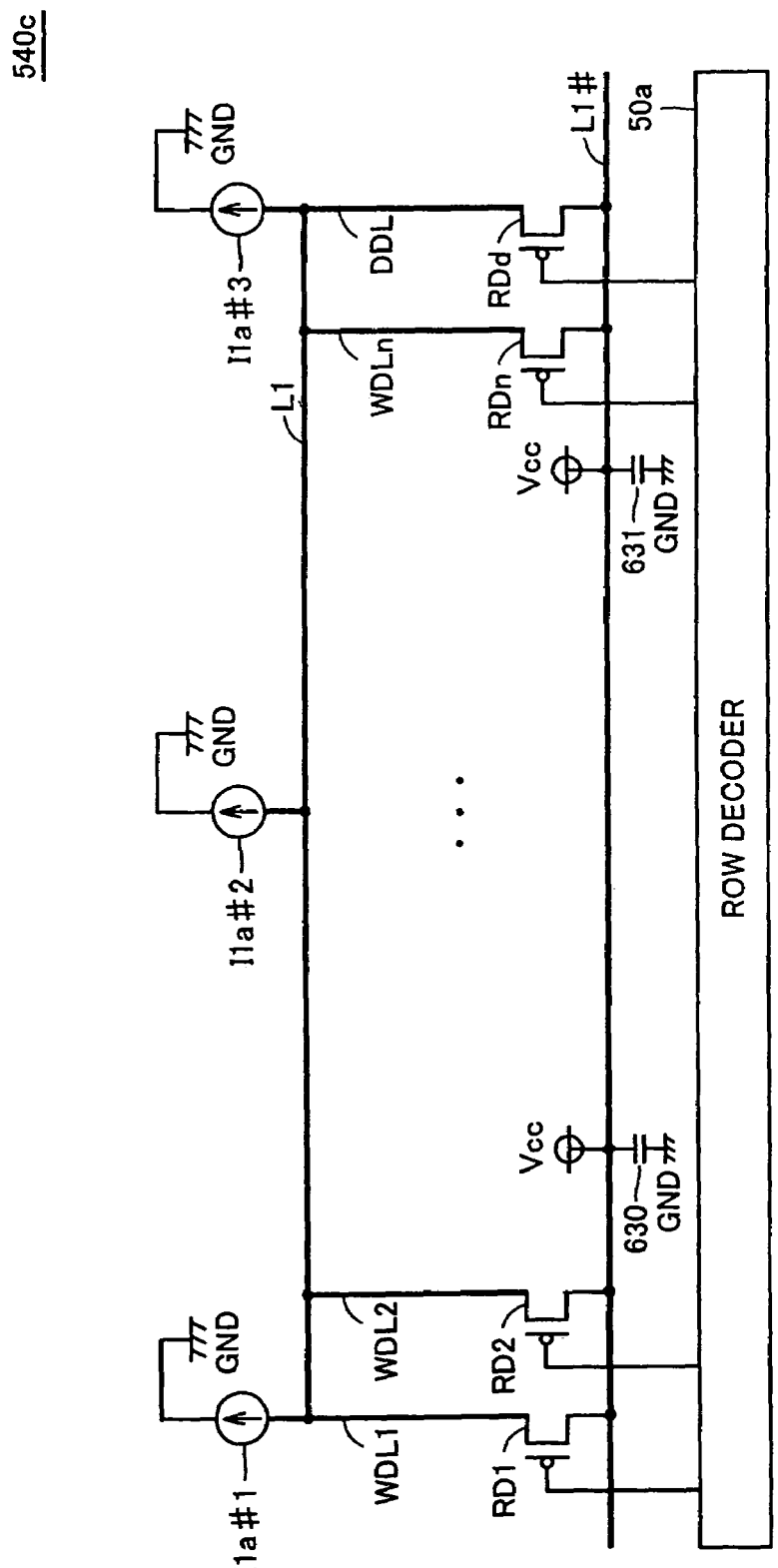

Referring to FIG. 37, a memory array 540*c* is different from memory array 540*a* according to the fourth modification of the fourth embodiment shown in FIG. 20 by comparison in an aspect that decoupling capacitances 630 and 631 are further provided. Since the other constituents in the configuration are similar to corresponding constituents in the configuration of memory array 540*a*, none of detailed descriptions thereof will be repeated.

Decoupling capacitances 630 and 631 are each connected electrically between a connection node between power supply voltage Vcc and current source wire L1#, and ground voltage GND.

Therefore, memory array 540*c* according to the third modification of the sixth embodiment has an advantage that peak currents when power is turned on can be removed; thereby enabling a stable write current to be supplied in addition to the effect exerted by memory array 540*a* according to the fourth modification of the fourth embodiment.

Fourth Modification of Sixth Embodiment

In order to solve the problem described in the sixth embodiment, a configuration is only required in which a current source is activated after activation of a row decoder in a non-volatile memory device.

Figure 38:
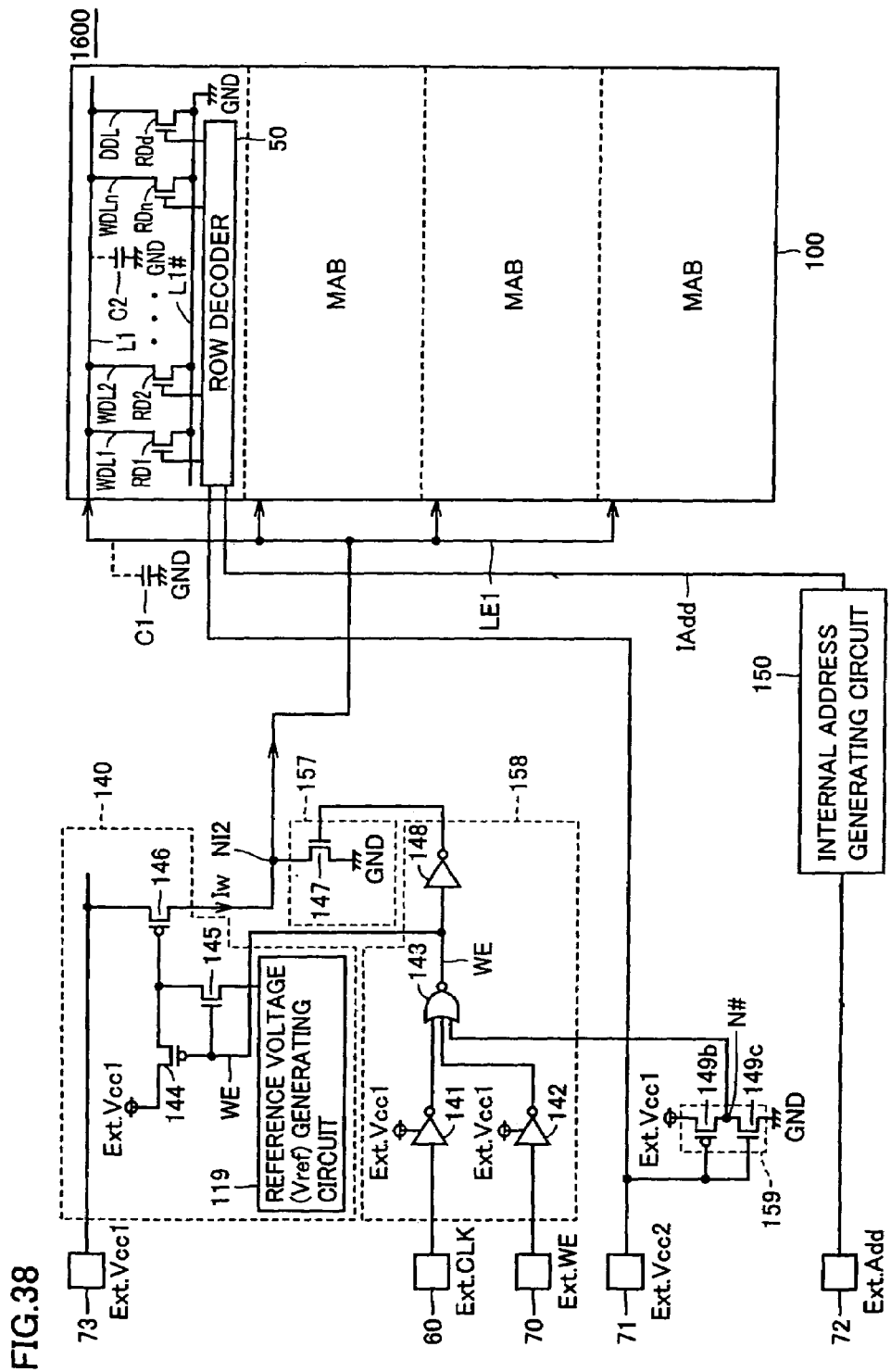
FIG. 38 is a schematic diagram showing a configuration of a non-volatile memory device according to a fourth modification of the sixth embodiment.

Referring to FIG. 38, a non-volatile memory device 1600 is different from non-volatile memory device 1500 according to the fifth embodiment shown in FIG. 22 by comparison in an aspect that further provided are power supply terminals 73 and 71; an address terminal 72 and an internal address generating circuit 150.

Non-volatile memory device 1600 is further different from non-volatile memory device 1500 by comparison in aspects that a voltage detecting circuit 159 is further provided, that a control circuit 158 is provided instead of control circuit 108, that a voltage setting circuit 157 is provided instead of voltage setting circuit 107, and that a current source 140 is provided instead of current source 110. Since the other constituents in the configuration are similar to corresponding constituents in the configuration of non-volatile memory device 1500, none of detailed descriptions thereof will be repeated.

External power supply voltage Ext.Vcc1 is supplied to power supply terminal 73. External power supply voltage Ext.Vcc2 is supplied to power supply terminal 71. Note that in the following description, as an example, power supply voltages Vcc1 and Vcc2 are set at 2.5 V and 1.0 V, respectively. Since description has been given of address terminal 72 and internal address generating circuit 150, neither of detailed descriptions thereof will be repeated. Note that in the following description, external power supply voltages Ext.Vcc1 and Ext.Vcc2 are also referred to as external power supply voltages Vcc1 and Vcc2.

Voltage detecting circuit 159 includes a P-channel MOS transistor 149*b* and an N-channel MOS transistor 149*c* connected in series between power supply voltage Vcc1 and ground voltage GND. Power supply voltage Vcc2 is supplied to the gates of P-channel MOS transistor 149*b* and N-channel MOS transistor 149*c*.

Control circuit 158 includes inverters 141 and 142, a NOR circuit 143, and an inverter 148. Inverter 141 is driven by power supply voltage Vcc1 to output a signal at an inverted level of external clock Ext.CLK inputted from clock terminal 60. Inverter 142 is driven by power supply voltage Vcc1 to output a signal at an inverted level of external write signal Ext.WE inputted from control terminal 70.

NOR circuit 143 outputs signal WE obtained by performing a NOR operation on signals outputted from inverters 141 and 142, and a signal outputted from a connection node N# between P-channel MOS transistor 149*b* and N-channel MOS transistor 149*c*. Inverter 148 outputs a signal at an inverted level of signal WE. That is, signal WE is set to H level when output signals of inverters 141 and 142 and an output signal of connection node N# are at L levels, respectively.

Voltage setting circuit 157 includes an N-channel MOS transistor 147 provided between a node NI2 and ground voltage GND. A signal at an inverted level of signal WE is inputted to the gate of N-channel MOS transistor 147.

Current source 140 includes P-channel MOS transistors 144 and 146; an N-channel MOS transistor 145, and a reference voltage generating circuit 119. P-channel MOS transistor 146 is provided between power terminal 73 and node NI2. The source and drain of P-channel MOS transistor 144 are connected to power supply voltage Vcc1 and the gate of P-channel MOS transistor 146, respectively. The source and drain of N-channel MOS transistor 145 are connected to a connection node between the drain of P-channel MOS transistor 144 and the gate of P-channel MOS transistor 146, and reference voltage generating circuit 119, respectively. Signal WE is inputted to the gates of P-channel MOS transistor 144 and N-channel MOS transistor 145.

Node NI2 is connected to current source wire LE1 for supplying a current to each of memory array blocks MAB of memory array mat 100.

Reference voltage generating circuit 119 generates voltage Vref at which a write current flowing into write digit line WDL in memory array mat 100 is optimal. Vref is generally set to an intermediate level between power supply voltage Vcc and ground voltage GND.

In a period in which signal WE is at L level, N-channel MOS transistor 147 is turned on, while P-channel MOS transistor 146 is not turned on. Therefore, during a period in which signal WE is at L level, voltages on current source wires LE1 and L1 are precharged at ground voltage GND at all times by an action of voltage setting circuit 157.

On the other hand, when signal WE is set to H level, N-channel MOS transistor 147 is turned off, while N-channel MOS transistor 145 is turned on. Therefore, voltage Vref is applied to the gate of P-channel MOS transistor 146, so P-channel MOS transistor 146 is turned on. As a result, voltage levels of current source wires LE1 and L1 are set to power supply voltage Vcc1.

Voltage Vcc2 is supplied to row decoder 50 from power supply terminal 71. Furthermore, an internal row address signal IAdd outputted from internal address generating circuit 150 is inputted to row decoder 50.

Figure 39:
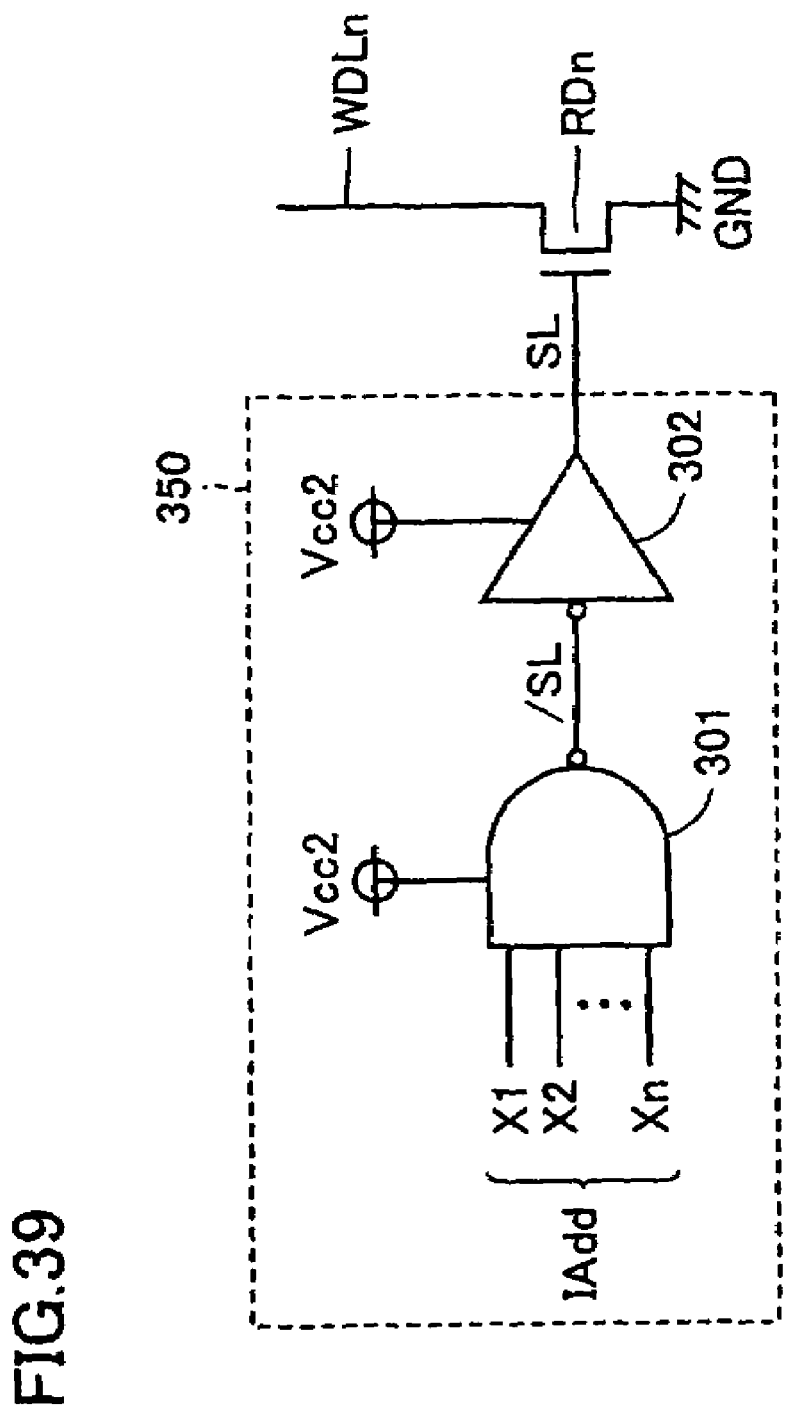
FIG. 39 is a circuit diagram showing an address decode circuit provided in the interior of a row decoder.

FIG. 39 is a circuit diagram showing an address decode circuit 350 provided in the interior of row decoder 50. Note that for description, write digit line WDLn and row decode transistor RDn are shown in the figure. Address decode circuit 350 is provided correspondingly to each write digit line WDL.

Address decode circuit 350 has a NAND circuit 301 and an inverter 302 therein. NAND circuit 301 is driven by power supply voltage Vcc2 to output a signal /SL at L level when signals X1 to Xn constituting internal row address signal IAdd for selecting desired write digit line WDLn outputted from internal address generating circuit 150 are all set to H level. Inverter 302 is driven by power supply voltage Vcc2 to output signal SL, which is an inverted signal of signal /SL. When signal SL is set to H level, row decode transistor RDn is turned on.

Then, in order to compare non-volatile memory device 1600 according to this embodiment with non-volatile memory device 1500 according to the fifth embodiment described above, description will be given of a case where non-volatile memory device 1500 enter a write state in error when power is turned on.

Figure 40:
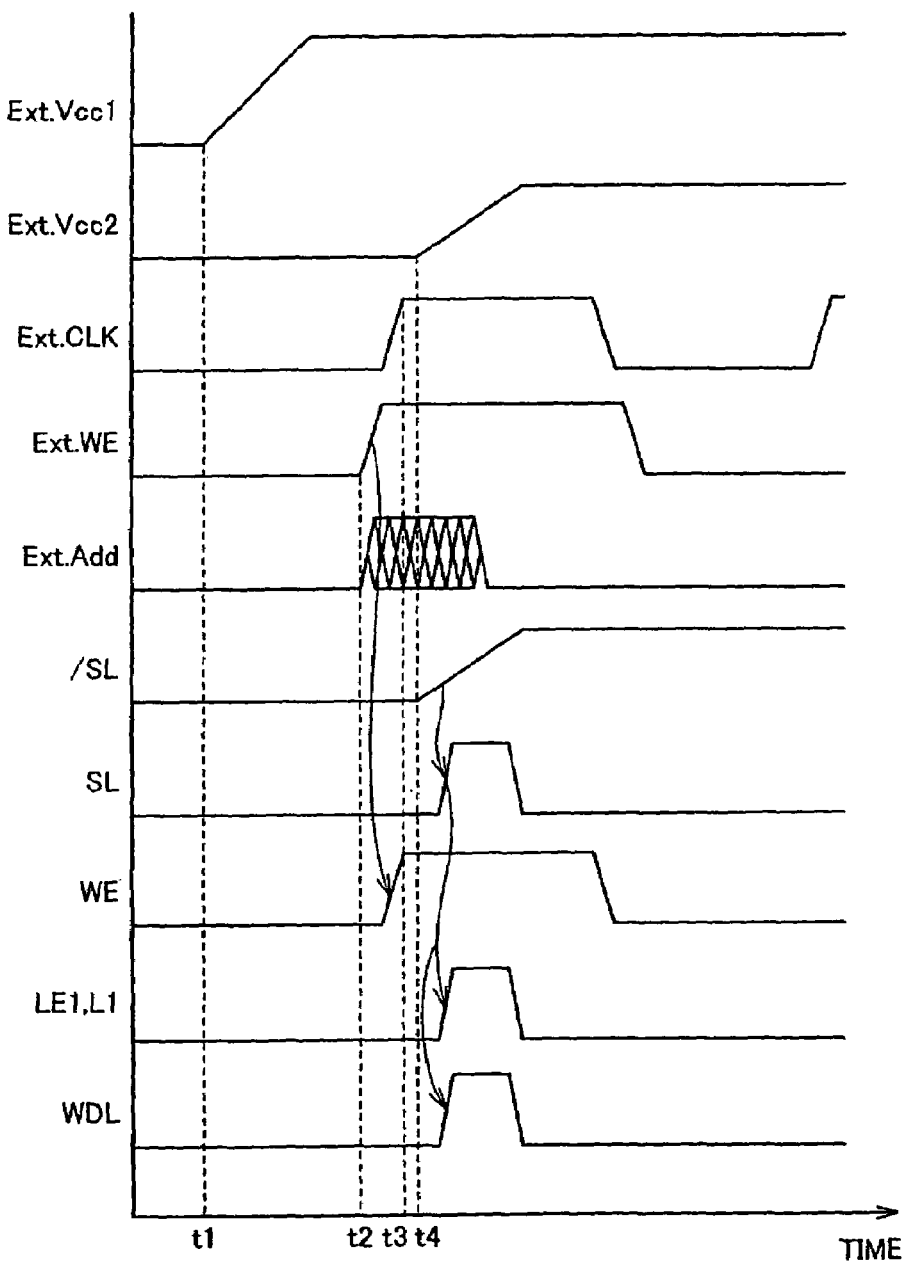

FIG. 40 is an operating waveform diagram describing operations in a case where non-volatile memory device 1500 according to the fifth embodiment shown in FIG. 22 enters a write state in error when power is turned on. Note that in this case, external write signal Ext.WE and external address Ext.Add that selects no write digit line WDL are simultaneously inputted by mistake to non-volatile memory device 1500 from outside. Furthermore, in this case, power supply voltage Vcc1 is supplied from power supply terminal 10 of non-volatile memory device 1500 and power supply voltage Vcc2 is supplied to row decoder 50. Moreover, in this case, external address signal Ext.Add is converted to internal row address signal IAdd in an internal address generating circuit not shown and inputted to row decoder 50. In FIG. 40, LE1 and L1 show a change in current flowing in current source wires LE1 and L1. WDL shows a change in write current flowing in write digit line WDL.

Then, with reference to FIGS. 22, 39 and 40, description will be given of operations in non-volatile memory device 1500 in a case where the memory device entered a write state by mistake when power is turned on. External voltage Ext.Vcc1 starts to rise at time point t1 after power is turned on. At time point t2, external address Ext.Add is inputted to an internal address generating circuit and converted to internal row address signal IAdd. Simultaneously, external write signal Ext.WE is inputted to inverter 112. If signal WE takes H level at time point t3, voltages on current source wires LE1 and L1 starts to rise up to Vcc1.

If external power supply voltage Ext.Vcc2 starts to rise at time point t4, NAND circuit 301 driven by power supply voltage Vcc2 in address decode circuit 350 also starts to become active. At this point in time, internal row address IAdd for not selecting write digit line WDL has been inputted to NAND circuit 301. That is, when NAND circuit 301 is activated, output signal /SL thereof is set to H level. In a state where no sufficient voltage is supplied to NAND circuit 301, signal SL outputted from inverter 302 takes H level before /SL takes H level to turn on row decode transistor RDn connected to non-selected write digit line WDL. In company with this, a current starts to flow in current source wire L1 and non-selected write digit line WDL. Therefore, a possibility arises that erroneous data writing is performed on a memory cell arranged in the vicinity of the non-selected digit line by a current flowing in the non-selected write digit line WDL.

Figure 41:
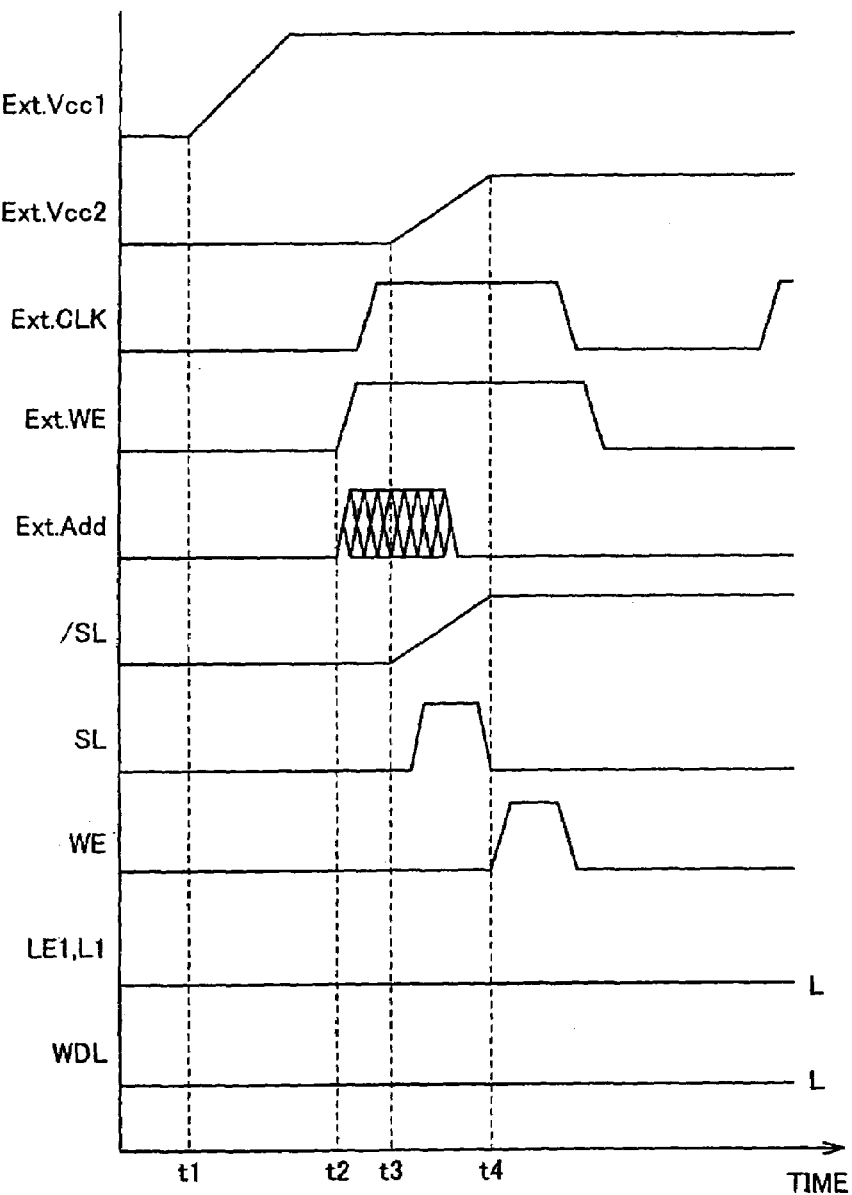
FIG. 41 is an operating waveform diagram describing operations when power is turned on in a non-volatile memory device according to the fourth modification of the sixth embodiment.

FIG. 41 is an operating waveform diagram describing operations when power is turned on in a non-volatile memory device 1600 according to the fourth modification of the sixth embodiment. Note that it is considered a case where external write signal Ext.WE and external address Ext.Add that selects no write digit line WDL are simultaneously inputted to non-volatile memory device 1600 from outside. In FIG. 41, LE1 and L1 show a change in current flowing in current source wires LE1 and L1. WDL shows a change in write current flowing in write digit line WDL.

Then, description will be given of operations in non-volatile memory device 1600 when power is turned on using FIGS. 38, 39 and 41. At time point t1 after power is turned on, external voltage Ext.Vcc1 starts to rise. At time point t2, external address Ext.Add is inputted to internal address generating circuit 150 and converted to internal row address signal IAdd. Simultaneously, external write signal Ext.WE is also inputted to inverter 142.

If external power supply voltage Ext.Vcc2 starts to rise at time point t3, NAND circuit 301 driven by power supply voltage Vcc2 in address decode circuit 350 also starts to become active. At this point in time, internal row address signal IAdd not selecting write digit line WDL has been inputted to NAND circuit 301. That is, output signal /SL of NAND circuit 301 is set to H level when being activated. In a state where no sufficient voltage is supplied to NAND circuit 301, signal SL outputted from inverter 302 takes H level before /SL takes H level.

If external voltage Ext.Vcc2 reaches to a predetermined level at time point t4, N-channel MOS transistor 149c in voltage detecting circuit 159 is turned on to set signal WE to H level. In company with this, voltages on current source wires LE1 and L1 starts to rise up to Vcc1. At this point in time, NAND circuit 301 and inverter 302 have been supplied with power supply voltage Vcc2; therefore both normally operate to set signal SL to L level. Accordingly, row decode transistor RDn connected to non-selected write digit line WDL is not turned on. Hence, no current flows in current source wire L1 and non-selected write digit line WDL, so no erroneous data writing occurs on a memory cell.

In non-volatile memory device 1600 according to the fourth modification of the sixth embodiment, as described above, even if the memory device has entered a write state by mistake when power is turned on, erroneous data writing can be prevented since no unnecessary current flows in write digit line WDL.

Fifth Modification of Sixth Embodiment

Figure 42:
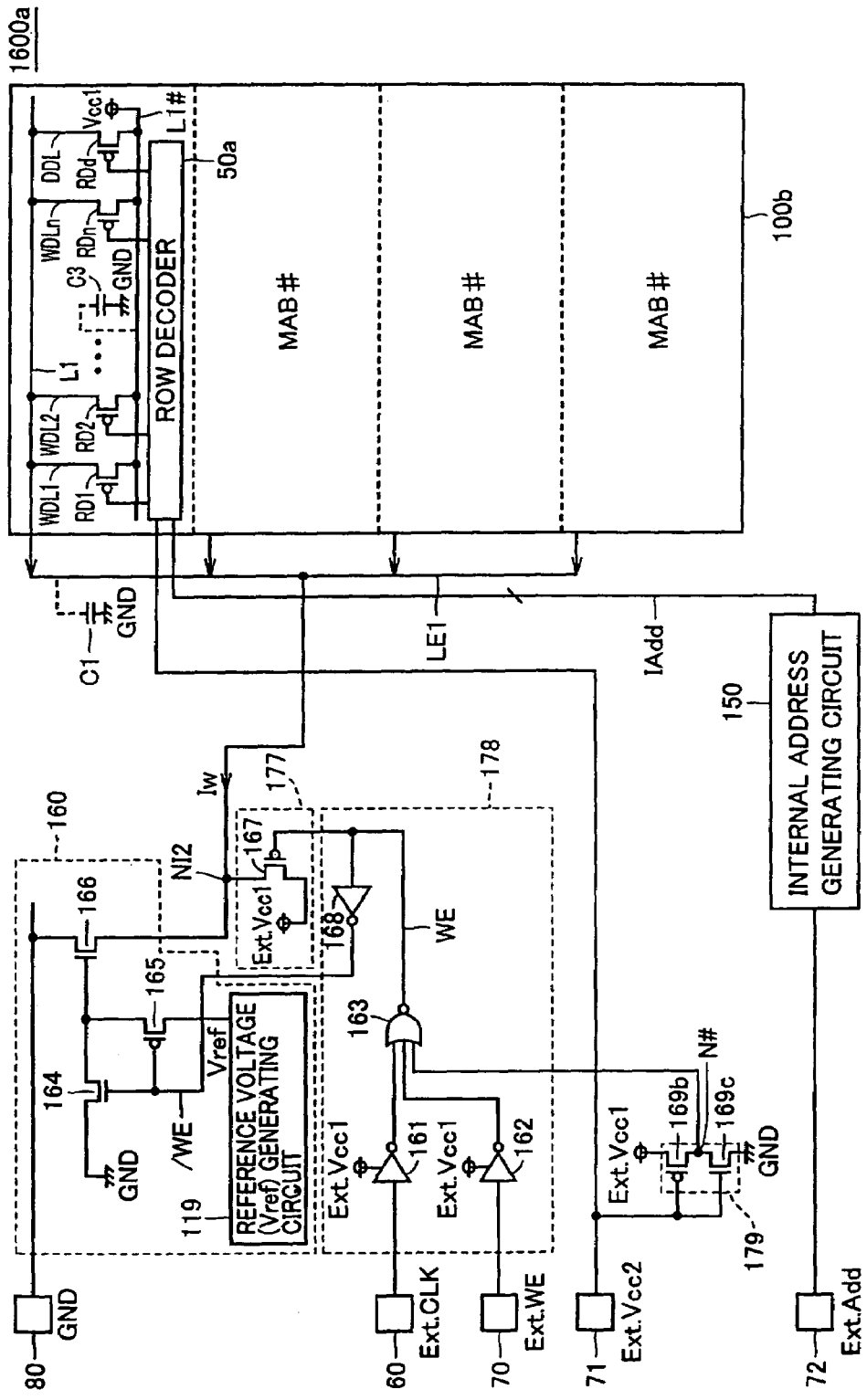
FIG. 42 is a schematic diagram showing a configuration of a non-volatile memory device according to a fifth modification of the six embodiment.

Referring to FIG. 42, a non-volatile memory device 1600a is different from non-volatile memory device 1600 according to the fourth modification of the sixth embodiment shown in FIG. 38 by comparison in an aspect that a power supply terminal 80, a voltage detecting circuit 179, a control circuit 178, a voltage setting circuit 177, a current source 160 and a memory array mat 100b are provided instead of power supply terminal 73, voltage detecting circuit 159, control circuit 158, voltage setting circuit 157, current source 140 and memory array mat 100, respectively. Since the other constituents in the configuration are similar to corresponding constituents in the configuration of non-volatile memory device 1600, none of detailed descriptions thereof will be repeated.

Power supply voltage Vcc1 is connected to current source wire L1# in memory array mat 100b. Power supply terminal 80 is connected to ground voltage GND to receives a current from current source 160.

Voltage detecting circuit 179 includes a P-channel MOS transistor 169b and an N-channel MOS transistor 169c connected in series between power supply voltage Vcc1 and ground voltage GND. Power supply voltage Vcc2 is supplied to the gates of P-channel MOS transistor 169b and N-channel MOS transistor 169c.

Control circuit 178 includes inverters 161 and 162, a NOR circuit 163, and an inverter 168. Inverter 161 is driven by power supply voltage Vcc1 to output a signal at an inverted level of external clock Ext.CLK inputted from clock terminal 60. Inverter 162 is driven by power supply voltage Vcc1 to output a signal at an inverted level of external write signal Ext.WE inputted from control terminal 70.

NOR circuit 163 outputs signal WE obtained by performing a NOR operation on output signals outputted from inverters 161 and 162, and a connection node N# between P-channel MOS transistor 169b and N-channel MOS transistor 169c. That is, signal WE is set to H level when output signals of inverters 161 and 162, and connection node N# are at L levels, respectively. Inverter 168 outputs signal /WE at an inverted level of signal WE.

Voltage setting circuit 177 includes a P-channel MOS transistor 167 provided between power supply voltage Vcc1 and node NI2. Signal WE is inputted to the gate of P-channel MOS transistor 167.

Current source 160 includes N-channel MOS transistors 164 and 166, a P-channel MOS transistor 165, and a reference voltage generating circuit 119. N-channel MOS transistor 166 is provided between power supply terminal 80 and node NI2. The source and drain of N-channel MOS transistor 164 are connected to ground voltage GND and the gate of N-channel MOS transistor 166, respectively. The drain and source of P-channel MOS transistor 165 are connected to a connection node between the drain of N-channel MOS transistor 164 and the gate of N-channel MOS transistor 166, and reference voltage generating circuit 119, respectively. Signal /WE is inputted to the gates of N-channel MOS transistor 164 and P-channel MOS transistor 165.

Reference voltage generating circuit 119 generates voltage Vref at which a write current flowing in write digit line WDL in memory array mat 100b is optimal. Vref is generally set to an intermediate level between power supply voltage Vcc and ground voltage GND.

In a period in which signal WE is at L level, P-channel MOS transistor 167 is turned on, while N-channel MOS transistor 166 is not turned on. Therefore, during a period in which signal WE is at L level, voltages on current source wires LE1 and L1 are precharged to power supply voltage Vcc1 at all times by an action of voltage setting circuit 177.

On the other hand, when signal WE is set to H level, P-channel MOS transistor 167 is turned off, while P-channel MOS transistor 165 is turned on. Therefore, voltage Vref is applied to the gate of N-channel MOS transistor 166, so N-channel MOS transistor 166 is turned on. As a result, voltage levels of current source wires LE1 and L1 are set to ground voltage GND.

Voltage Vcc2 is supplied to row decoder 50a from power supply terminal 71. Furthermore, internal row address signal IAdd outputted from internal address generating circuit 150 is inputted to row decoder 50a.

Figure 43:
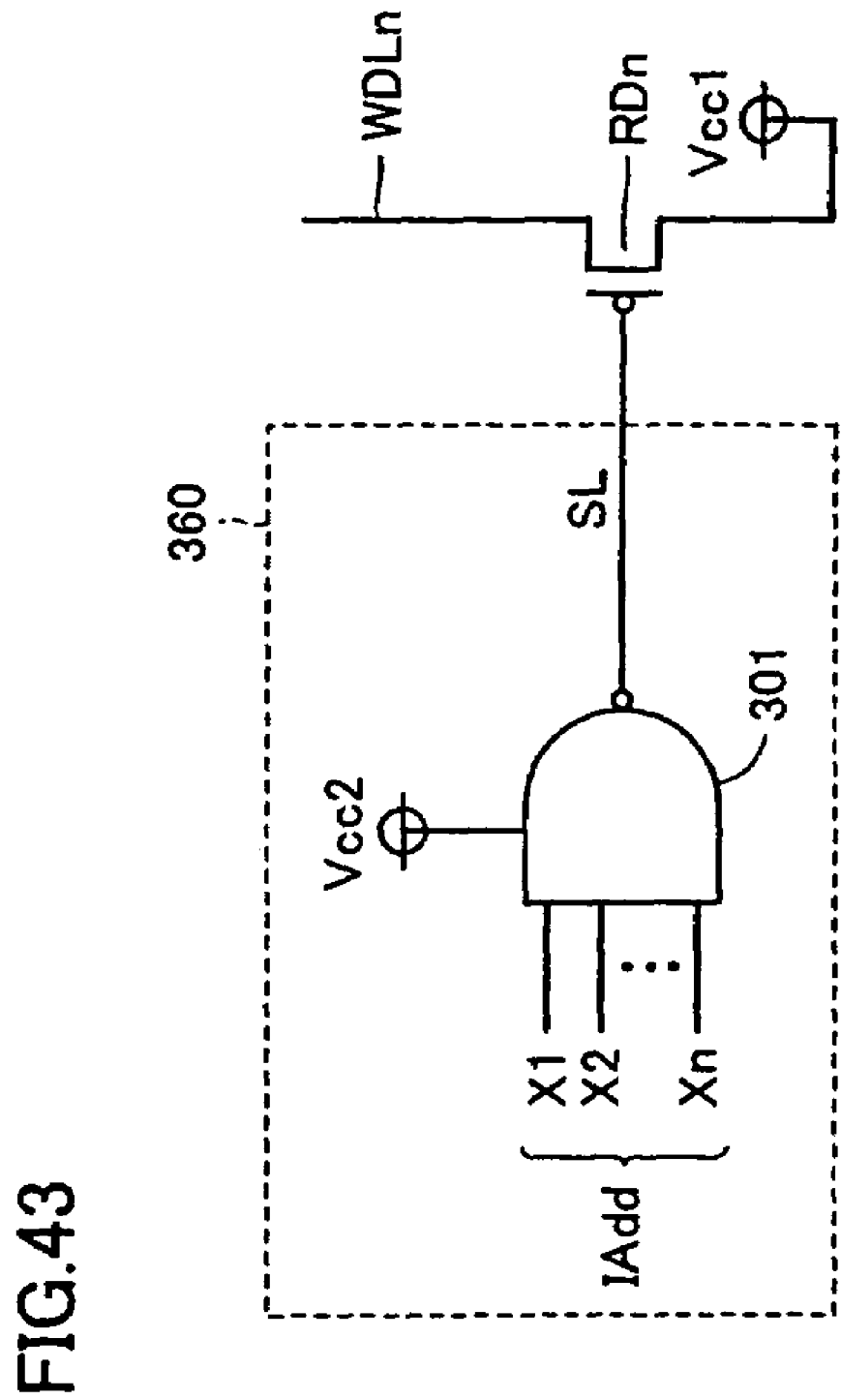
FIG. 43 is a circuit diagram showing an address decode circuit provided in the interior of a row decoder.

FIG. 43 is a circuit diagram showing an address decode circuit 360 provided in the interior of row decoder 50a. Note that for description, write digit line WDLn and row decode transistor RDn are shown in the figure. Address decode circuit 360 is provided correspondingly to each write digit line WDL.

Address decode circuit 360 has a NAND circuit 301 therein. NAND circuit 301 is driven by power supply voltage Vcc2 to output signal SL at L level when internal row address signals IAdd for selecting desired write digit line WDLn outputted from internal address generating circuit 150 are all set to H level. When signal SL is set to L level, row decode transistor RDn is turned on.

In order to compare non-volatile memory device 1600a according to this embodiment with non-volatile memory device 1500a according to the third modification of the fifth embodiment described above, description will be given of operations in a case where non-volatile memory device 1500a enters a write state in error when power is turned on.

Figure 44:
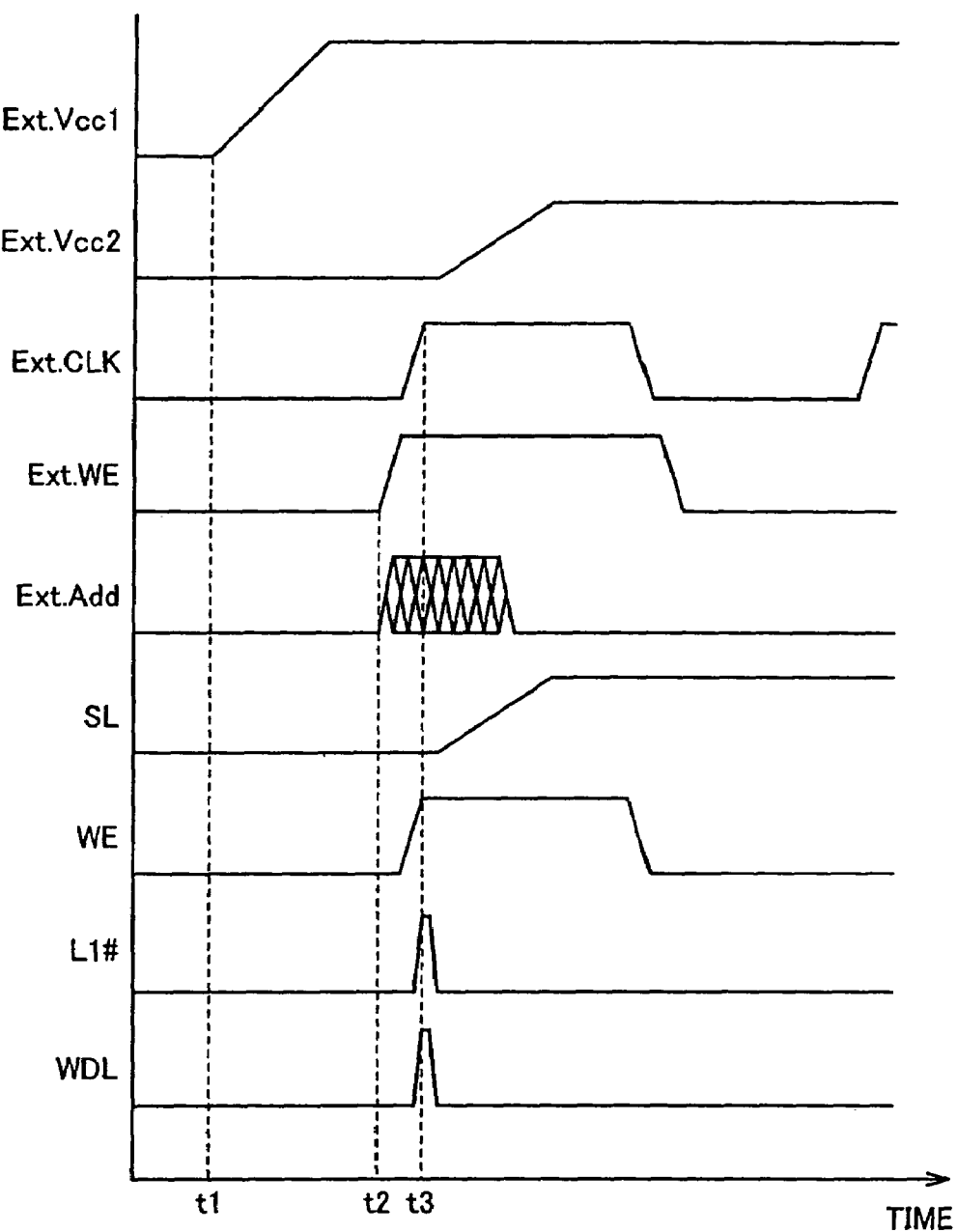

FIG. 44 is an operating waveform diagram describing operations in a case where non-volatile memory device 1500a according to the third modification of the fifth embodiment enters a write state in error when power is turned on. Note that in this case, external write signal Ext.WE and external address Ext.Add that selects no write digit line WDL are simultaneously inputted by mistake to non-volatile memory device 1500a from outside. Furthermore, power supply voltage Vcc1 is supplied to current source wire L1# instead of power supply voltage Vcc. Moreover, in this case, power supply voltage Vcc2 is supplied to row decoder 50a. Besides, in this case, external address signal Ext.Add is converted to internal row address signal IAdd in an internal address generating circuit not shown and inputted to row decoder 50a. In FIG. 44, L1# shows a change in current flowing in current source line L1#. WDL shows a change in write current flowing in write digit line WDL.

Then, description will be given of operations in non-volatile memory device 1500a in a case where the memory device enters a write state by mistake when power is turned on using FIGS. 31, 43 and 44. External voltage Ext.Vcc1 starts to rise at time point t1 after power is turned on. Simultaneously, voltages on current source wires LE1 and L1 also start to rise. At time point t2, external address Ext.Add is inputted to an internal address generating circuit and converted to internal row address signal IAdd. Simultaneously, external write signal Ext.WE is also inputted to inverter 132. If signal WE takes H level at time point t3, voltages on current source wires LE1 and L1 starts to fall down to ground voltage GND.

At time point t3, internal row address signal IAdd for not selecting write digit line WDL has been inputted to NAND circuit 301. That is, output signal SL takes H level when NAND circuit 301 is activated. In a state where no sufficient voltage is supplied to NAND circuit 301, signal SL is at L level; therefore, row decode transistor RDn connected to non-selected write digit line WDL is turned on. In company with this, a current starts to flow in current source wire L1# and non-selected write digit line WDL. Therefore, a possibility arises that erroneous data writing is performed on a memory cell arranged in the vicinity of the non-selected write digit line WDL by a current flowing therein.

Figure 45:
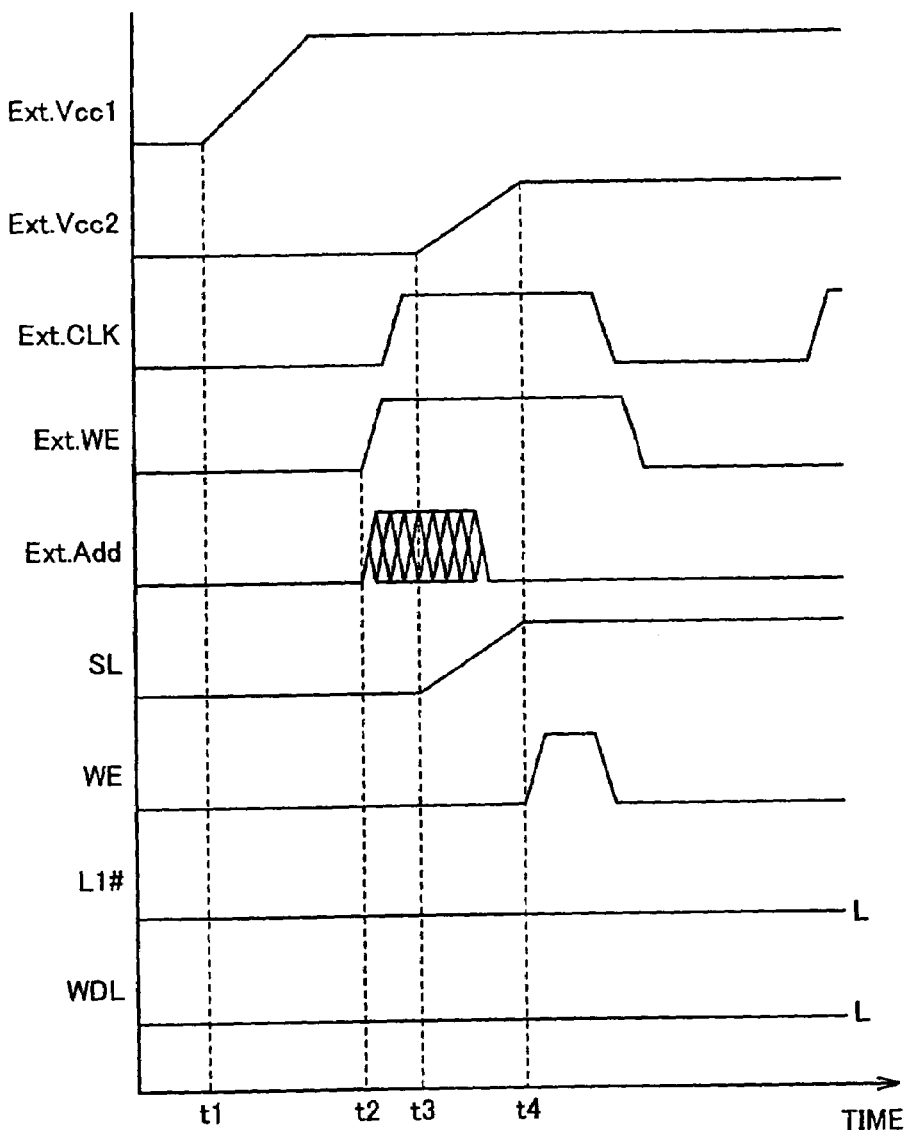
FIG. 45 is an operating waveform diagram describing operations when power is turned on in a non-volatile memory device according to the fifth modification of the sixth embodiment.

FIG. 45 is an operating waveform diagram describing operations when power is turned on in non-volatile memory device 1600a according to the fifth modification of the sixth embodiment. Note that in this case, external write signal Ext.WE and external address Ext.Add that selects no write digit line WDL are simultaneously inputted by mistake to non-volatile memory device 1600a from outside. In FIG. 45, L1# shows a change in current flowing in current source wire L1#. WDL shows a change in write current flowing in write digit line WDL.

Then, description will be given of operations in non-volatile memory device 1600a when power is turned on using FIGS. 42, 43 and 45. External voltage Ext.Vcc1 starts to rise at time point t1 after power is turned on, Simultaneously, voltages on current source wires LE1 and L1 also start to rise. At time point t2, external address Ext.Add is inputted to internal address generating circuit 150 and converted to internal row address signal IAdd. Simultaneously, external write signal Ext.WE is inputted to inverter 162.

If external voltage Ext.Vcc2 starts to rise at time point t3, NAND circuit 301 driven by power supply voltage Vcc2 in address decode circuit 360 also starts to become active. At this point in time, internal row address signal IAdd not selecting write digit line WDL has been inputted to NAND circuit 301. That is, when NAND circuit 301 is activated, output signal SL thereof is set to H level. In a state where no sufficient voltage is supplied to NAND circuit 301, signal SL is at L level.

If external voltage Ext.Vcc2 reaches a predetermined level at time point t4, P-channel MOS transistor 169c in voltage detecting circuit 179 is turned on to set signal WE to H level. In company with this, voltages on current source wires LE1 and L1 starts to fall down to ground voltage GND.

At this point in time, since NAND circuit 301 is supplied with power supply voltage Vcc2, the circuit normally operates to set signal SL to H level. Therefore, row decode transistor RDn connected to non-selected write digit line WDL is not turned on. Hence, no current flows in current source wire L1# and non-selected digit line WDL, so no chance occurs that erroneous data writing is performed on a memory cell.

In non-volatile memory device 1600a according to the fifth modification of the sixth embodiment, as described above, the configuration is adopted in which a current flows from a memory array mat to a current source, but there can be obtained an effect similar to the effect of the fourth modification of the sixth embodiment.

Sixth Modification of Sixth Embodiment

Description will be given below of a different configuration in which a current source is activated after activation of a row decoder in a non-volatile memory device for solving the problem described in the sixth embodiment.

Figure 46:
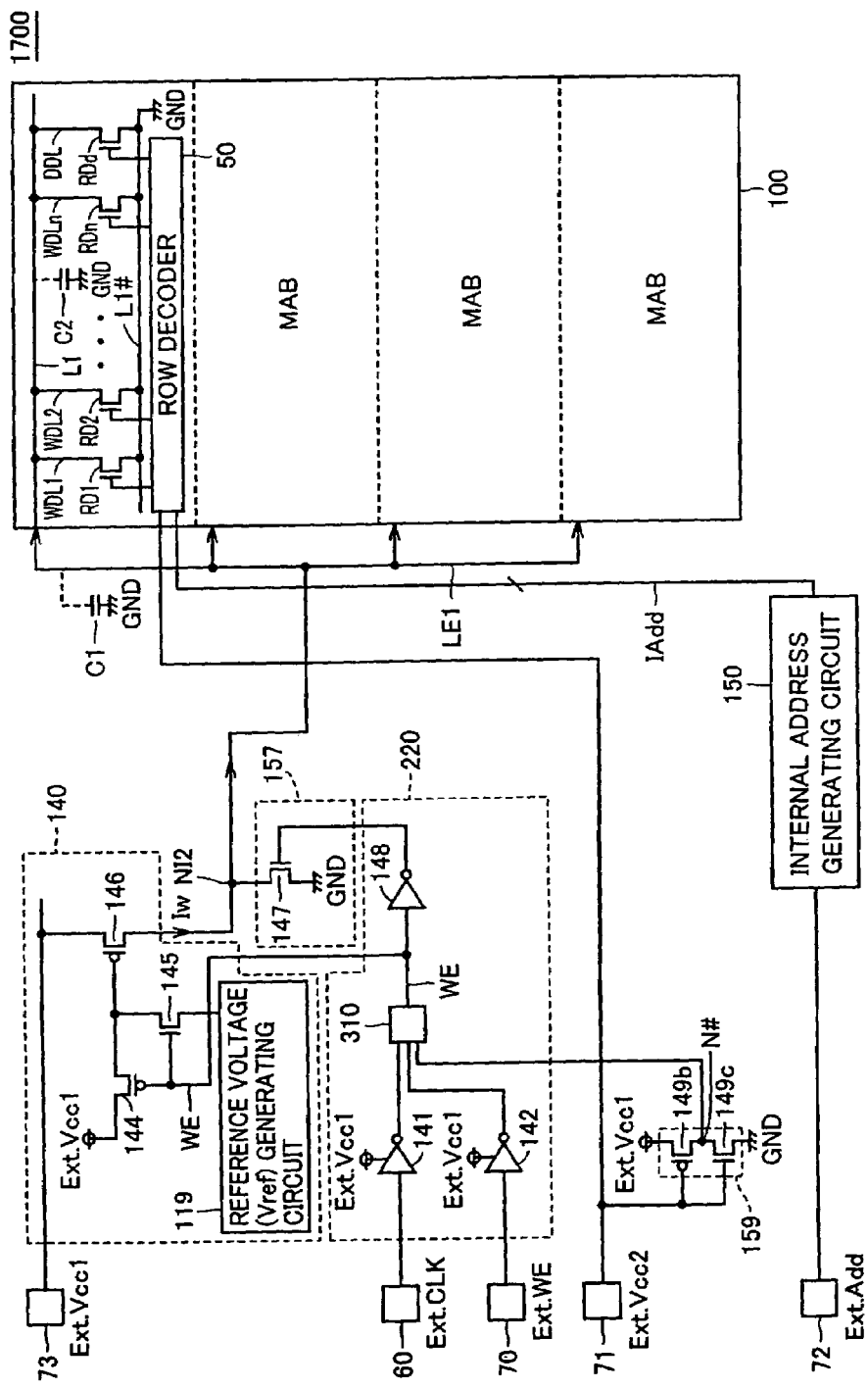
FIG. 46 is a schematic diagram showing a configuration of a non-volatile memory device according to a sixth modification of the sixth embodiment.

Referring to FIG. 46, a non-volatile memory device 1700 is different from non-volatile memory device 1600 according to the fourth modification of the sixth embodiment shown in FIG. 38 by comparison in an aspect that a control circuit 220 is provided instead of control circuit 158. Since the other constituents in the configuration are similar to corresponding constituents in the configuration of non-volatile memory device 1600, none of detailed descriptions thereof will be repeated.

Control circuit 220 is different from control circuit 158 by comparison in an aspect that a one-shot pulse generation control circuit 310 is included instead of NOR circuit 143.

Figure 47:
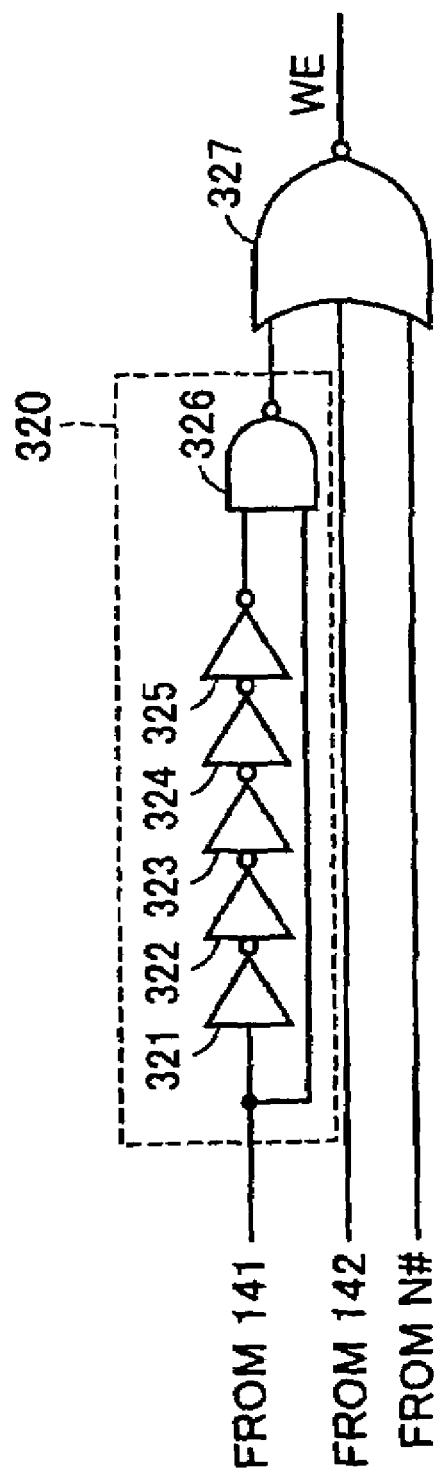
FIG. 47 is a circuit diagram showing a configuration of a one-shot pulse generation control circuit.

Referring to FIG. 47, one-shot pulse generation control circuit 310 has a one-shot pulse generating circuit 320 and a NOR circuit 327 therein.

One-shot pulse generating circuit 320 has inverters 321, 322, 323, 324 and 325 in odd-number (as an example, five inverters) connected in series with each other, and a NAND circuit 326 therein. An output signal of inverter 141 is inputted to inverter 321. An output signal of inverter 325 and an output signal of inverter 141 are inputted to NAND circuit 326 to output a one-shot pulse signal obtained by performing a NAND operation thereon to NOR circuit 327. In one-shot pulse signal generating circuit 320, a time in which an output signal thereof is held at L level is determined by the number of inverters connected in series with each other and characteristics thereof. That is, with an increased number of inverters, a longer period results, in which the output signal is held at L level.

NOR circuit 327 outputs signal WE obtained by performing a NOR operation on an output signal of one-shot pulse generating circuit 320, an output signal of inverter 142 and an output signal from node N#. That is, NOR circuit 327 sets signal WE to H level by an output signal at L level from inverter 142, a signal at L level from node N# and an output signal at L level from one-shot pulse generating circuit 320. A period in which signal WE is held at H level is equal to a period in which an output signal from one-shot pulse generating circuit 320 is held at L level.

Referring again to FIG. 46, in a period in which signal WE is at L level, N-channel MOS transistor 147 is turned on, while P-channel MOS transistor 146 is not turned on. Therefore, during a period in which signal WE is at L level, voltages on current source wires LE1 and L1 are in a precharged state at ground voltage GND at all times by an action of voltage setting circuit 157.

On the other hand, when signal WE is set to H level, N-channel MOS transistor 147 is turned off, while N-channel MOS transistor 145 is turned on. Therefore, voltage Vref is applied to the gate of P-channel MOS transistor 146, so that P-channel MOS transistor 146 is turned on. As a result, voltage levels of current source wires LE1 and L1 are set to power supply voltage Vcc1.

Figure 48:
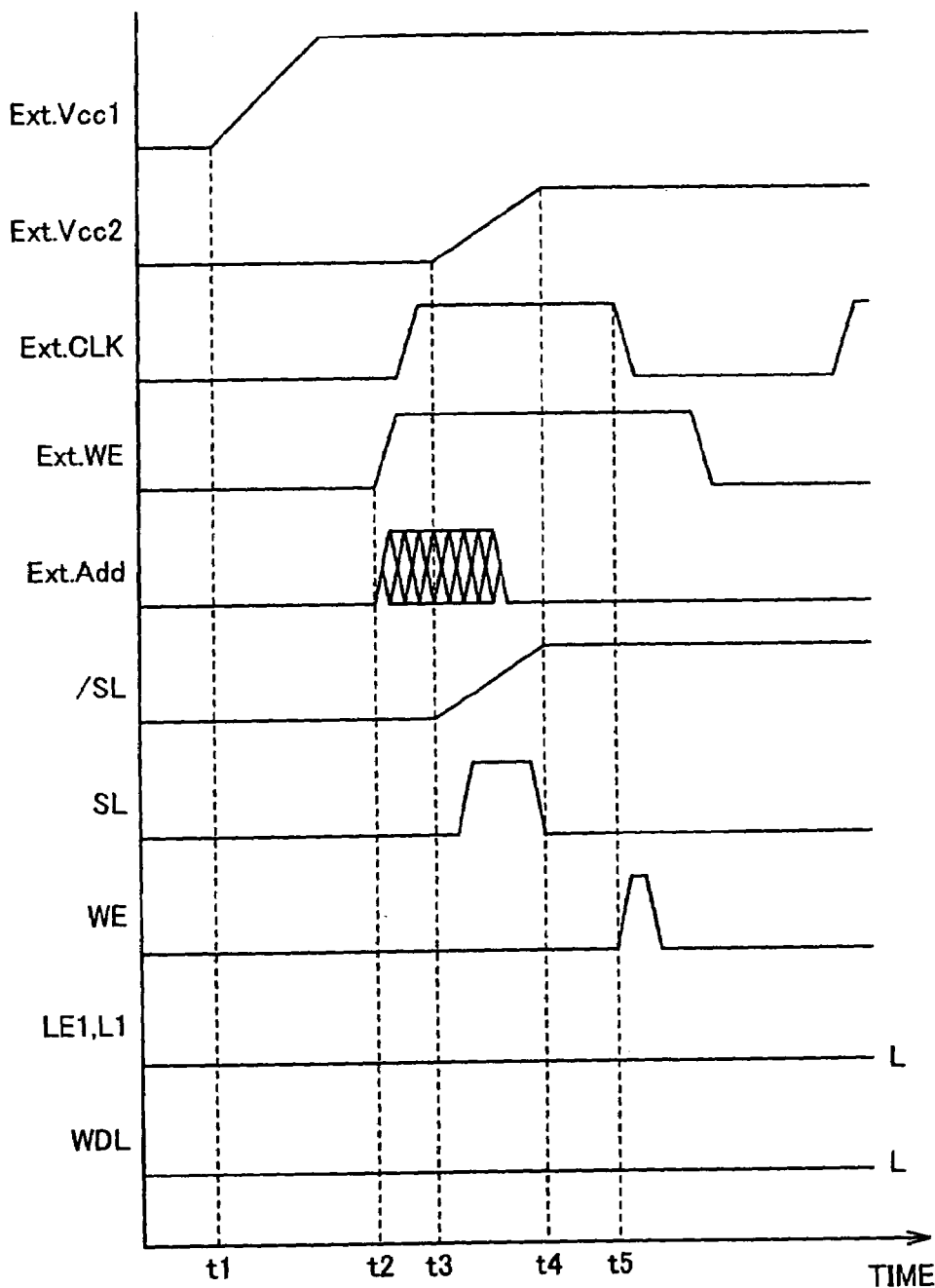

FIG. 48 is an operating waveform diagram describing operations in a case where a non-volatile memory device 1700 according to the sixth modification of the sixth embodiment enters a write state in error when power is turned on. Note that in this case, external write signal Ext.WE and external address Ext.Add that selects no write digit line WDL are simultaneously inputted in error to non-volatile memory device 1700 from outside. In FIG. 48, LE1 and L1 show a change in current flowing current source wires LE1 and L1. WDL shows a change in write current flowing in write digit line WDL.

Then, description will be given of operations in non-volatile memory device 1700 in a case where the memory device enters a write state in error when power is turned on using FIGS. 39, 46, 47 and 48. External voltage Ext.Vcc1 starts to rise at time point t1 after power is turned on. At time point t2, external address Ext.Add is inputted to internal address generating circuit 150 and converted to internal row address signal IAdd. Simultaneously, external write signal Ext.WE is also inputted to inverter 142.

If external voltage Ext.Vcc2 starts to rise at time point t3, NAND circuit 301 driven by power supply voltage Vcc2 in address decode circuit 350 also starts to become active. At this point in time, internal row address signal IAdd not selecting write digit line WDL has been inputted to NAND circuit 301. That is, when NAND circuit 301 is activated, output signal /SL thereof is set to H level. In a state where no sufficient voltage is supplied to NAND circuit 301, signal SL outputted from inverter 302 takes H level before /SL takes H level.

If external voltage Ext.Vcc2 reaches a predetermined level at time point t4, N-channel MOS transistor 149c in voltage detecting circuit 159 is turned on, and signal WE at L level rises to H level at time point t5 at which external dock Ext.CLK starts to fall from H level to L level. A period in which signal WE maintains H level thereof is determined by the number of inverters and characteristics thereof in one-shot pulse generating circuit 320.

Voltages on current source wires LE1 and L1 starts to rise up to Vcc1 at the same time that signal WE takes H level. At this point in time, since NAND circuit 301 and inverter 302 is supplied with power supply voltage Vcc2, both operate normally to set-signal SL to L level. Therefore, row decode transistor RDn connected to non-selected write digit line WDL is not turned on. As a result, no current flows in current source wire L1 and non-selected write digit line WDL, so no chance arises that erroneous data writing is performed on a memory cell.

In the configuration of non-volatile memory device 1600 according to the fourth modification of the sixth embodiment, signal WE takes H level immediately after external power supply voltage Ext.Vcc2 reaches a predetermined level when power is turned on. In the configuration of non-volatile memory device 1700, signal WE transits from L level to H level when external clock Ext.CLK transitions from H level to L level. Therefore, even during a resultant longer period from immediately after power is turned on till signal WE takes H level, no chance arises that erroneous data writing is performed on a memory cell.

Furthermore, in the configuration of non-volatile memory device 1600, not only does external clock Ext.CLK or external write signal Ext.WE take L level, but signal WE also takes L level. In the configuration of non-volatile memory device 1700, however, even if external write signal Ext.WE maintains H level thereof, the signal WE takes L level when a predetermined time elapses thereafter by an action of one-shot pulse generating circuit 320.

In non-volatile memory device 1700 according to the six modification of the sixth embodiment, as described above, an effect similar to the effect of the fourth modification of the sixth embodiment.

Seventh Modification of Sixth Embodiment

Figure 49:
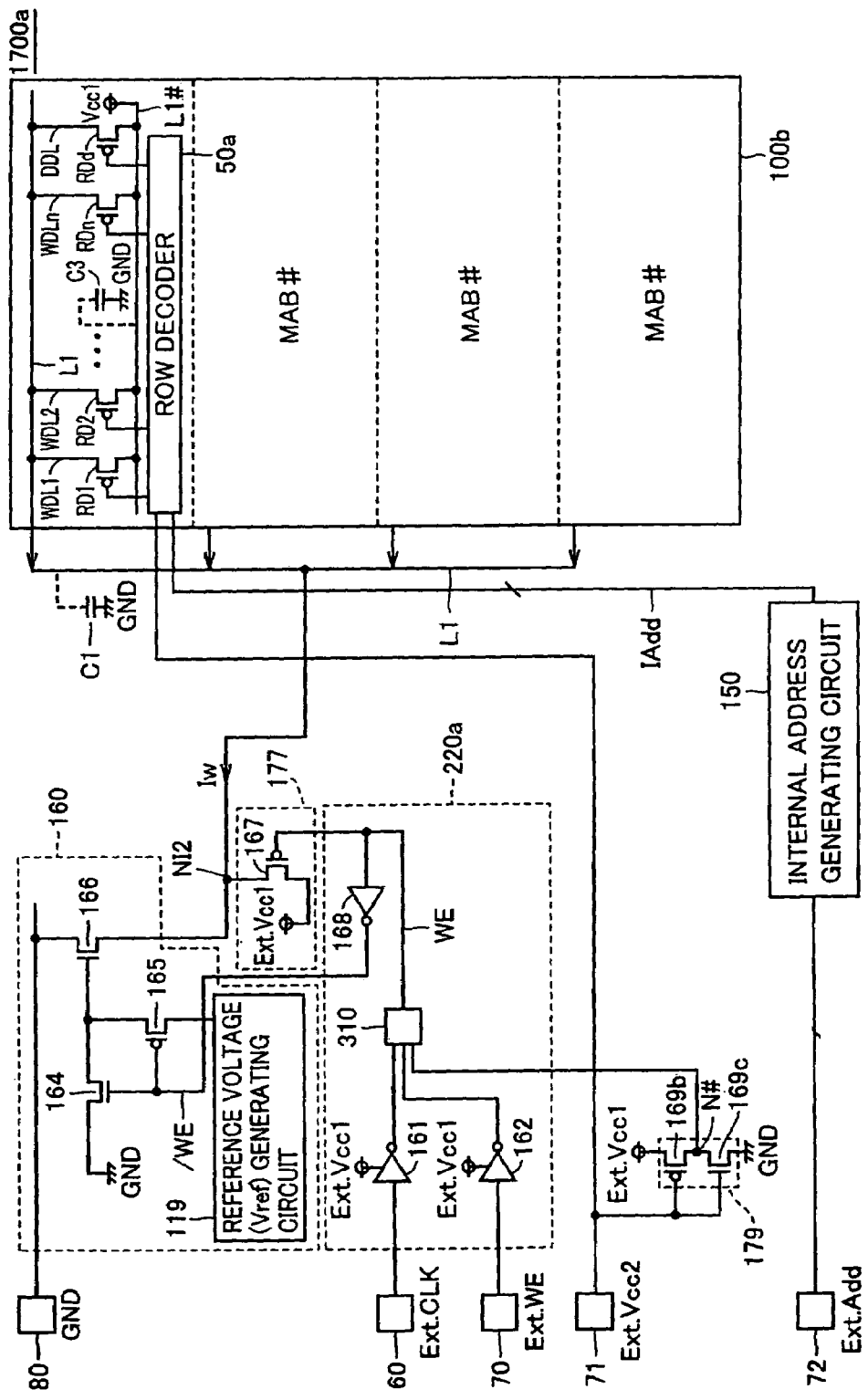
FIG. 49 is a schematic diagram showing a configuration of a non-volatile memory device according to a seventh modification of the sixth embodiment.

Referring to FIG. 49, a non-volatile memory device 1700a is different from non-volatile memory device 1600a according to the fifth modification of the sixth embodiment shown in FIG. 42 by comparison in an aspect that a control circuit 220a is provided instead of control circuit 178. Since the other constituents in the configuration are similar to corresponding constituents in the configuration of non-volatile memory device 1600a, none of detailed descriptions thereof will be repeated.

Control circuit 220a is different from control circuit 178 by comparison in an aspect that a one-shot pulse generation control circuit 310 is included instead of NOR circuit 163.

Operations in a case where non-volatile memory device 1700a enters a write state in error when power is turned on are similar to those in non-volatile memory device 1600a of the fifth modification of the sixth embodiment with the exception that a one-shot pulse of signal WE occurs when first external clock Ext.CLK transitions from H level to L level; therefore no detailed description thereof will be repeated.

In the configuration of non-volatile memory device 1600a according to the fifth modification of the sixth embodiment, signal WE takes H level immediately after external power supply voltage Ext.Vcc2 reaches a predetermined level when power is turned on. In the configuration of non-volatile memory device 1700a, however, signal WE transits from L level to H level when external clock Ext.CLK transits from H level to L level. Therefore, even during a resultant longer period from immediately after power is turned on till signal WE takes H level, no chance arises that erroneous data writing is performed on a memory cell.

Furthermore, in the configuration of non-volatile memory device 1600a, not only does external clock Ext.CLK or external write signal Ext.WE take L level, but signal WE also takes L level. In the configuration of non-volatile memory device 1700a, however, even if external write signal Ext.WE maintains H level thereof, signal WE takes L level when a predetermined time elapses thereafter by an action of one-shot pulse generating circuit 320.

In non-volatile memory device 1700a according the seventh modification of the sixth embodiment, therefore, an effect similar to the effect of the fifth modification of the sixth embodiment.

Seventh Embodiment

The above descriptions have been given of the configuration stabilizing a write current, the configuration preventing erroneous data writing and the configuration preventing erroneous data writing when power is turned on, in connection with write digit line VDL, and the present invention can be applied in connection with a bit line in which a write current flows as well.

Figure 50:
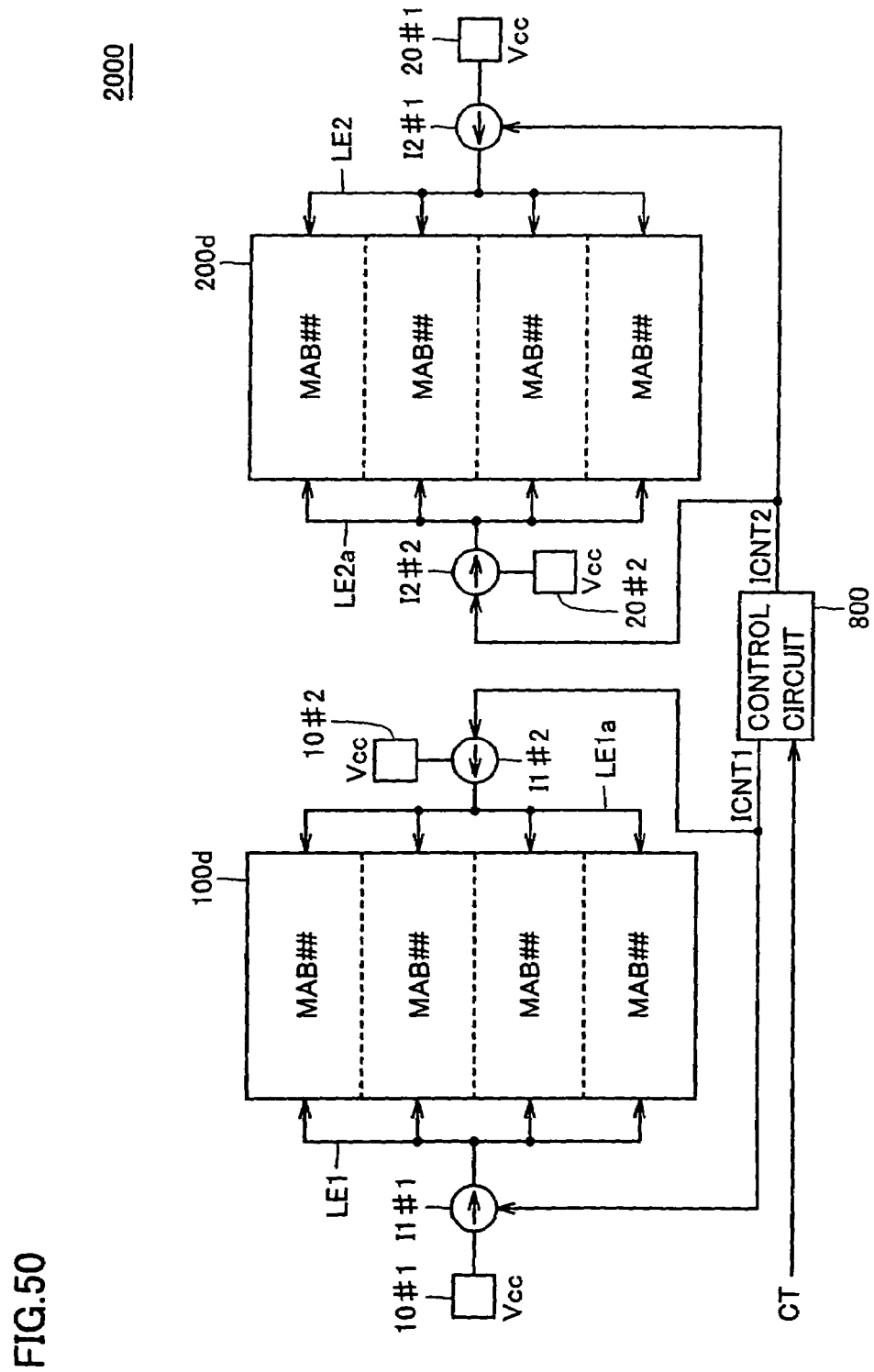
FIG. 50 is a schematic diagram showing a configuration of a non-volatile memory device according to a seventh embodiment.

Referring to FIG. 50, a non-volatile memory device 2000 is different from non-volatile memory device 1000 according to the first embodiment by comparison in an aspect that further provided are power supply terminals 10#2 and 20#2, and current sources I1#2 and I2#2.

Non-volatile memory device 2000 is further different from non-volatile memory device 1000 by comparison in aspects that memory array mats 100d and 200d are provided instead of memory array mats 100 and 200, respectively, that a power terminal 10#1 and a current source I1#1 are provided instead of power supply terminal 10 and current source I1, respectively, and that a power terminal 20#1 and a current source I2#1 are provided instead of power supply terminal 20 and current source I2, respectively.

Memory array mats 100d and 200d, similar to memory array mats 100 and 200, are each divided into four memory blocks MAB## as an example. Though details are described later, each of the memory blocks MAB## includes as an example, a plurality of memory cells arranged in rows and columns, an address decoder, bit lines, write digit lines and read word lines. Note that a memory array mat may also be of a configuration in which one address decoder selects a bit line, a write digit line and a read word line included in a plurality of memory array blocks.

Non-volatile memory device 2000 is further different from non-volatile memory device 1000 by comparison in aspects that current control signals ICNT1 and ICNT2 are inputted to respective current sources I1#2 and I2#2 from control circuit 800, and that currents from current sources I1#2 and I2#2 are supplied to each memory block MAB## in memory array mat 100d and to each memory array block MAB## in memory array mat 200d through respective current source wires LE1a and LE2a. Since the other constituents in the configuration are similar to corresponding constituents in the configuration of non-volatile memory device 1000, none of detailed descriptions thereof will be repeated.

Power supply terminals 10#1, 10#2, 20#1 and 20#2 supply power supply voltage Vcc to respective current sources I1#1, I1#2, I2#1 and I2#2. Current sources I1#1 and I2#1 supply currents to each memory array block MAB## in memory array mat 100d and to each memory array block MAB## in memory array mat 200d, respectively, through current source wires LE1 and LE2.

Figure 51:
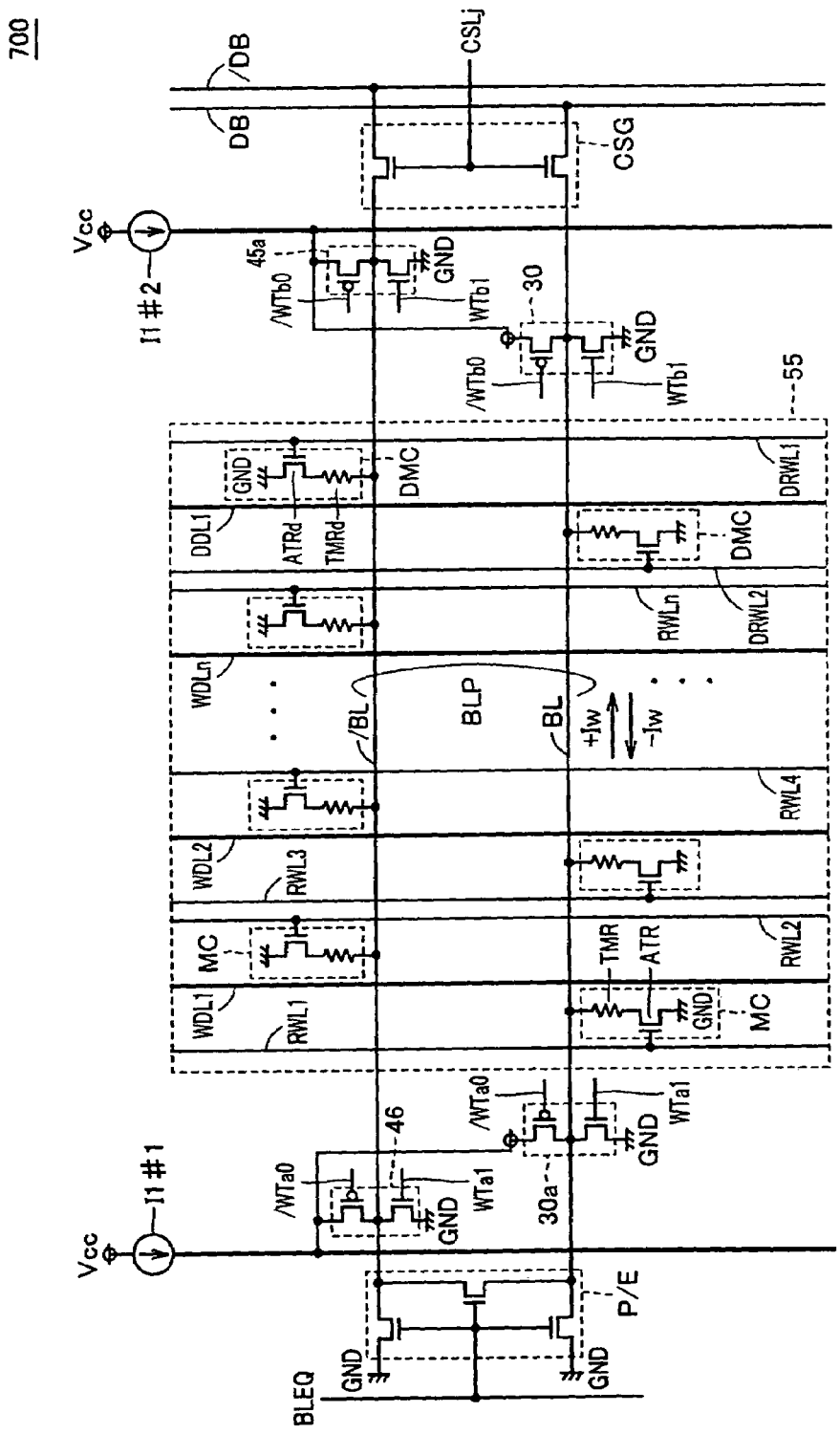
FIG. 51 is a circuit diagram showing a configuration of a memory array in a memory array block according to the seventh embodiment.

FIG. 51 is a circuit diagram showing a configuration of a memory array 700 in memory array block MAB## according to the seventh embodiment. Note that in FIG. 51, for convenience in description, current sources I1#1 and I1#2 not included in memory array 700 are also shown in the figure.

Memory array 700 is of a configuration similar to that of memory array 500 by comparison and part of the configuration thereof is not depicted in the figure, which part is not necessary for causing currents to flow in bit lines BL and /BL and includes current source I1, current source wires L1 and L1#, row decode transistor RD, dummy row decode transistor RDd, row decoder 50 and data write circuit 40. Instead, current sources I1#1 and I1#2 are depicted.

Current source I1#1 supplies currents to a bit line driver 46 causing a write current to flow into bit line /BL and to a bit line driver 30a causing a write current to flow into bit line BL. Current source I1#2 supplies currents to a bit line driver 45a causing a write current to flow into bit line /BL and to a bit line driver 30 causing a write current to flow into bit line BL. Since the other constituents in the configuration and operations therein are similar to corresponding constituents of the configuration and operations therein of memory array 500, none of detailed descriptions thereof will be repeated. While in memory array 700, a configuration is shown in which bit line drivers are provided to respective bit lines /BL and BL, arrangement of bit line drivers are not limited specifically to these locations. For example, bit line drivers may also be arranged at locations in the vicinity of the centers of bit lines /BL and BL.

Referring again to FIG. 50, current sources I1#1 and I1#2 are activated according to current control signal ICNT1. Current sources I2#1 and I2#2 are activated according to current control signal ICNT2.

In a case where a write operation is performed on a memory cell in memory array block MAB## of memory array mat 100d, control signal CT is set so that control circuit 800 transmits current control signal ICNT1 to current sources I1#1 and I1#2. On the other hand, in a case where a write operation is performed on a memory cell in memory array block MAB## of memory array mat 200d, control signal CT is set so that control circuit 800 transmits current control signal ICNT2 to current sources I2#1 and I2#2. Note that no specific limitation is imposed only on one memory array block, which becomes an object for writing, but a plurality of memory array blocks may simultaneously be objects for writing.

That is, one memory array mat is divided into two parts and current sources are provided correspondingly to respective parts thereof and the parts thereof are selectively activated; thereby enabling a wiring length from a current source to a selected memory cell to be halved. Hence, wiring resistance from the current source to the selected memory cell is also halved, thereby enabling fluctuations in write currents can be reduced.

In non-volatile memory device 2000 according to the seventh embodiment, as described above, there can be obtained an effect similar to the effect of non-volatile memory device 1000 according to the first embodiment in connection with a bit line.

First Modification of Seventh Embodiment

Figure 52:
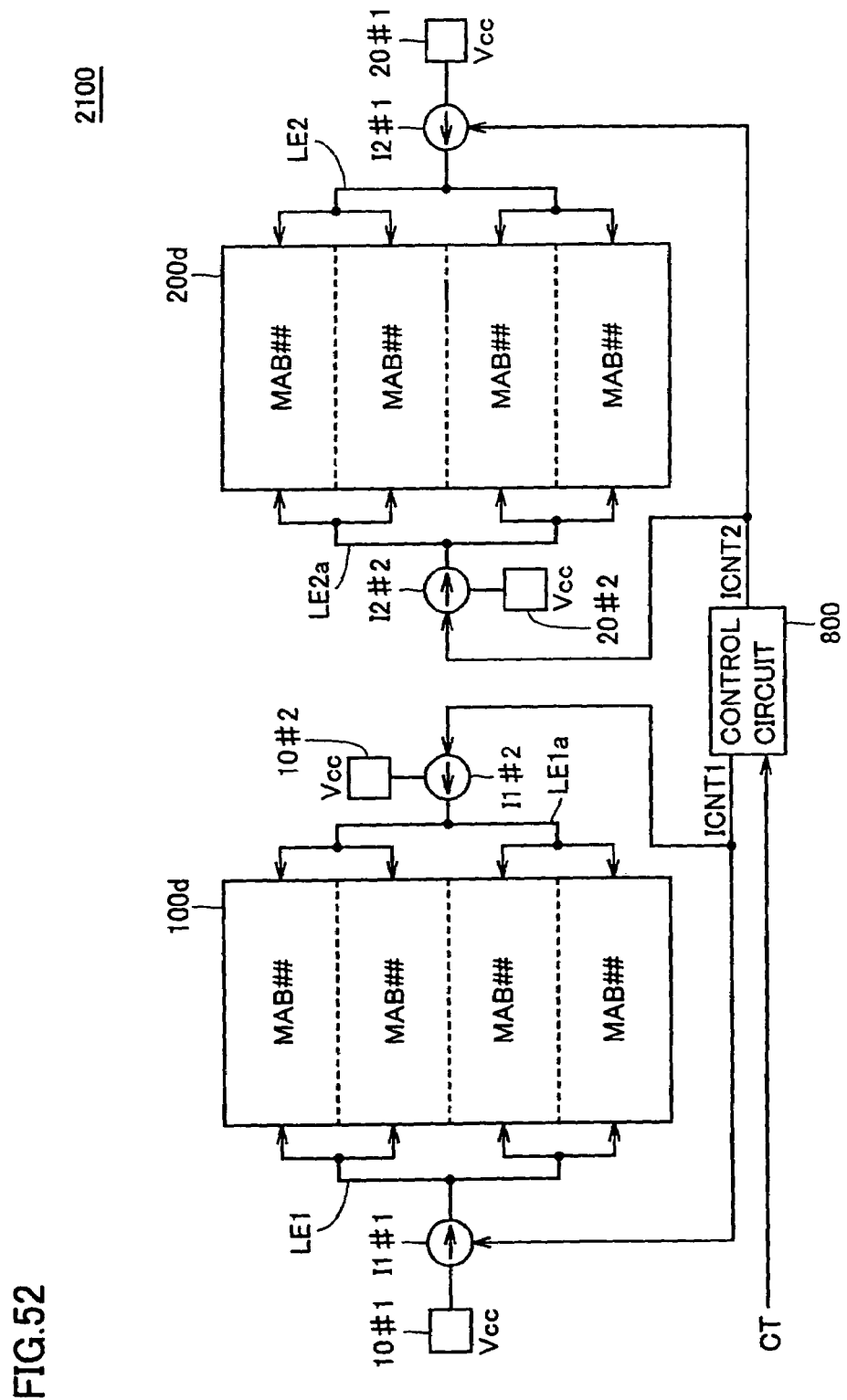
FIGS. 52 and 53 are schematic diagrams showing configurations of non-volatile memory devices according to first and second modifications of the seventh embodiment, respectively.

Referring to FIG. 52, a non-volatile memory device 2100 is different from non-volatile memory device 2000 according to the seventh embodiment by comparison in an aspect that a configuration is adopted in which in memory array mat 100d, a wiring length LE1 from current sources I1#1 to each memory array block MAB## and a wiring length LE1a from current source I1#2 to each memory array block MAB## are equal to each other, and in memory array mat 200d, a wiring length LE2 from current source I2#1 to each memory array block MAB## and a wiring length LE2a from current source I2#2 to each memory array block MAB## are equal to each other. Since the other constituents in the configuration and operations therein are similar to corresponding constituents in the configuration and operations therein of non-volatile memory device 2000, none of detailed descriptions thereof will be repeated.

Therefore, non-volatile memory device 2100 according to the first modification of the seventh embodiment can also obtain an effect similar to the effect of non-volatile memory device 1100 according to the first modification of the first embodiment in connection with a bit line as well.

Second Modification of Seventh Embodiment

Figure 53:
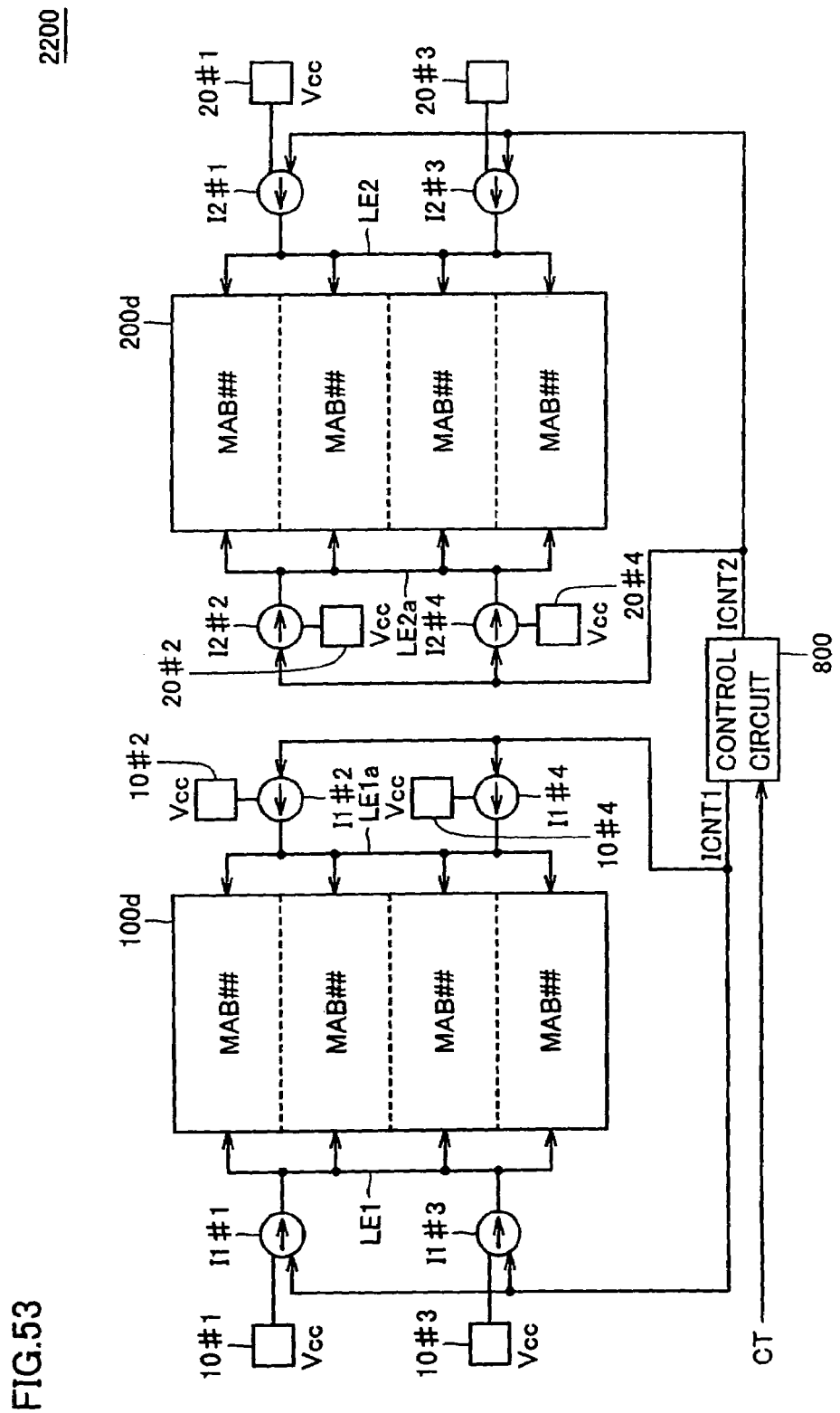

Referring to FIG. 53, a non-volatile memory device 2200 is different from non-volatile memory device 2000 according to the seventh embodiment by comparison in an aspect that further provided are power terminals 10#3, 10#4, 20#3 and 20#4, and current sources I1#3, I1#4, I2#3 and I2#4.

Power terminals 10#3, 10#4, 20#3 and 20#4 supply power supply voltage Vcc to current sources I1#3, I1#4, I2#3 and I2#4. Current sources I1#3 and I1#4 supply currents to memory array blocks MAB## in memory array mat 100d through current source wires LE1 and LE1a. Current sources I2#3 and I2#4 supply currents to memory array blocks MAB## in memory array mat 200d through current source wires LE2 and LE2a. Since the other constituents in the configuration thereof are similar to corresponding constituents in the configuration of non-volatile memory device 2000, none of detailed descriptions thereof will be repeated.

Control circuit 800 transmits current control signal ICNT1 to current sources I1#, I1#2, I1#3 and I1#4 according to control signal CT. Control circuit 800 transmits current control signal ICNT2 to current sources I2#1, I2#2, I2#3 and I2#4 according to control signal CT.

Current sources I1#1, I1#2, I1#3 and I1#4 are activated according to current control signal ICNT1. Current sources I2#1, I2#2, I2#3 and I2#4 are activated according to current control signal ICNT2.

In a case where a write operation is performed on a memory cell in memory array block MAB## of memory array mat 100d, control signal CT is set so that control circuit 800 transmits current control signal ICNT1 to current sources I1#1, I1#2, I1#3 and I1#4. On the other hand, in a case where a write operation is performed on a memory cell in memory array block MAB## of memory array mat 200d, control signal CT is set so that control circuit 800 transmits current control signal ICNT2 to current sources I2#1, I2#2, I2#3 and I2#4. Note that no specific limitation is imposed only on one memory array block, which becomes an object for writing, but a plurality of memory array blocks may simultaneously be objects for writing.

Non-volatile memory device 2200 according to the second modification of the seventh embodiment can therefore obtain an effect similar to the effect of non-volatile memory device 1200 according to the second modification of the first embodiment in connection with a bit line as well.

Note that while in this embodiment, the configuration is shown in which for one memory array mat, two current sources are connected to corresponding respective two current source wires, three or more current sources are connected to current source wires, thereby enabling a write current flowing to a memory block of a memory array mat to be further stabilized. Furthermore, while in this embodiment, an example is shown in which a plurality of current sources connected to respective two current source wires corresponding to one memory array mat are all activated, the present invention is not limited to such a configuration. The present invention can also be applied to a configuration in which a signal from a control circuit is transmitted to each of current sources independently of the other to enable a desired current source to be selectively activated by the control circuit.

Eighth Embodiment

Figure 54:
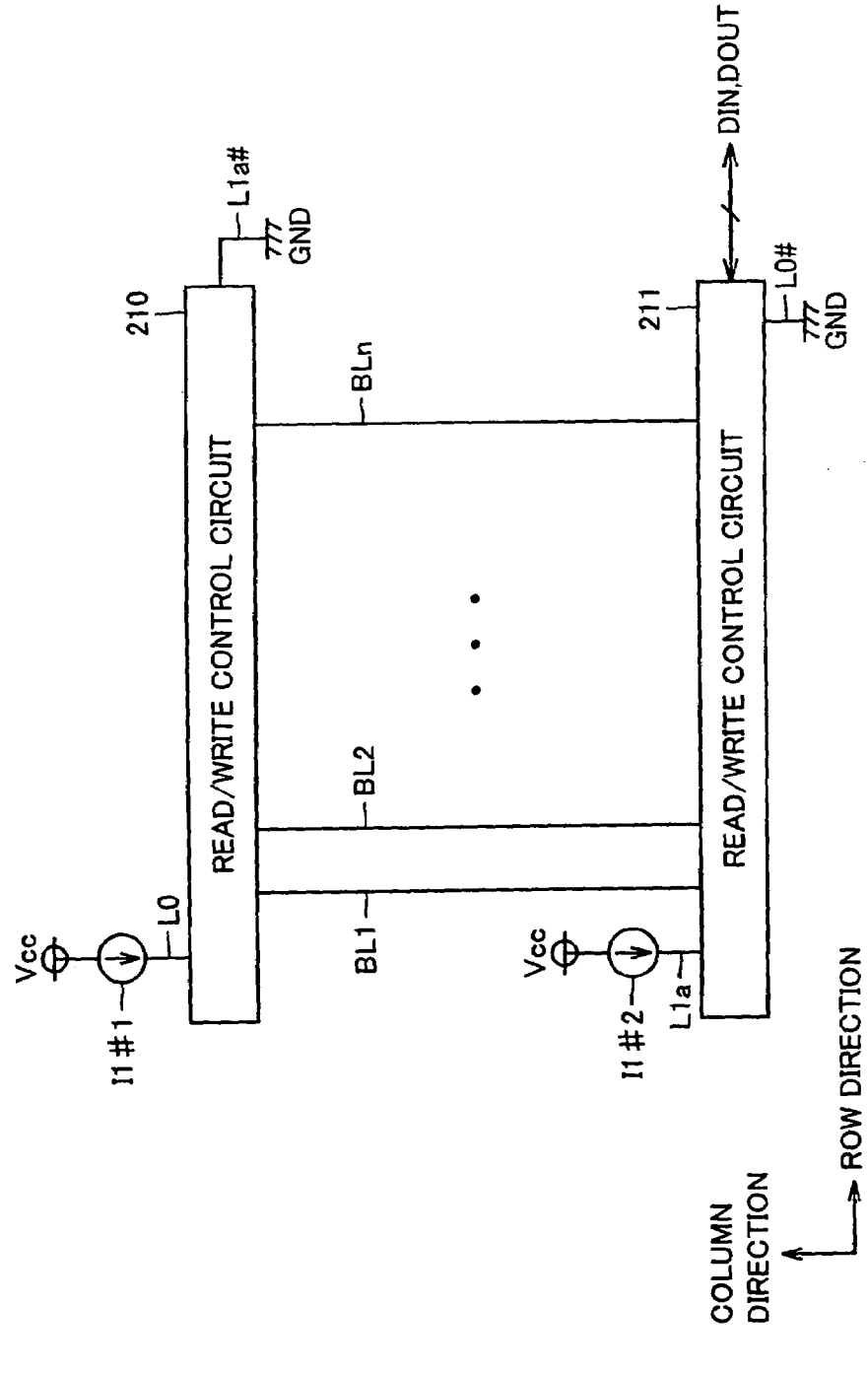
FIG. 54 is a conceptual diagram showing a configuration of a memory array in a memory array block according to an eighth embodiment.

FIG. 54 is a conceptual diagram showing a configuration of a memory array 705 in a memory array block MAB## according to an eighth embodiment. In FIG. 54, there is typically shown only part of the configuration for causing a current to flow into bit line. Furthermore, in FIG. 54, for convenience in description, there are also shown current sources I1#1 and I1#2 not included in memory array 705.

Referring to FIG. 54, memory array 705 includes read/write control circuits 210 and 211. Bit lines BL1 to BLn to which a plurality of memory cells (not shown) are connected are provided in a row direction between read/write control circuits 210 and 211. Read/write control circuits 210 and 211 are connected to ground voltage GND through respective current source wires L1a# and L0#.

Current sources I1#1 and I1#2 are connected, through respective current source wires L0 and L1a, to locations on read/write control circuits 210 and 211 in the vicinity of locations thereon to which bit line BL1 is connected. Current source wires L1a# and L0# are connected to locations on read/write control circuit 210 and 211 in the vicinity of locations thereon to which bit line BLn is connected.

Read/write control circuits 210 and 211, when data is read, are simultaneously controlled and read/write control circuit 211 outputs data DOUT read from a memory cell (not shown) connected to bit line BL. Data DIN to be written to a memory cell, when data is written, is inputted to read/write control circuit 211, and read/write control circuits 210 and 211 are simultaneously controlled to write data DIN to a memory cell connected to a desired bit line.

When a write current is caused to flow from read/write control circuit 210 into desired bit line BL toward read/write control circuit 211, read/write control circuits 210 and 211 operate so that current source I1#1 and current source wire L0#, to which ground voltage GND is connected, are connected electrically to each other.

On the other hand, when a write current is caused to flow from read/write control circuit 211 into desired bit line BL toward read/write control circuit 210, read/write control circuits 210 and 211 operate so that current source I1#2 and current source wire L1a#, to which ground voltage GND is connected, are connected electrically to each other.

That is, current source I1#1 connected to current source wire L0 is located at a position thereon diagonal with respect to ground voltage GND connected to current source wire L0#. Likewise, current source I1#2 connected to current source wire L1a is located at a location thereon diagonal with respect to ground voltage GND connected to current source wire L1a#. As a result, when data is written, a wiring length from a current source to a ground voltage does not change even if any bit line is selected.

In memory array 705 according to the eighth embodiment, therefore, there can be obtained an effect similar to the effect of memory array 505 according to the second embodiment in connection with a bit line as well.

First Modification of Eighth Embodiment

Figure 55:
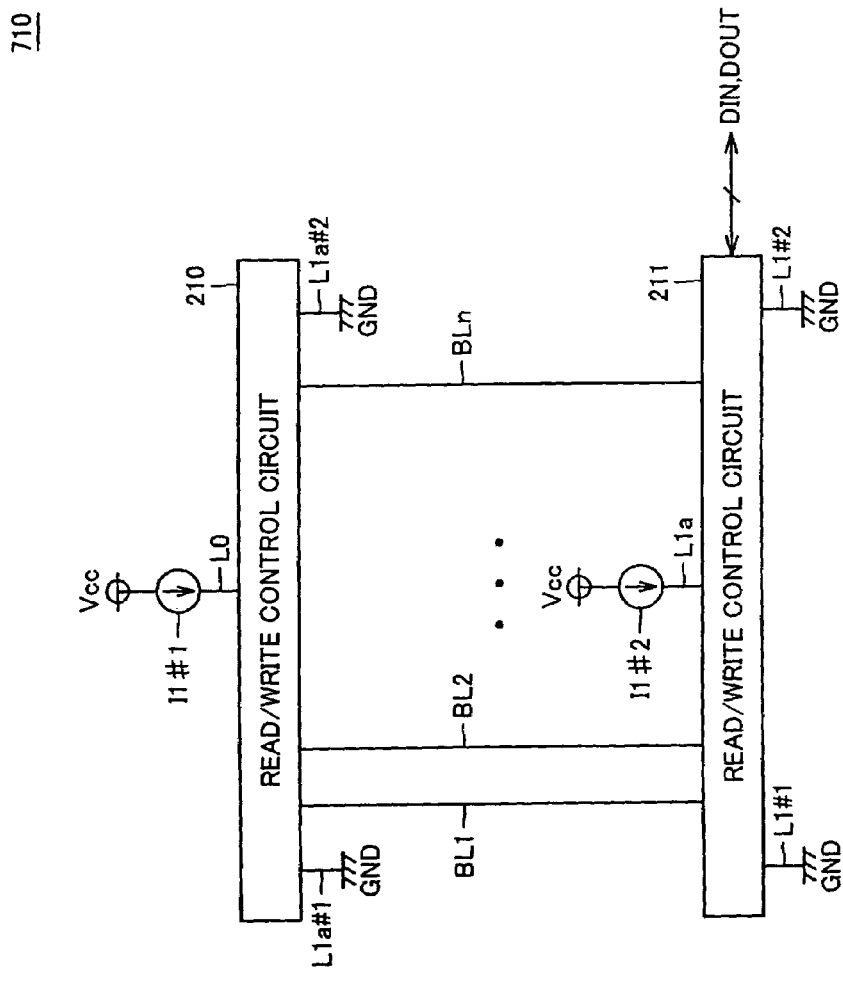
FIG. 55 is a conceptual diagram showing a configuration of a memory array in a memory array block according to a first modification of the eighth embodiment.

FIG. 55 is a conceptual diagram showing a configuration of a memory array 710 in memory array block MAB## according to a first modification of the eighth embodiment. In FIG. 55, there is typically shown only part of the configuration thereof, which part serves for a current to be caused to flow into bit line. Furthermore, in FIG. 55, for convenience in description, there are also shown current sources I1#1 and I1#2 not included in memory array 710.

Referring to FIG. 55, memory array 710 is different from memory array 705 according to the eighth embodiment by comparison in aspects that current sources I1#1 and I1#2 are connected, through respective current source wires L0 and L1a, to locations on respective read/write control circuits 210 and 211 in the vicinity of the centers between locations thereon to which bit lines BL1 and BLn are connected, that current source wires L1a#1 and L1a#2 to which ground voltage GND is connected are connected to locations on read/write control circuit 210 in the vicinity of locations thereon to which respective bit lines BL1 and BLn are connected, and that current source wires L1#1 and L1#2 to which ground voltage GND is connected are connected to locations on read/write control circuit 211 in the vicinity of locations thereon to which respective bit lines BL1 and BLn are connected. Since the other constituents in the configuration thereof are similar to corresponding constituents in the configuration of memory array 705, none of detailed descriptions thereof will be repeated.

When a write current is caused to flow from read/write control circuit 210 into desired bit line BL toward read/write control circuit 211, read/write control circuits 210 and 211 operate so that current source I1#1 is connected electrically to current source wires L1#1 and L1#2, to which ground voltage GND is connected.

On the other hand, when a write current is caused to flow from read/write control circuit 211 into desired bit line BL toward read/write control circuit 210, read/write control circuits 210 and 211 operate so that current source I1#2 is connected electrically to current source wires L1a#1 and L1a#2, to which ground voltage GND is connected.

Therefore, a stronger force arises by which read/write control circuit 211 side is fixed to ground voltage GND in memory array 710 than in memory array 705 when a write current is caused to flow from read/write control circuit 210 into desired bit line BL toward read/write control circuit 211. A stronger force arises by which read/write control circuit 210 side is fixed to ground voltage GND in memory array 710 than in memory array 705 when a write current is caused to flow from read/write control circuit 211 into desired bit line BL toward read/write control circuit 210.

In memory array 710 according to the first modification of the eighth embodiment, therefore, there can be obtained an effect similar to the effect of memory array 510 according to the first modification of the second embodiment in connection with a bit line as well.

Second Modification of Eighth Embodiment

Figure 56:
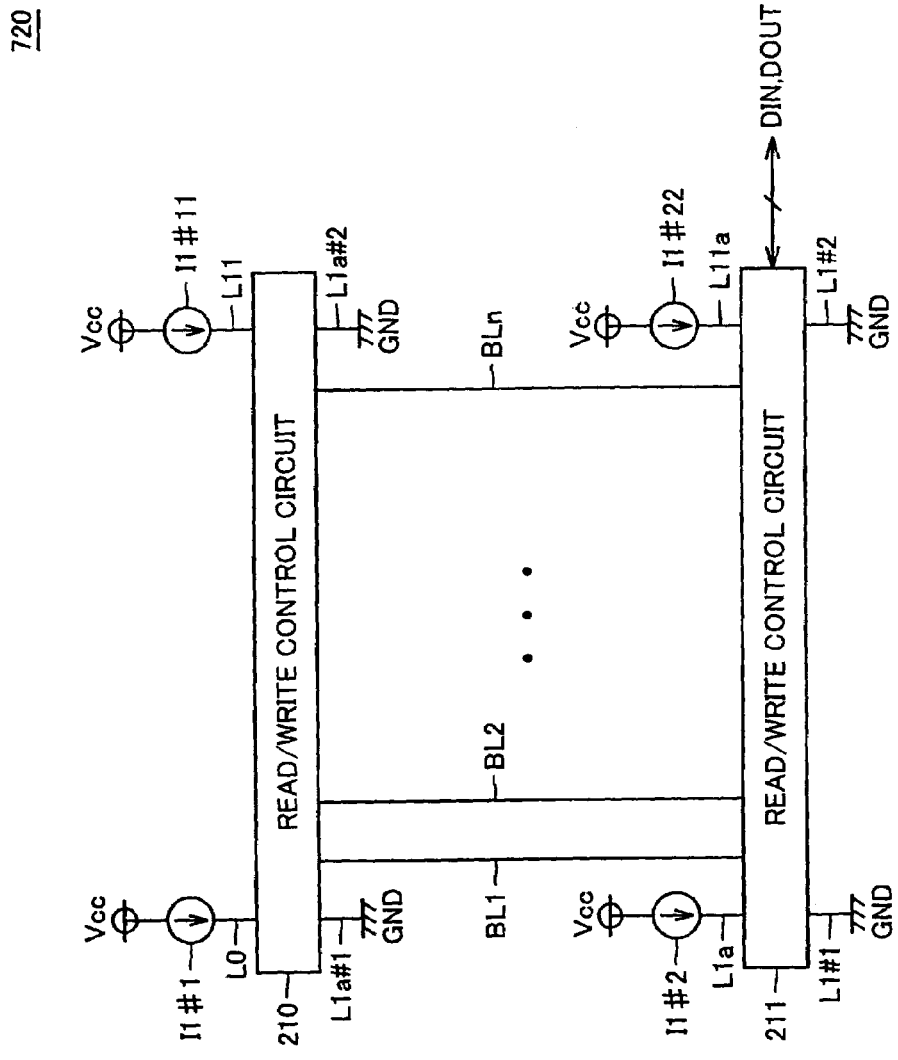
FIGS. 56 to 58 are schematic diagrams showing configurations of memory arrays according to second to fourth modifications of the eighth embodiment, respectively.

Referring to FIG. 56, a memory array 720 is different from memory array 705 according to the eighth embodiment shown in FIG. 54 by comparison in an aspect that further provided are current sources I1#11 and I1#22 and current source wires L1a#1 and L1#1.

Memory array 720 is further different from memory array 705 by comparison in an aspect that current source wires L1a#2 and L1#2 are included instead of current source wires L1a# and L0#. Since the other constituents in the configuration thereof are similar to corresponding constituents in the configuration of memory array 705, none of detailed descriptions thereof will be repeated.

Current source I1#11 is connected electrically to a location on read/write control circuit 210 in the vicinity of a location thereon to which bit line BLn is connected through current source wire L11. Current source I1#22 is connected electrically to a location on read/write control circuit 211 in the vicinity of a location thereon to which bit line BLn is connected through current source wire L11a. Current source wires L1a#1 and L1a#2 connected to ground voltage GND are connected electrically to locations on read/write control circuit 210 in the vicinity of locations thereon to which respective bit lines BL1 and BLn are connected. Current source wires L1#1 and L1#2 connected to ground voltage GND are connected electrically to locations on read/write control circuit 211 in the vicinity of locations thereon to which respective bit lines BL1 and BLn are connected.

When a write current is caused to flow from read/write control circuit 210 into desired bit line BL toward read/write control circuit 211, read/write control circuits 210 and 211 operate so that current sources I1#1 and I1#11 are connected electrically to current source wires L1#1 and L1#2, to which ground voltage GND is connected.

On the other hand, when a write current is caused to flow from read/write control circuit 211 into desired bit line BL toward read/write control circuit 210, read/write control circuits 210 and 211 operate so that current sources I1#2 and I1#22, are connected electrically to current source wires L1a#1 and L1a#2, to which ground voltage GND is connected.

Therefore, a stronger force arises by which read/write control circuit 210 side is fixed to power supply voltage Vcc and a stronger force arises by which read/write control circuit 211 side is fixed to ground voltage GND in memory array 720 than in memory array 705 when a write current is caused to flow from read/write control circuit 210 into desired bit line BL toward read/write control circuit 211. A stronger force arises by which read/write control circuit 211 side is fixed to power supply voltage Vcc and a stronger force arises by which read/write control circuit 210 side is fixed to ground voltage GND in memory array 720 than in memory array 705 when a write current is caused to flow from read/write control circuit 211 into desired bit line BL toward read/write control circuit 210.

In memory array 720 according to the second modification of the eighth embodiment, therefore, there can be obtained an effect similar to the effect of memory array 520 according to the second modification of the second embodiment in connection with a bit line as well.

Third Modification of Eighth Embodiment

Figure 57:
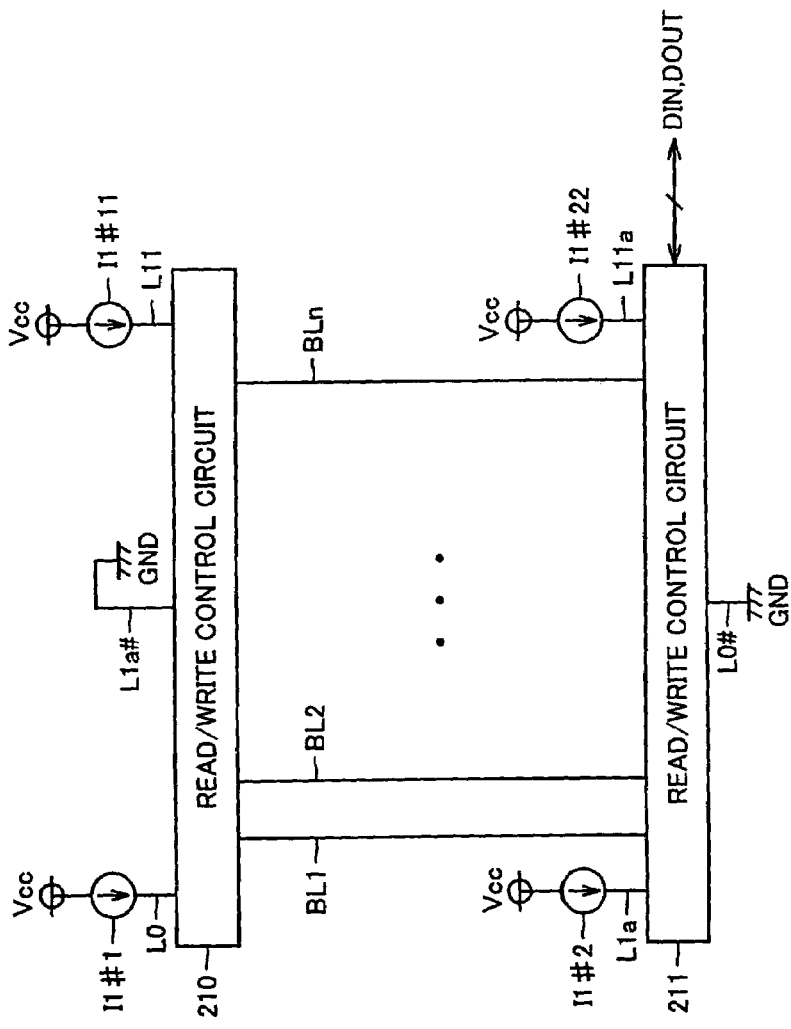

Referring to FIG. 57, a memory array 730 is different from memory array 720 according to the second modification of the eighth embodiment shown in FIG. 56 by comparison in an aspect that none of the following current source wires are included current source wires L1a#1 and L1a#2 to which ground voltage GND is connected and current source wires L1#1 and L1#2 to which ground voltage GND is connected.

Memory array 730 is further different from memory array 720 by comparison in an aspect that included are current source wires L1a# and L0# to which ground voltage GND is connected. Since the other constituents in the configuration thereof are similar to corresponding constituents in the configuration of memory array 720, none of detailed descriptions thereof will be repeated.

Current source wires L1a# and L0# connected to ground voltage GND are connected electrically to locations on respective read/write control circuits 210 and 211 in the vicinity of the center between locations thereon to which respective bit lines BL1 and BLn are connected.

When a write current is caused to flow from read/write control circuit 210 into desired bit line BL toward read/write control circuit 211, read/write control circuits 210 and 211 operate so that current sources I1#1 and I1#11 are connected electrically to current source wires L0#, to which ground voltage GND is connected.

On the other hand, when a write current is caused to flow from read/write control circuit 211 into desired bit line BL toward read/write control circuit 210, read/write control circuits 210 and 211 operate so that current sources I1#2 and I1#22 are connected electrically to current source wire L1a#, to which ground voltage GND is connected.

In memory array 730, therefore, greater reduction occurs in fluctuations in path lengths from a current source and ground voltage GND, when data is written, caused by locations of selected bit lines BL than in the configuration of memory array 720.

In memory array 730 according to the third modification of the eighth embodiment, therefore, there can be obtained an effect similar to the effect of memory array 530 according to the third modification of the second embodiment in connection with a bit line as well.

Fourth Modification of Eighth Embodiment

Figure 58:
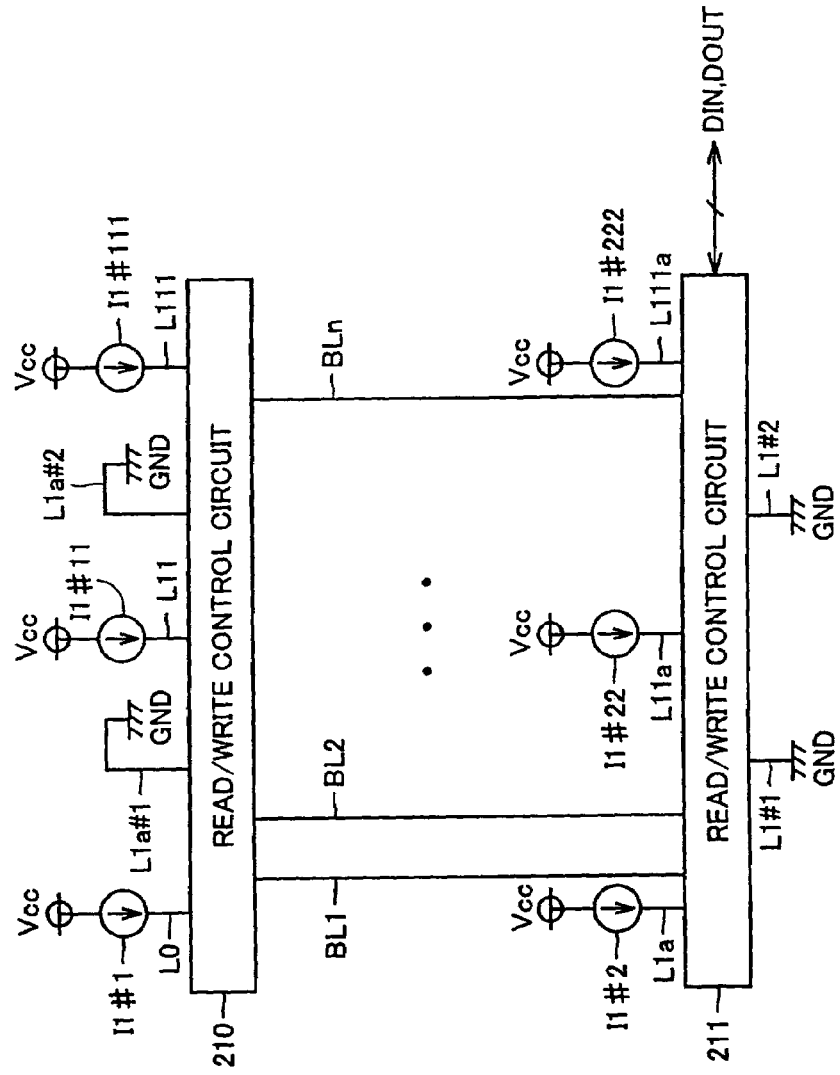

Referring to FIG. 58, a memory array 740 is different from memory array 720 according to the second modification of the eighth embodiment shown in FIG. 56 by comparison in an aspect that further included are power supply sources I1#111 and I1#222.

Memory array 740 is further different from memory array 720 by comparison in aspects that current source I1#11 is connected electrically to a location on read/write control circuit 210 in the vicinity of the center between locations thereon to which bit line BL1 and BLn are connected through current source wire L11 instead of a location on read/write control circuit 210 in the vicinity of a location thereon to which bit line BLn is connected, and that current source I1#22 is connected electrically to a location on read/write control circuit 211 in the vicinity of the center between locations thereon to which bit line BL1 and BLn are connected through current source wire L11a instead of a location on read/write control circuit 211 in the vicinity of a location thereon to which bit line BLn is connected.

Memory array 740 is further different from memory array 720 by comparison in aspects that current source wire L1a#1 connected to ground voltage GND is connected electrically to a location on read/write control circuit 210 in the vicinity of the center between locations thereon to which current sources I1#1 and I1#11 are connected instead of a location on read/write control circuit 210 in the vicinity of a location to which bit line BL1 is connected, and that current source wire L1#1 connected to ground voltage GND is connected electrically to a location on read/write control circuit 211 in the vicinity of the center between locations thereon to which current sources I1#2 and I1#22 are connected instead of a location on read/write control circuit 211 in the vicinity of a location to which bit line BL1 is connected.

Current source I1#111 is connected electrically to a location on read/write control circuit 210 in the vicinity of a location thereon to which bit line BLn is connected through current source wire L111. Current source I1#222 is connected electrically to a location on read/write control circuit 211 in the vicinity of a location thereon to which bit line BLn is connected through current source wire L111a.

Memory array 740 is further different from memory array 720 by comparison in aspects that current source wire L1a#2 connected to ground voltage GND is connected electrically to a location on read/write control circuit 210 in the vicinity of the center between locations thereon to which current sources I1#1 and I1#111 are connected instead of a location on read/write control circuit 210 in the vicinity of a location to which bit line BLn is connected, and that current source wire L1#2 connected to ground voltage GND is connected electrically to a location on read/write control circuit 211 in the vicinity of the center between locations thereon to which current sources I1#22 and I1#222 are connected instead of a location on read/write control circuit 211 in the vicinity of a location to which bit line BLn is connected. Since the other constituents in the configuration thereof are similar to corresponding constituents in the configuration of memory array 720, none of detailed descriptions thereof will be repeated.

When a write current is caused to flow from read/write control circuit 210 into desired bit line BL toward read/write control circuit 211, read/write control circuits 210 and 211 operate so that current sources I1#1, I1#11 and I1#111 are connected electrically to current source wires L1#1 and L1#2, to which ground voltage GND is connected.

On the other hand, when a write current is caused to flow from read/write control circuit 211 into desired bit line BL toward read/write control circuit 210, read/write control circuits 210 and 211 operate so that current sources I1#2, I1#22 and I1#222 are connected electrically to current source wires L1a#1 and L1a#2, to which ground voltage GND is connected.

Therefore, a stronger force arises by which read/write control circuit 210 side is fixed to power supply voltage Vcc in memory array 740 than in memory array 720 when a write current is caused to flow from read/write control circuit 210 into desired bit line BL toward read/write control circuit 211. A stronger force arises by which read/write control circuit 211 side is fixed to power supply voltage Vcc in memory array 740 than in memory array 720 when a write current is caused to flow from read/write control circuit 211 into desired bit line BL toward read/write control circuit 210.

Furthermore, in memory array 740, greater reduction occurs in fluctuations in path lengths from a current source to ground voltage GND, when data is written, caused by locations of selected bit lines than in the configuration of memory array 720.

In memory array 740 according to the fourth modification of the eighth embodiment, therefore, there can be obtained an effect similar to the effect of memory array 540 according to the fourth modification of the second embodiment in connection with a bit line as well.

Note that application of the present invention is not limited to an MRAM device including MTJ memory cells, That is, the present invention can be applied commonly to non-volatile memory devices each provided with memory cells each having a characteristic to change a pass current therethrough when data is read according to a level of binary storage data.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile memory device comprising:
   a plurality of memory cells;
   a plurality of write select lines provided correspondingly to predetermined units of said plurality of memory cells;
   a first wire connected electrically to one end sides of said plurality of write select lines;
   a second wire, connected electrically to a first voltage, and connected electrically to at least one of the other end sides of said plurality of write select lines in data writing;
   a current supply circuit, in said data writing, activated to connect said first wire electrically to a second voltage and to thereby supply said data write current to said first wire; and
   an address decode circuit receiving a third voltage different from said second voltage for selecting a write select line, wherein
   said second voltage is higher than said third voltage.

2. The non-volatile memory device according to claim 1, wherein
   said second voltage is supplied from a first power supply terminal and said third voltage is supplied from a second power supply terminal.

3. The non-volatile memory device according to claim 1, wherein said each memory cell has a magnetic tunnel junction.

* * * * *